United States Patent [19]

Maeno

[11] Patent Number: 5,771,194
[45] Date of Patent: Jun. 23, 1998

[54] MEMORY CIRCUIT, DATA CONTROL CIRCUIT OF MEMORY CIRCUIT AND ADDRESS ASSIGNING CIRCUIT OF MEMORY CIRCUIT

[75] Inventor: Hideshi Maeno, Hyogo, Japan

[73] Assignee: Mitsubishi Denki Kabushiki Kaisha, Tokyo, Japan

[21] Appl. No.: 550,740

[22] Filed: Oct. 31, 1995

[30] Foreign Application Priority Data

Jun. 7, 1995 [JP] Japan .................................. 7-140605

[51] Int. Cl.$^6$ ................................................ G11C 29/00
[52] U.S. Cl. .................... 365/200; 365/168; 365/189.07; 365/201; 365/230.06
[58] Field of Search .............................. 365/200, 189.07, 365/201, 230.06, 189.12, 240, 168

[56] References Cited

U.S. PATENT DOCUMENTS 5,379,258  1/1995  Murakami et al. ..................... 365/200
5,528,539  6/1996  Ong et al. ............................. 365/200

FOREIGN PATENT DOCUMENTS 6251600  9/1994  Japan .

Primary Examiner—Do Hyun Yoo
Attorney, Agent, or Firm—Oblon, Spivak, McClelland, Maier & Neustadt, P.C.

[57] ABSTRACT

To switch redundancy circuit properly by performing tests by equipment itself such as semiconductor unit or computer containing semiconductor unit, etc. without using any expensive laser unit. Relieves failure by controlling selectors SEL1 to SEL4 with control memory cells C11 to C14 connected respectively to a plural number of external bit lines OBL1 to OBL4 and by switching the relation of correspondence between the external bit lines OBL1 to OBL4 and the internal bit lines BL1 to BL5. The data to the control memory cells C11 to C14 is given from the external bit lines OBL1 to OBL4.

27 Claims, 55 Drawing Sheets

F I G. 3 1
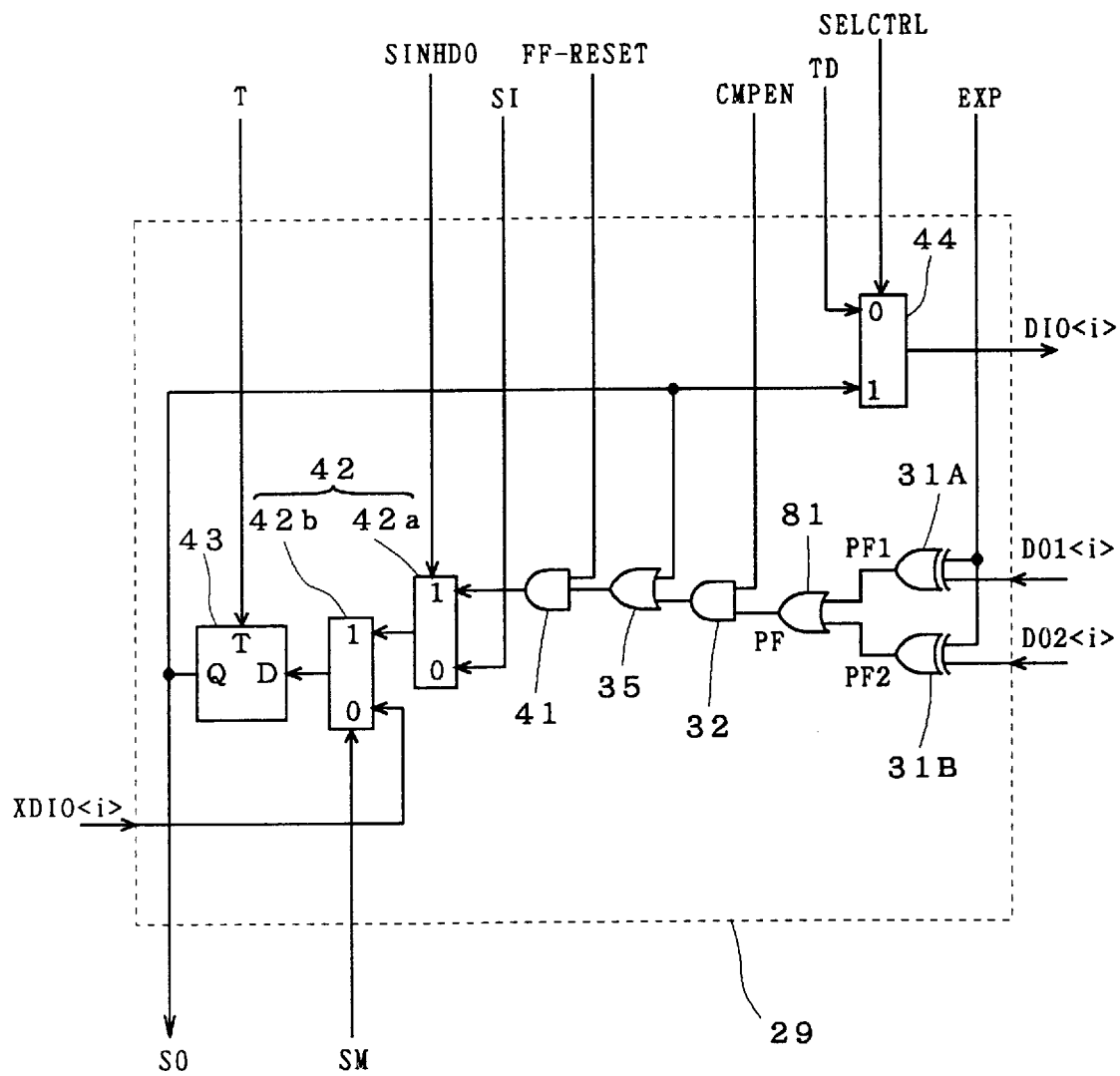

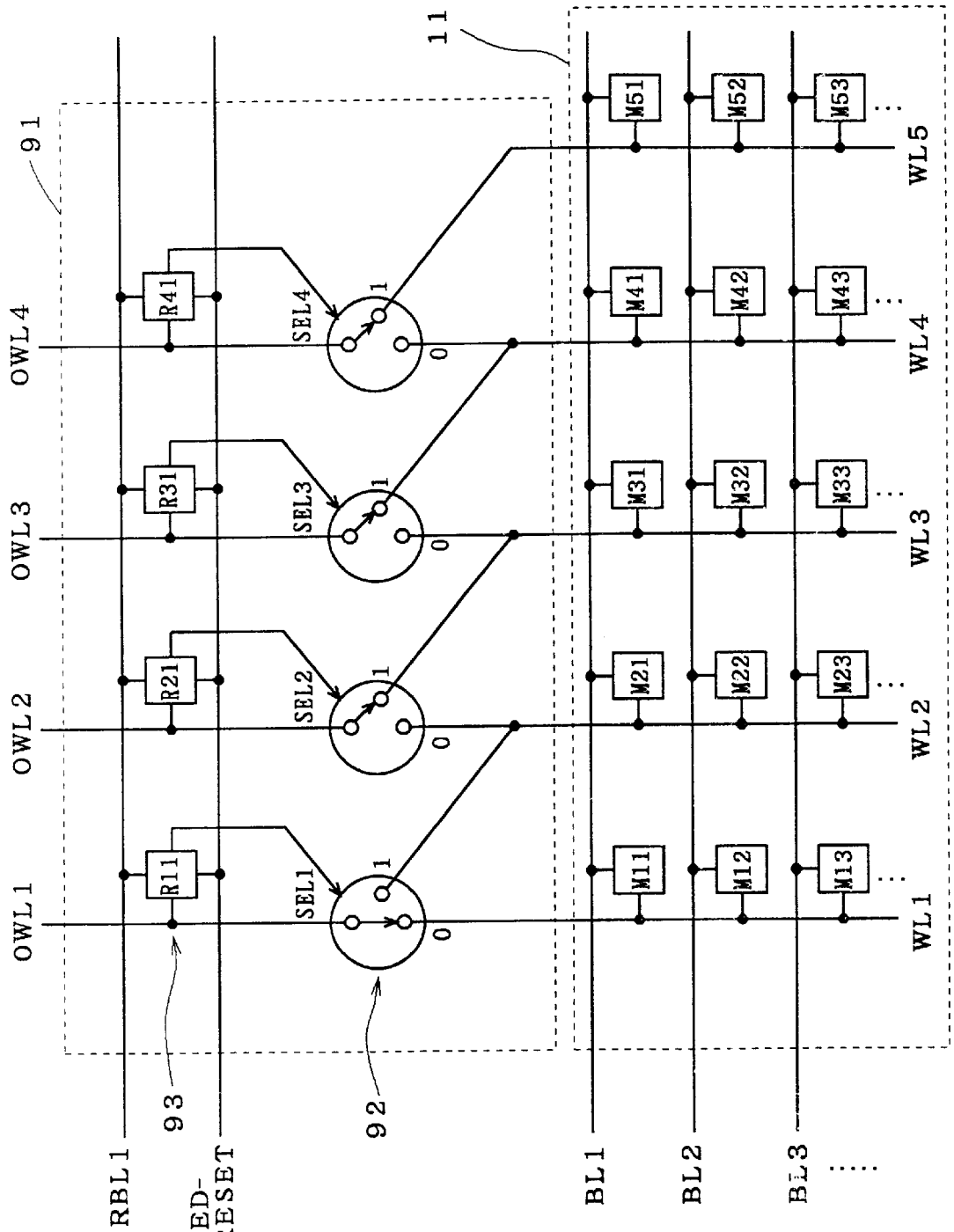
F I G. 33

MEMORY CIRCUIT, DATA CONTROL CIRCUIT OF MEMORY CIRCUIT AND ADDRESS ASSIGNING CIRCUIT OF MEMORY CIRCUIT

BACKGROUND OF THE INVENTION

1. Field of the Invention

The present invention relates to a memory circuit with redundancy function, a data control circuit of the memory circuit concerned and an address assigning circuit of the memory circuit concerned.

2. Description of the Background Art

{First prior art}

FIG. 54 is a circuit diagram showing the memory circuit of the first prior art. The memory circuit of the first prior art, the memory cell array 1 of which is connected to the column redundancy control circuit (COL-RED-CTRL) 2, is constructed in a way to control selectors SEL1 to SEL4 by cutting fuses F1 to F4 inside the column redundancy control circuit 2 and to relieve failure in memory cells M11 to M15, M21 to M25, M31 to M35, . . . by switching the relation of correspondence between external bit lines OBL1 to OBL4 and internal bit lines BL1 to BL5 inside the memory cell array 1.

Namely, in case of occurrence of breaking of wire or short-circuiting of the internal bit line BL2 or failure in memory cells M12, M22, M32, . . . connected to the internal bit line BL2, for example, (the memory circuit) sets (respective nodes) as node N1="0", N2="1", N3="1", N4="1" and switches the contact of selectors SEL2 to SEL4 from "0" to "1" by cutting the fuse F2 as shown in FIG. 54 by means of irradiation of laser beam. And (the memory circuit) puts the external bit line OBL1 in correspondence to the internal bit line BL1, external bit line OBL2 to internal bit line BL3, external bit line OBL3 to internal bit line BL4, external bit line OBL4 to internal bit line BL5 respectively.

Usually, any failure relating to the internal bit line BL2 of the memory cells for operation M11 to M15, M21 to M25, M31 to M35, . . . , which give access to external bit lines OBL1 to OBL4, is not observed and (the memory circuit) can be made to work as if it were a memory circuit having no failure.

While, in FIG. 54, the number of external bit lines OBL1 to OBL4, fuses F1 to F4 and selectors SEL1 to SEL4 as 4 for the sake of convenience, they actually exist in large numbers.

{Second prior art}

FIG. 55 is a circuit diagram showing the memory circuit of the second prior art. In FIG. 55, same symbols are put to devices having the same function as in the first prior art indicated in FIG. 54. The memory circuit of the second prior art, the memory cell array 1 of which is connected to the row redundancy control circuit (ROW-RED-CTRL) 3, is constructed in a way to control selectors SEL1 to SEL4 by cutting fuses F1 to F4 inside the row redundancy control circuit 3 and to relieve failure in memory cells M11 to M13 . . . , M21 to M23 . . . , M31 to M33 . . . , M41 to M43 . . . , M51 to M53 . . . by switching the relation of correspondence between external word lines OWL1 to OWL4 and internal word lines WL1 to WL5 and internal bit lines BL1 to BL5 inside the memory cell array 1.

Namely, in case of occurrence of breaking of wire or short-circuiting of the word line WL2 or failure in memory cells M21 to M23 . . . connected to the word line WL2, for example, (the memory circuit) sets (respective nodes) as node N1="0", N2="1", N3="1", N4="1" and switches the contact of selectors SEL2 to SEL4 from "0" to "1" by cutting the fuse F2 as shown in FIG. 55 by means of irradiation of laser beam. And (the memory circuit) puts the external word line OWL1 in correspondence to the internal word line WL1, external word line OWL2 to internal word line WL3, external word line OWL3 to internal word line WL4, external word line OWL4 to internal word line WL5 respectively.

Usually, any failure relating to the internal word line WL2 of the memory cells for operation M11 to M13 . . . , M21 to M23 . . . , M31 to M33 . . . , M41 to M43 . . . M51 to M53 . . . which give access to external word lines OWL1 to OWL4, is not observed and (the memory circuit) can be made to work as if it were a memory circuit free from any failure.

While, in FIG. 55, the number of external word lines OWL1 to OWL4, fuses F1 to F4 and selectors SEL1 to SEL4 is given as 4 for the sake of convenience, they actually exist in large numbers.

While, in the first prior art and the second prior art, cutting by laser beam of fuses F1 to F4 was made in case of failure by using fuses F1 to F4 for either the column redundancy control circuit 2 or the row redundancy control circuit 3, this method inevitably requires installation of laser unit in the manufacturing process line after the memory test. However, a problem was that a high manufacturing cost is involved because laser unit is extremely expensive considering that it is used only in case of failure (i.e. low frequency of use).

SUMMARY OF THE INVENTION

According to the present invention, a memory circuit comprises: a memory cell array composed of a plural number of memory cells arranged in the form of a matrix; a plural number of external connecting lines, connected to a plural number of internal connecting lines at least in one of the direction of row and the direction of column of the memory cell array, for exchanging data for the memory cell array from outside; and a redundancy control circuit, inserted between the memory cell array and the external connecting lines, for controlling in a way to compensate at least one failure data in case of occurrence of any failure in the memory cell array.

Moreover, the number of wires of the external connecting lines is set smaller than the number of wires of the internal connecting lines.

And, the redundancy control circuit comprises a group of control memory cells which comprises control memory cells in the same number as that of the external connecting lines, stores one value of binary regarding the external connecting lines arranged on the side of one direction with the internal connecting line having the failure data as border, and stores the other value of the binary regarding the external connecting lines arranged on the side of other direction with the internal connecting line having the failure data as border; and a group of selectors which comprises a plural number of selectors put in correspondence respectively to the control memory cells of the group of control memory cells, disengages, depending on the value stored in the group of control memory cells, the connection between the internal connecting line having the failure data and the external connecting lines put in correspondence to the internal connecting line concerned, connects the external connecting lines arranged on the side of one direction with the internal connecting line having the failure data as border to the internal connecting lines put in correspondence to the external connecting line concerned, and sequentially connects the external connecting lines arranged on the side of other direction with the internal connecting line having the failure data as border to other internal connecting lines adjacent on the side of other direction to the internal connecting line put in correspondence to the external connecting line concerned.

According to this present invention, it is possible, without cutting fuse by means of laser beam as in the first prior art and the second prior art, to perform proper switching of redundancy circuit by switching the respective selectors of the group of selectors with values stored in the respective control memory cells of the group of control memory cells. Therefore, there is no need of using any expensive laser unit, thus enabling not only reduction of equipment cost in the manufacturing process line but also effective switching of redundancy circuit in extremely short time.

Preferably, the data input terminal of the control memory cells of the group of control memory cells are connected to either the external connecting lines or the internal connecting lines to which they are put in correspondence respectively.

According to this present invention, writing of data in the control memory cells of the group of control memory cells can be made by just giving data from external connecting lines, in the same way as when writing data in the memory cells of memory cell array. Therefore, there is no need of providing any special data writing terminal, thus preventing increase in the number of terminals.

Preferably, the data input terminal of the control memory cells of the group of control memory cells are connected respectively to the internal connecting lines put in correspondence to the external connecting lines to which the respective selectors of the group of selectors to be controlled are connected, and switch devices for selecting permission or not of control by the group of control memory cells are inserted respectively between the respective control memory cells of the group of control memory cells and the respective selectors of the group of selectors.

According to this present invention, it is possible to form group of control memory cells and memory cell array simultaneously and with one same standard by placing them side by side with each other, by connecting the respective control memory cells of the group of control memory cells to the internal connecting lines of the memory cell array respectively and, therefore, use the portion of superfluous column of memory cell array as group of control memory cells, for example.

In this case, there are cases, depending on the value of control memory cells, where the external connecting lines and the control memory cells get in the state of disconnection with a switching of selectors and, in that state, there is a risk that it may become permanently impossible to newly store data in the respective control memory cells of the group of control memory cells by giving data from external connecting lines and to perform switching of selectors, even after repairing failure of the memory cell array for example.

However, it becomes possible to newly store data in the respective control memory cells of the group of control memory cells by giving data from external connecting lines, by switching permission or not of control and switching selectors by means of switching device.

In an aspect of the present invention, a memory circuit comprises: a memory cell array composed of a plural number of memory cells arranged in the form of a matrix; a plural number of external connecting lines, connected to a plural number of internal connecting lines at least in one of the direction of row and the direction of column of the memory cell array, for exchanging data for the memory cell array from outside; and a redundancy control circuit, inserted between said memory cell array and said external connecting lines, for controlling in a way to compensate two failure data in case of occurrence of any failure in said memory cell array.

Moreover, the number of wires of the external connecting lines is set smaller by two than the number of wires of the internal connecting lines.

And, the redundancy control circuit includes: a group of selectors composed of a plural number of selectors for selectively switching respectively 3 continuously adjacent the internal connecting lines provided in correspondence to the respective external connecting lines; and a group of control memory cells composed of a plural number control memory cells for selectively storing one value of ternary for each of the internal connecting lines in a way to perform switching control of the respective selectors of the group of selectors.

According to this present invention, control memory cells of a group of control memory cells selectively output one value of ternary data for each external connecting line to the respective selectors of the group of selectors and, according to this output, the respective selectors of the group of selectors selectively switch continuously adjacent 3 pieces of internal connecting lines respectively.

And yet, there is no need of using any expensive laser unit, thus enabling not only reduction of equipment cost in the manufacturing process line but also effective switching of redundancy circuit in extremely short time.

Preferably, the data input terminal of the control memory cells of the group of control memory cells are connected to either the external connecting lines or the internal connecting lines to which they are put in correspondence respectively.

According to this present invention, in the case where the circuit has a redundancy function of 2-bit relieving as in claim 4, writing of data in the control memory cells of the group of control memory cells can be made by just giving data from external connecting lines, in the same way as when writing data in the memory cells of memory cell array. Therefore, there is no need of providing any special data writing terminal, thus preventing increase in the number of terminals.

Preferably, the control memory cells of the group of control memory cells are those provided with setting function having set terminal or resetting function having reset terminal, and that the set terminal or the reset terminal of the control memory cells are connected to superfluous terminal of decoder controlling other internal connecting lines in the direction of row and the direction of column of the memory cell array.

According to this present invention, it is possible to perform setting or resetting of control memory cells by utilizing superfluous terminal of decoder for assigning addresses, and this helps to raise the circuit efficiency compared with the case of performing setting or resetting of control memory cells by means of a special control circuit.

Preferably, the control memory cells of the group of control memory cells are those provided with setting function having set terminal or resetting function having reset terminal, and that the set terminal or the reset terminal of the control memory cells are connected to control terminal of a special decoder.

According to this present invention, it is possible to perform setting or resetting of control memory cells by utilizing a special decoder and this facilitates the control such as control of signals to be given to that special decoder, etc.

Preferably, a data control circuit of memory circuit provided for each of the external connecting lines of the memory circuit comprises expected value comparing means for judging by comparison whether or not the readout data in at least one output port of the memory cell array disagrees with prescribed expected value and, based on that result of comparison, generating a value for control to be given to the data input terminal of the control memory cells of the group of control memory cells.

According to this present invention, the expected value comparing means judges any case of disagreement between the readout data in at least one output port of the memory cell array and prescribed expected value, and, based on that result, can generate a value for control to be given to the data input terminal of the control memory cells of the group of control memory cells.

In this way, it is possible to control memory circuit and perform effective switching of redundancy by automatically detecting failure data.

Preferably, a data control circuit of memory circuit further comprises first selecting means for selecting at least 2 different kinds of information i.e., the value for control generated by the expected value comparing means and write data from outside to be written in the memory cells of the memory cell array.

According to this present invention, it is possible to easily select and give to external connecting lines write data to be written in the memory cells of the memory cell array and the value for control to control memory cells of the group of control memory cells with a switching of the first selecting means, and there is no need of providing any special data writing terminal for the group of control memory cells, thus preventing increase in the number of terminals.

Preferably, a data control circuit of memory circuit further comprises register for storing one kind of information selected by the first selecting means.

According to this present invention, the handling of data becomes convenient by holding the information on one side, selected by the first selecting means, by means of a register.

Preferably, the first selsecting means is connected in a way to select at least 3 different kinds of information i.e. the value for control generated by the expected value comparing means, write data from outside for the memory cells of the memory cell array and output information from other data control circuit adjacent to the data control circuit concerned.

According to this present invention, it is possible to select and output, at the time of data scanning when forming scan path by serially connecting a plural number of data control circuits, output information from other data control circuit adjacent to the data control circuit concerned with a switching of the first selecting means. This enables effective feed of scan data.

Preferably, a data control circuit of memory circuit further comprises second selecting means for selecting at least 2 different kinds of information i.e. output information from the register in the data control circuit concerned and test data from outside.

According to this present invention, it is possible to select and output to external connecting lines as required, by means of second selecting means, write data for testing and output information from expected value comparing means. This makes unnecessary any special and individual input terminals for inputting the above-mentioned multiple kinds of information in the memory circuit, thus preventing increase in the number of terminals.

Preferably, a data control circuit of memory circuit provided for each of the external connecting lines of the memory circuit comprises: expected value comparing means for judging by comparison whether or not the readout data in at least one output port of the memory cell array disagrees with prescribed expected value and, based on that result of comparison, generating a value for control to be given to the data input terminal of the control memory cells of the group of control memory cells; first selecting means for selecting at least 2 different kinds of information i.e. the value for control generated by the expected value comparing means and the readout data from the memory cells of the memory cell array; a register for storing the information selected by the first selecting means; and second selecting means for selecting at least 2 different kinds of information i.e. output information from the register and write data from outside to be written in the memory cells of the memory cell array.

According to this present invention, it is possible to select at least 2 different kinds of information i.e., the value for control generated by the expected value comparing means and the readout data from the memory cell array, with the first selecting means, store them in the register, and select at least 2 different kinds of information i.e. the output information from the register as well as the write data to be written in the memory cells of the memory cell array and output them to external connecting lines, with the second selecting means.

This makes unnecessary any special and individual input terminals for inputting the above-mentioned multiple kinds of information in the memory circuit, thus preventing increase in the number of terminals.

In an another aspect of the present invention, the first selecting means is connected in a way to select at least 3 different kinds of information i.e., the value for control generated by the expected value comparing means, readout data from the memory cells of the memory cell array and output information from other data control circuit adjacent to the data control circuit concerned.

According to this present invention, it is possible to select and output to external connecting lines at least 3 different kinds of information i.e. value for control generated by the expected value comparing means, readout data from the memory cells of the memory cell array and output information from other data control circuit adjacent to the data control circuit concerned with the first selecting means.

For that reason, there is no need of providing any special and individual input terminals for inputting the above-mentioned multiple kinds of information in the memory circuit, thus preventing increase in the number of terminals.

Preferably, a data control circuit of memory circuit provided for each of the external connecting lines of the memory circuit comprises: expected value comparing means for judging by comparison whether or not the readout data in at least one output port of the memory cell array disagrees with prescribed expected value and, based on that result of comparison, generating a value for control to be given to the data input terminal of the control memory cells of the group of control memory cells; first selecting means for selecting at least 2 different kinds of information i.e. the value for control generated by the expected value comparing means and the readout data from the memory cells of the memory cell array; a first register for storing the information selected by the first selecting means; and second selecting means for selecting at least 2 different kinds of information i.e. output information from the first register and write data from outside to be written in the memory cells of the memory cell array; and second register for storing the information selected by the second selecting means.

According to this present invention, it is possible to select at least 2 different kinds of information i.e. the value for control generated by the expected value comparing means and the readout data from the memory cell array, with the first selecting means, and selects the output information from the first selecting means and the first register as well as the write data to be written in the memory cell array, with the second selecting means. Namely, one data control circuit can handle both write data and readout data, raising the circuit efficiency compared with a case of using special circuits respectively. In this case, redundancy control can be made easily because it is possible to give the value for control generated by the expected value comparing means to the group of control memory cells with a switching between the first selecting means and the second selecting means, especially when there is any failure in the readout data.

Preferably, the second selecting means is constructed in a way to select at least 3 different kinds of information i.e., write data from outside to be written in the memory cells of the memory cell array, the first register and the test data.

According to this present invention, it is possible to select and output to external connecting lines at least 3 different kinds of information i.e. write data from outside to be written in the memory cells of the memory cell array, output information from the first register and test data from outside, with the second selecting means. For that reason, there is no need of providing any special and individual input terminals for inputting the above-mentioned multiple kinds of information in the memory circuit, thus preventing increase in the number of terminals.

Preferably, the second selecting means is constructed in a way to select at least 3 different kinds of information i.e. output information from the first register in the data control circuit concerned, output information from other data control circuit adjacent to the data control circuit concerned and write data from outside to be written in the memory cells of the memory cell array.

According to this present invention, it is possible to select and output, at the time of data scanning when forming scan path by serially connecting a plural number of data control circuits, output information from other data control circuit adjacent to the data control circuit concerned with a switching of the second selecting means. This enables effective feed of scan data. Moreover, because it is possible to select and output to external connecting lines as required, scan data concerned, output information from the first selecting means and the register in the data control unit concerned and write data from outside to be written in the memory cells of the memory cell array, there is no need of providing any special and individual input terminals for inputting the above-mentioned multiple kinds of information in the memory circuit, thus preventing increase in the number of terminals.

Preferably, a data control circuit of a memory circuit provided for each of the external connecting lines of the memory circuit comprises: expected value comparing means for judging by comparison whether or not the readout data in at least one output port of the memory cell array disagrees with prescribed expected value and, based on that result of comparison, generating a value for control to be given to the data input terminal of the control memory cells of the group of control memory cells; and control data generating means for outputting the first value of the ternary data to the control memory cells of the group of control memory cells when the expected value comparing means obtained a result that the readout data from the memory cells of the memory cell array is identical to the prescribed expected value, outputting the second value of the ternary data to the control memory cells of the groups of control memory cells when the expected value comparing means obtained for the first time a result that the readout data from the memory cells of the memory cell array disagrees with the prescribed expected value, and outputting the third value of the ternary data to the control memory cells of the group of control memory cells when the expected value comparing means obtained for the second time a result that the readout data from the memory cells of the memory cell array disagrees with the prescribed expected value.

According to this present invention, it is possible to compare and judge, with the expected value comparing means, whether or not the readout data in at least one output port of the memory cell array disagrees with prescribed expected value and, based on that result of comparison, generate a value for control to be given to the data input terminal of the control memory cells of the group of control memory cells. And, based on such value for control, the control data generating means can properly control the memory circuit having a 2-bit redundancy function. Namely, when the expected value comparing means obtained a result that the readout data from the memory cells of the memory cell array is identical to the prescribed expected value, the expected value comparing means can output the first value of the ternary data to the control memory cells of the group of control memory cells.

Moreover, when the expected value comparing means obtained for the first time a result that the readout data from the memory cells of the memory cell array disagrees with the prescribed expected value, this expected value comparing means can output the second value of the ternary data to the control memory cells of the group of control memory cells.

And, when the expected value comparing means obtained for the second time a result that the readout data from the memory cells of the memory cell array disagrees with the prescribed expected value, this expected value comparing means can output the third value of the ternary data to the control memory cells of the group of control memory cells. This enables easy relieving of 2-bit failure.

Preferably, the control data generating means includes a first register in which to store output information from the expected value comparing means, disagreeing value output means for outputting a value indicating disagreement when both the information stored in the first register and the output information from the expected value comparing means indicate a value showing that the readout data from the memory cells of the memory cell array disagrees with the prescribed expected value, and a second register in which to store output information from the disagreeing value output means.

According to this present invention, it is possible to store a value for control in the first register, at the time of first detection of failure, and give data to the group of control memory cells from there.

Moreover, at the time of second detection of failure, it is also possible to detect, with the disagreeing value output means, that the first register already indicates a value indicating disagreement and that the expected value comparing means indicates a value showing disagreement of output information, and to store the output information from there in the second register and then give it to the group of control memory cells of the memory circuit. This enables easy relieving of 2-bit failure in the memory circuit.

Preferably, a data control circuit of memory circuit further comprises selecting means for selecting at least 2 different kinds of information i.e. test data given from outside or generated internally and output information from the control data generating means.

According to this present invention, the selecting means can select and output to external connecting lines at least 2 different kinds of information i.e. test data given from outside or generated internally and output information from the control data generating means, and there is no need of providing any special and individual input terminals for inputting the above-mentioned multiple kinds of information in the memory circuit, thus preventing increase in the number of terminals.

Preferably, a data control circuit of memory circuit provided for each of the external connecting lines of the memory circuit further comprises expected value comparing means for judging by comparison, in the case where the memory circuit is constructed in a way to output a plural number of readout data, whether or not all the readout data from the memory cells of the memory cell array disagrees with prescribed expected value and, based on that result of comparison, generating a value for control to be given to the data input terminal of the control memory cells of the group of control memory cells.

According to this present invention, because failure data is detected in all of the internal connecting lines in one of the direction of row and the direction of column of the memory cell array, in case of occurrence of any failure in the internal connecting lines in the other of the direction of row and the direction of column of the memory cell array, it is possible to compare, the output information from the expected value comparing means with the respective readout data from the memory circuit and, when all the data are found to be different as a result of this comparison, judges that there is a failure in the other of the direction of row and the direction of column of the memory cell array and perform, thus facilitating proper switching control of internal connecting wires on the other side thereafter.

Preferably, a data control circuit of memory circuit connected to the external connecting lines in the direction of row and the direction of column of the memory cells of the memory cell array of the memory circuit comprises: a first control unit connected to the external connecting lines in one of the direction of row and the direction of column of memory cell array; and a second control unit connected to the external connecting lines in the other of the direction of row and the direction of column of memory cell array, and the first control unit includes expected value comparing means for judging by comparison whether or not the readout data in at least one output port of the memory cell array disagrees with prescribed expected value and, based on that result of comparison, generating a value for control to be given to the data input terminal of the control memory cells of the group of control memory cells, and first register for storing the output information from the expected value comparing means and outputting it to the external connecting line on one side.

Moreover, the second control unit comprises second register for storing the output information from the expected value comparing means of the first control unit and outputting it to the external connecting line on the other side.

According to this present invention, the expected value comparing means is shared by the first control unit and the second control unit, thus enabling reduction of scale of the circuit.

Preferably, an address assigning circuit, connected to the plural number of external connecting lines of the memory circuit for sequentially assigning the external connecting lines in the direction from one end to the other end of the memory circuit comprises: a full-cycle serial data output circuit for outputting, based on preset operation formula; a full-cycle serial data as pseudo-random numbers having a certain cycle; and a decoder for sequentially assigning the external connecting lines based on output information from the full-cycle serial data output circuit.

And, the decoder comprises: output terminals of prescribed output bit numbers sequentially arranged in the direction from one end to the other end according to the order of full-cycle serial data output from the full-cycle serial data output circuit; a logical circuit unit for converting the value of the input bit number of the input terminals into value of the output bit numbers of the output terminals; and bit order changing means connected between the logical circuit unit and the output terminal for rearranging the signal of the prescribed output bit number from the logical circuit unit in the order of the output terminals.

According to this present invention, it is possible to output, based on preset operation formula, full-cycle serial data as pseudo-random numbers having a certain cycle with the full-cycle serial data output circuit, convert the value of the input bit number of input terminals into signals of output bit numbers corresponding to the output terminals with the logical circuit unit of the decoder, and then rearrange (those signals) in the order of the output terminals with the bit order changing wiring.

This makes it possible to output the full-cycle serial data output from the full-cycle serial data output circuit, in order in the direction of outputs from one end to the other end in spite of the fact they are pseudo-random numbers.

Therefore, increment or decrement of data can be made easily at the time of testing, etc.

The object of the present invention is to provide a memory circuit capable of switching redundancy circuit properly by performing tests by equipment itself such as semiconductor unit or computer containing semiconductor unit, etc. without using any expensive laser unit, in view of the problem mentioned above.

These and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a circuit diagram showing the data control circuit of the twenty-third embodiment of the present invention;

FIG. 33 is a circuit diagram showing the memory circuit of the twenty-sixth embodiment of the present invention;

DESCRIPTION OF THE PREFERRED EMBODIMENTS

{First embodiment}

<Construction>

Figure 1:
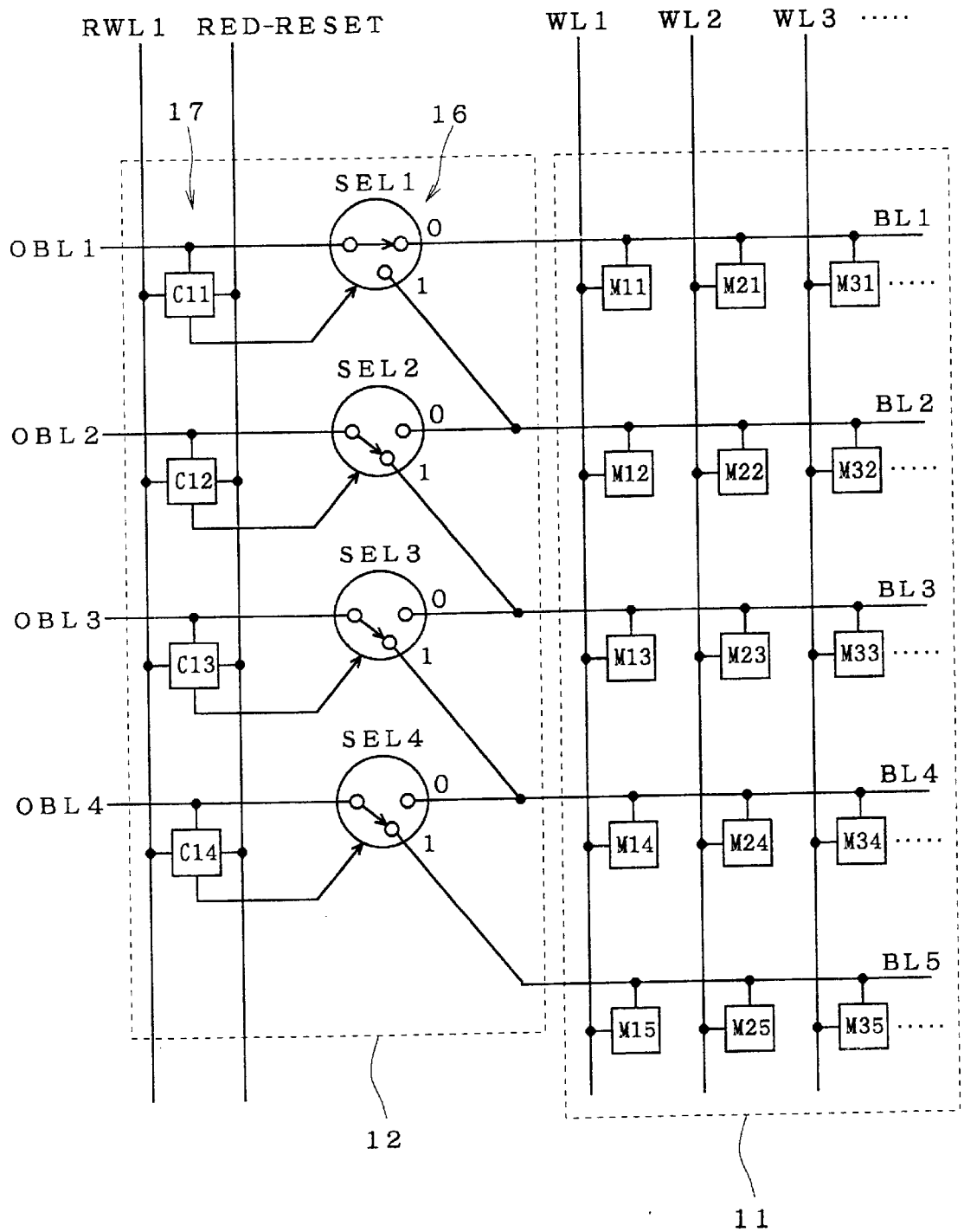
FIG. 1 is a circuit diagram showing the memory circuit of the first embodiment of the present invention.

FIG. 1 is a drawing showing the memory circuit of the first embodiment of the present invention. The memory circuit of this embodiment is intended to control selectors SEL1 to SEL4 by means of control memory cells C11 to C14 connected respectively to a plural number of external bit lines OBL1 to OBL4 and relieve failure by switching the relation of correspondence between external bit lines OBL1 to OBL4 and internal bit lines BL1 to BL5.

To be concrete, the memory circuit of this embodiment is provided with a memory cell array 11 as general single-port RAM realized by arranging a plural number of memory cells (RAM) for normal action M11 to M15, M21 to M25, M31 to M35, . . . in the shape of columns, 4 external bit lines (external connecting lines) OBL1 to OBL4 for exchanging data with 5 internal bit lines (internal connecting lines) BL1 to BL5 of the memory cell array 11 and a column redundancy control circuit (COL-RED-CTRL) 12 for compensating failure data in case of occurrence of any failure in one internal bit line BL2 itself of the memory cell array or memory cells M11 to M15, M21 to M25, M31 to M35, . . . connected to the internal bit line BL2.

In the memory cell array 11, the memory cells M11, M21, M31, . . . are connected to the first internal bit line BL1, the memory cells M12, M22, M32, . . . are connected to the second internal bit line BL2, the memory cells M13, M23, M33, . . . are connected to the third internal bit line BL3, the memory cells M14, M24, M34, . . . are connected to the fourth internal bit line BL4, and the memory cells M15, M25, M35, . . . are connected to the fifth internal bit line BL5, respectively. Moreover, the memory cells M11 to M15 are connected to the first internal word line WL1, the memory cells M21 to M25 are connected to the second internal word line WL2, and the memory cells M31 to M35 are connected to the third internal word line WL3, respectively.

Here, the reason why the number of pieces (5 pcs.) of the internal bit lines BL1 to BL5 is set larger than the number of pieces (4 pcs.) of the external bit lines OBL1 to OBL4 is that it is necessary to provide a spare internal bit line BL5 in advance to cancel either of the internal bit lines BL1 to BL4 relating to failure data and switch to other internal bit lines one after another. Therefore, the spare internal bit line BL5 is not used if no failure is produced in any of the first internal bit line BL1 to the fourth internal bit line BL4.

The respective internal bit lines BL1 to BL5 and the respective external bit lines OBL1 to OBL4 include those which are composed of a plural number of signal lines (not illustrated). For example, a general static RAM has both reversed bit lines and non reversed bit lines, but they are generically called bit lines in the present invention. In this case, the first internal bit line BL1 and the first external bit line OBL1 for example are composed of 2 signal lines i.e. a reversed bit line and a non reversed bit line. In the same way, a multi-port RAM has signal lines related to bit lines for a plural number of ports, and they are generically called internal bit lines BL1 to BL5 or external bit lines OBL1 to BL4. For example, in a 3-port RAM having 1 write only port and 2 readout ports, internal bit lines BL or external bit lines OBL1 to OBL4 are constructed with at least 3 signal lines (respectively) and also constructed with 6 signal lines when (the RAM) has both reversed bit line and non reversed bit line for each port. However, those signal lines will be expressed with a single signal line for the sake of convenience in FIG. 1.

And, the redundancy control circuit 12 is constructed with a group of selectors 16 composed of 4 selectors SEL1 to SEL4 for selecting and connecting internal bit lines BL1 to BL5 mutually adjacent to the external bit lines OBL1 to OBL4 and a group of control memory cells 17 composed of 4 control memory cells C11 to C14 for giving instructions about the selection in the respective selectors SEL1 to SEL4.

The respective selectors SEL1 to SEL4 in the group of selectors 16 are relays using semiconductor devices such as transistor, etc. and are constructed in a way to be switchably connected to the terminals on the lower bit side for connection to the internal bit lines BL1 to BL4 which are put in correspondence in advance to the respective selectors SEL1 to SEL4, when the value stored in the respective control memory cells C11 to C14 of the group of control memory cells 17 is "0", and to be switchably connected to the terminals on the higher bit side for connection to the internal bit lines BL2 to BL5 which are adjacent on the higher bit side to those which are put in correspondence in advance to the respective selectors SEL1 to SEL4, when the value stored in the respective control memory cells C11 to C14 of the group of control memory cells 17 is "1". With such construction, the group of selectors 16 has the function of sequentially switching to disengage the connection between the internal bit lines BL1 to BL4 having failure data and the external bit lines OBL1 to OBL4 which are put in correspondence thereto, connect the external bit lines arranged on the lower bit side as from the internal bit lines BL1 to BL4 having failure data concerned to the internal bit lines BL1 to BL4 which are put in correspondence thereto, and further connect the external bit lines arranged further on the higher bit side as from the internal bit lines BL1 to BL4 having failure data concerned to the internal bit lines BL1 to BL4 which are put in correspondence with the respective external bit lines concerned, depending on the value stored in the respective control memory cells C11 to C14 to be described later.

The respective control memory cells C11 to C14 of the group of control memory cells 17 are 1-bit registers provided with resetting function, and their reset terminals are connected commonly to reset signal line RED-RESET. Moreover, the respective control memory cells C11 to C14 are constructed in a way to store the data given by the respective input terminals when the word line RWL1 is active. And, the data input terminal of the first control memory cell C11 is connected to the first external bit line OBL1, the data input terminal of the second control memory cell C12 is connected to the second external bit line OBL2, the data input terminal of the third control memory cell C13 is connected to the third external bit line OBL3, and the data input terminal of the fourth control memory cell C14 is connected to the fourth external bit line OBL4 respectively. Moreover, the data output terminals of the respective control memory cells C11 to C14 are connected to the switching signal input terminals of the respective corresponding selectors SEL1 to SEL4. And, the respective control memory cells C11 to C14 store, based on the data given by the respective external bit lines OBL1 to OBL4, the value "0" regarding the external bit lines OBL1 to OBL4 arranged on the lower bit side as from the internal bit lines BL1 to BL4 having failure data, and stores the value "1" regarding the external bit lines OBL1 to OBL4 arranged on the higher bit side as from the internal bit lines BL1 to BL4 having failure data. As respective control memory cells C11 to C14, memory cells similar to the respective memory cells M11 to M15, M21 to M25, M31 to M35, . . . of the memory cell array 11 may be used, and electrically programmable memory cells for ROM may also be used. In the case where the memory cell array 11 has write only port and readout port separately, the control memory cells C11 to C14 must be connected to the bit line of the write port.

<Actions>

Explanation will be given on the actions of the memory circuit of above-mentioned construction. For example, in case of occurrence of any failure such as breaking of wire or short-circuiting, etc. of the second internal bit line BL2 or occurrence of any failure in the memory cells M12, M22, M32, . . . connected to the second internal bit line BL2, the selectors SEL1 to SEL4 are switched in a way to keep correspondence between the first external bit line OBL1 and the first internal bit line BL1, between the second external bit line OBL2 and the third internal bit line BL3, between the third external bit line OBL3 and the fourth internal bit line BL4, and between the fourth external bit line OBL4 and the fifth internal bit line BL5 as shown in FIG. 1. This switching is made with writing of "0", "1", "1", "1" respectively in the control memory cells C11 to C14.

Because access to the memory cells for normal action M11 to M15, M21 to M25, M31 to M35, . . . is made from the external bit lines OBL1 to OBL4, no failure relating to the second internal bit line BL2 is observed from outside and (the memory circuit) can work as if it were a memory circuit without failure.

After resetting of all the control memory cells C11 to C14 of the group of control memory cells 17, the memory cells for normal action M11 to M15, M21 to M25, M31 to M35, . . . are tested and, if any failure is detected, the selectors SEL1 to SEL4 are switched as described above to relieve the failure.

In this way, it is possible to easily relieve failure data of the semiconductor system even without using any laser unit and reduce the manufacturing cost compared with the first prior art and the second prior art.

{Second embodiment}

<Construction>

Figure 2:
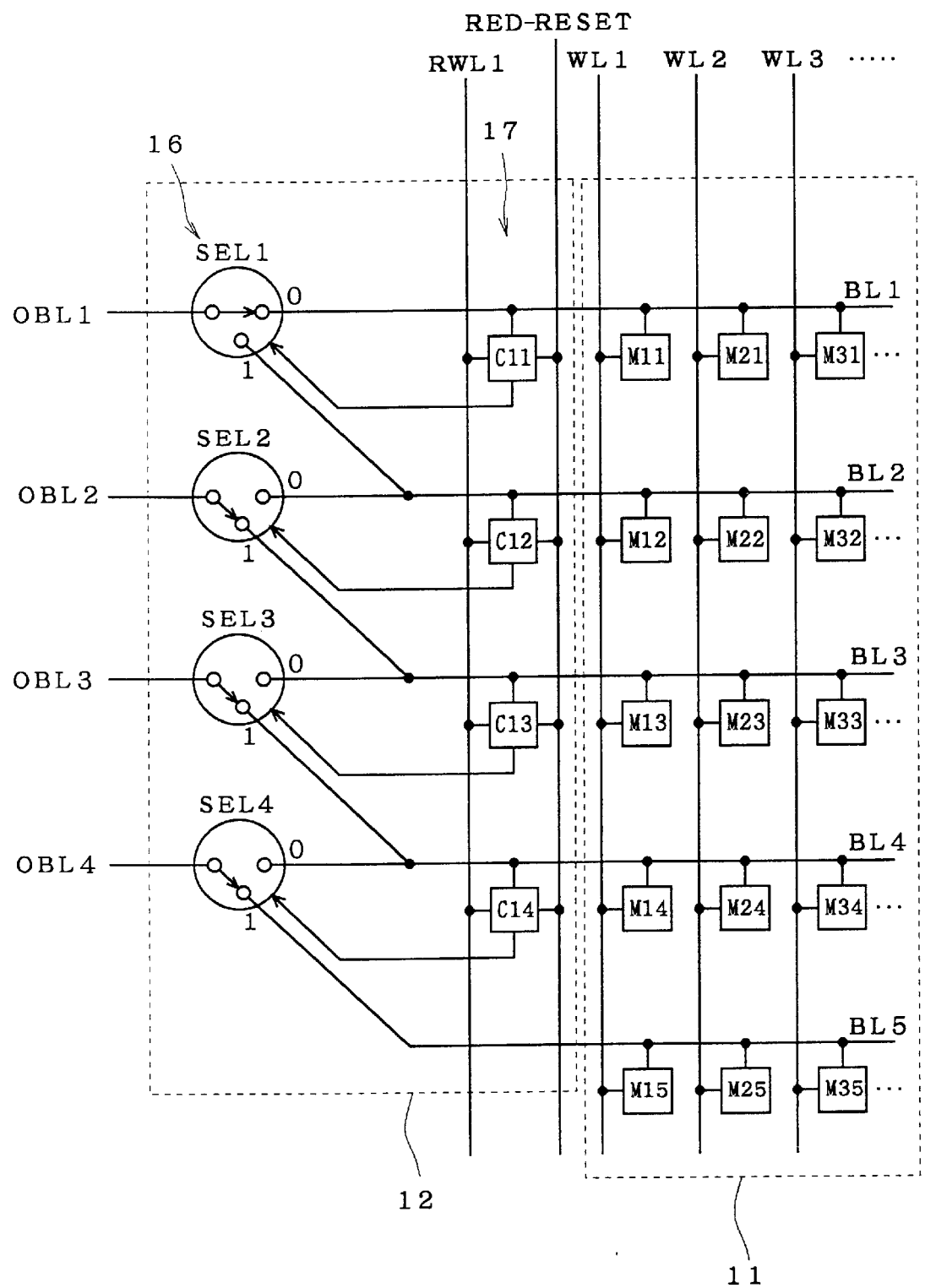
FIG. 2 is a circuit diagram showing the memory circuit of the second embodiment of the present invention.

FIG. 2 is a drawing showing the memory circuit of the second embodiment of the present invention. In FIG. 2, the same symbols are put to devices having the same functions as in the first embodiment. The memory circuit of this embodiment is identical to the first embodiment in that it relieves failure by controlling the selectors SEL1 to SEL4 with the control memory cells C11 to C14 connected the external bit lines OBL1 to OBL4 and switching the relation of correspondence between external bit lines OBL1 to OBL4 and internal bit lines BL1 to BL5, but is different from the first embodiment in the connecting layout of the group of control memory cells 17.

Namely, the group of control memory cells 17 is arranged more on the memory cell array 11 side than the group of selectors 16, and the data input terminal of the first control memory cell C11 is connected to the first internal bit line BL1 of the group of control memory cells 17, the data input terminal of the second control memory cell C12 is connected to the second internal bit line BL2, the data input terminal of the third control memory cell C13 is connected to the third internal bit line BL3, and the data input terminal of the fourth control memory cell C14 is connected to the fourth internal bit line BL4 respectively. Explanation on other construction will be omitted because it is the same as in the first embodiment.

<Actions>

Explanation will be given on the actions of the memory circuit of above-mentioned construction. For example, in case of occurrence of any failure such as breaking of wire or short-circuiting, etc. of the second internal bit line BL2 or occurrence of any failure in the memory cells M12, M22, M32, . . . connected to the second internal bit line BL2, the selectors SEL1 to SEL4 are switched in a way to keep correspondence between the first external bit line OBL1 and the first internal bit line BL1, between the second external bit line OBL2 and the third internal bit line BL3, between the third external bit line OBL3 and the fourth internal bit line BL4, and between the fourth external bit line OBL4 and the fifth internal bit line BL5 as shown in FIG. 2. This switching is made with writing of "0", "1", "1", "1" respectively in the control memory cells C11 to C14.

The control memory cells C11 to C14 shall preferably be those provided with resetting function. This is because writing in control memory cells may become impossible in the case of use of control memory cells without resetting function. If, in the absence of resetting function, "0", "1", "1", "1" are set in the control memory cells C11 to C14 when power is turned ON after turning OFF of power in the state of FIG. 2, for example, the second control memory cell C12 is not connected to any of the external bit lines OBL1 to OBL4 and gets always in the state of FIG. 2 in later actions. Therefore, there is no means for setting "0" in the second memory cell C12 and it becomes impossible to perform proper switching of redundancy circuit. To set "0" in the second control memory cell C12 in the state of FIG. 2 considering such situation, all what is needed is to feed reset signal from the reset signal line RED-RESET.

Explanation on the actions after resetting will be omitted because they are the same as those of the first circuit. This embodiment also makes it possible to easily relieve failure data of the semiconductor system even without using any laser unit and reduce the manufacturing cost compared with the first prior art and the second prior art.

{Third embodiment}

<Construction>

Figure 3:
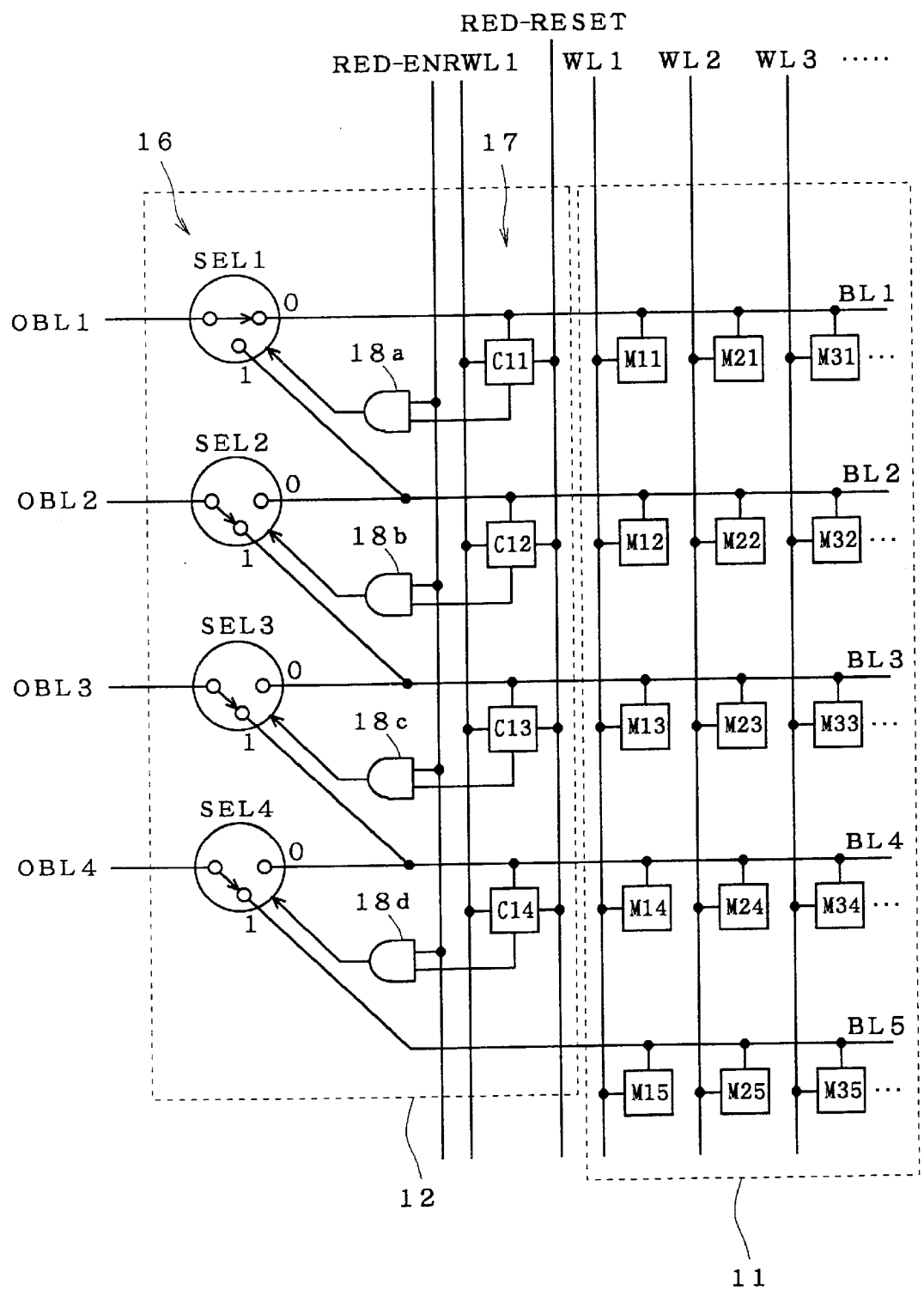
FIG. 3 is a circuit diagram showing the memory circuit of the third embodiment of the present invention.

FIG. 3 is a drawing showing the memory circuit of the third embodiment of the present invention. In FIG. 3, the same symbols are put to devices having the same functions as in the second embodiment. The memory circuit of this embodiment is identical to the second embodiment in that it relieves failure by controlling the selectors SEL1 to SEL4 with the control memory cells C11 to C14 connected the external bit lines OBL1 to OBL4 and switching the relation of correspondence between external bit lines OBL1 to OBL4 and internal bit lines BL1 to BL5, but is different from the second embodiment in that it is constructed to be capable of transmitting redundancy enable signals as indication of willingness for switching the selectors of the group of selectors 16.

Namely, 2-input logical product (AND) circuits 18a to 18d are inserted respectively between the data output terminals of the respective control memory cells C11 to C14 and the switching signal input terminals of the respective selectors SEL1 to SEL4. To be concrete, the output terminals of the respective 2-input logical product (AND) circuits 18a to 18d are connected to the switching signal input terminals of the corresponding selectors SEL1 to SEL4, the input terminals on one side of the respective logical product circuits 18a to 18d are connected to the data output terminals of the corresponding control memory cells C11 to C14, and the input terminals on the other side of the respective logical product circuits 18a to 18d are connected to the redundancy enable signal line RED-EN to which redundancy enable signal is supplied. Explanation on other construction will be omitted because it is the same as in the first embodiment.

<Actions>

Explanation will be given on the actions of the memory circuit of above-mentioned construction. First, in the initialization stage of the selectors SEL1 to SEL4 of the group of selectors 16, the respective selectors SEL1 to SEL4 are switched to "0" side by either supplying reset signal from the reset signal line RED-RESET or giving data "0" from the redundancy enable signal line RED-EN.

And, for example, in case of occurrence of any failure such as breaking of wire or short-circuiting, etc. of the second internal bit line BL2 or occurrence of any failure in the memory cells M12, M22, M32, . . . connected to the second internal bit line BL2, "1" is supplied from the redundancy enable signal line RED-EN and the external bit lines OBL1 to OBL4 supply data corresponding to failure data to the respective control memory cells C11 to C14, while the logical product circuits 18a to 18d computes the logical product of the value of the control memory cells C11 to C14 and the data "1" given by the redundancy enable signal line RED-EN and switches the selectors SEL1 to SEL4 of the group of selectors 16. To be concrete, the selectors SEL1 to SEL4 are switched in a way to keep correspondence between the first external bit line OBL1 and the first internal bit line BL1, between the second external bit line OBL2 and the third internal bit line BL3, between the third external bit line OBL3 and the fourth internal bit line BL4, and between the fourth external bit line OBL4 and the fifth internal bit line BL5 as shown in FIG. 3. This switching is made with writing of "0", "1", "1", "1" respectively in the control memory cells C11 to C14.

This embodiment also makes it possible to easily relieve failure data of the semiconductor system even without using any laser unit and reduce the manufacturing cost compared with the first prior art and the second prior art.

In this embodiment, it is possible, unlike the first and the second embodiments, to switch the respective selectors SEL1 to SEL4 of the group of selectors independently, regardless of the value of the respective control memory cells of the group of control memory cells 17, by adjusting the redundancy enable signal to be given to the redundancy enable signal line RED-EN. Therefore, not only the respective memory cells M11 to M15, M21 to M25, M31 to M35, . . . of the memory cell array 11 but also the respective control memory cells C11 to C14 themselves can be tested easily.

{Fourth embodiment}

<Construction>

Figure 4:
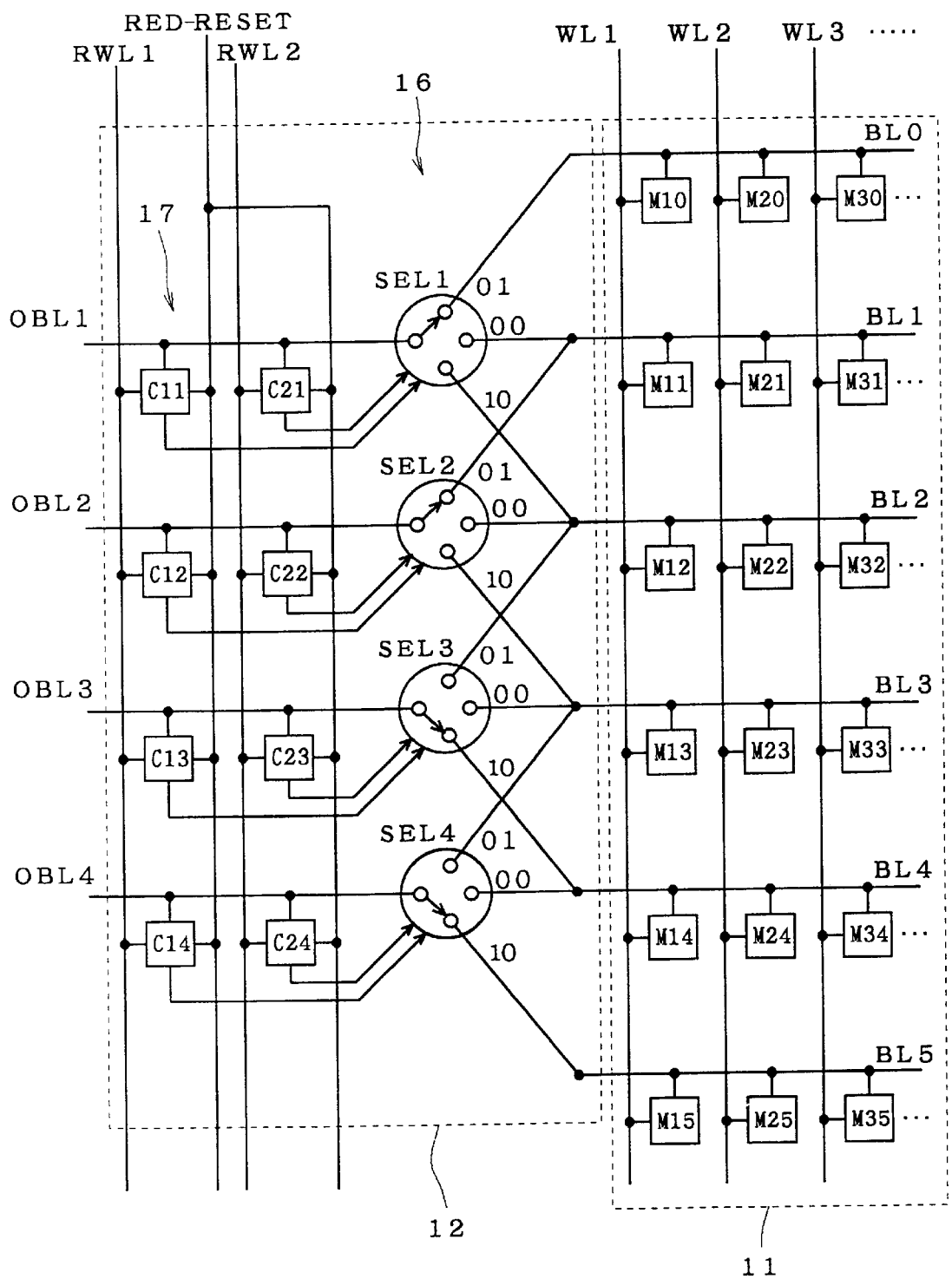
FIG. 4 is a circuit diagram showing the memory circuit of the fourth embodiment of the present invention.
Figure 5:
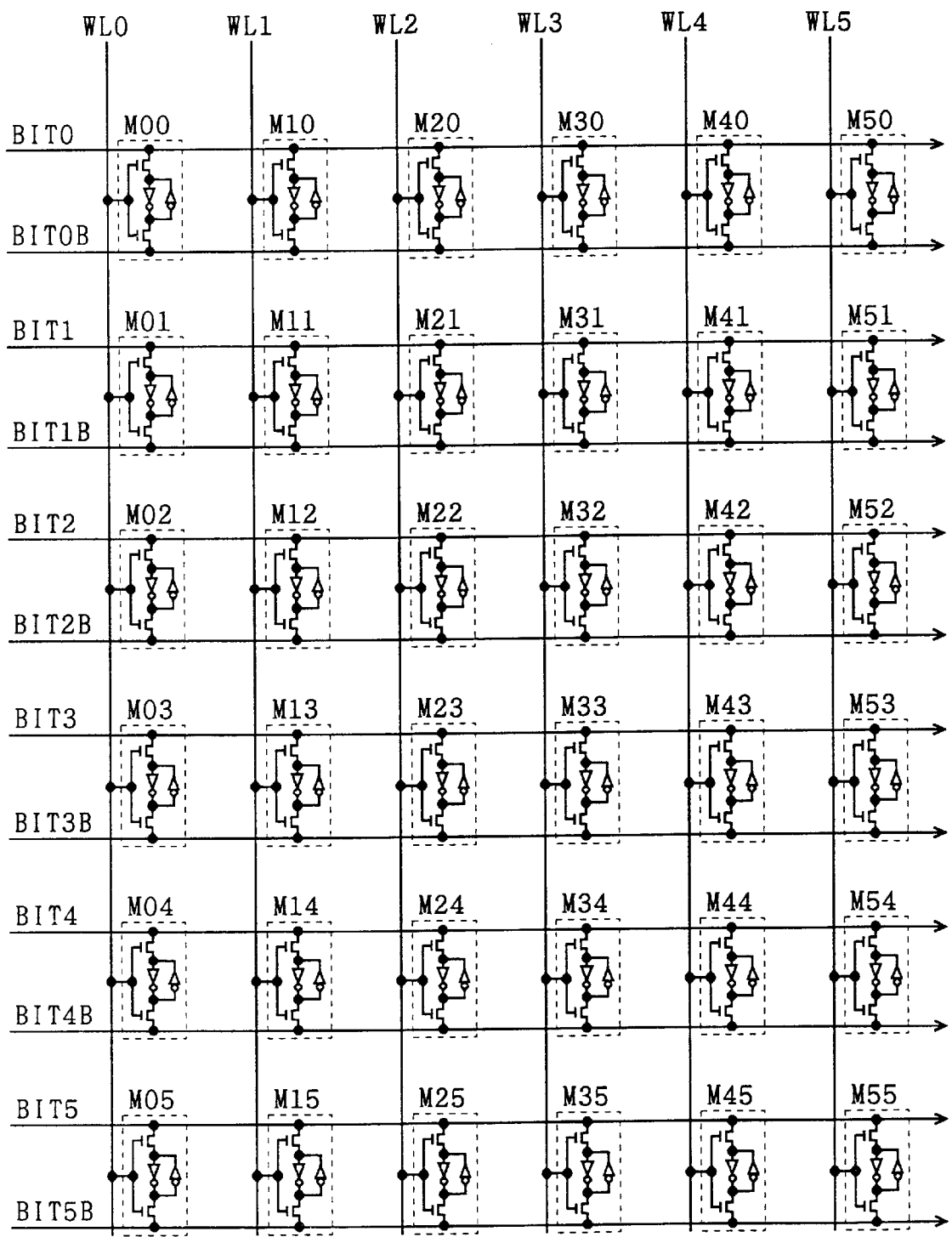
FIG. 5 is a circuit diagram showing the internal construction of the memory cell array in the memory circuit of the fourth embodiment of the present invention.

FIG. 4 is a drawing showing the memory circuit of the fourth embodiment of the present invention. In FIG. 4, the same symbols are put to devices having the same functions as in the third embodiment. The memory circuit of this embodiment is realized to be capable of relieving failure of max. 2 pieces of the internal bit lines BL1 to BL5 and, for that purpose, the number of wires of the internal bit lines BL0 to BL5 (6 pcs.) is set larger by two than the number of wires of the external bit lines OBL1 to OBL4 (4 pcs.), as shown in FIG. 4. FIG. 5 is a circuit diagram showing the internal construction of the memory cell array 11, in which the respective memory cells M00 to M05, M10 to M15, M20 to M25, M30 to M35, . . . are constructed with general static RAMs of complementary bit line system.

And, the column redundancy control circuit 12 is constructed, as shown in FIG. 4, with a group of selectors 16 composed of 4 pieces of 3-contact type selectors SEL1 to SEL4 and a group of control memory cells composed of 8 pieces of 1-bit control memory cells C11 to C14, C21 to C24.

The respective selectors SEL1 to SEL4 of the group of selectors 16 are connected to the corresponding external bit lines OBL1 to OBL4 and constructed in a way to selectively switch continuously adjacent 3 pieces of internal bit lines BL0 to BL5 respectively. To be concrete, (the respective selectors SEL1 to SEL4) are connected to the internal bit lines BL1 to BL4 located relatively at the center put in correspondence to the external bit lines OBL1 to OBL4 concerned, when "00" is input in the switching signal input terminal of the respective selectors SEL1 to SEL4, connected to the internal bit lines BL0 to BL3 located relatively on lower bit side than the internal bit lines BL1 to BL4 which are put in correspondence to the external bit lines OBL1 to OBL4 concerned, when "01" is input in the switching signal input terminal, and connected to the internal bit lines BL2 to BL5 located relatively on higher bit side than the internal bit lines BL1 to BL4 which are put in correspondence to the external bit lines OBL1 to OBL4 concerned, when "10" is input in the switching signal input terminal.

Of the control memory cells C11 to C14, C21 to C24 of the group of control memory cells 17, the control memory cells C11, C21 are both connected to the first external bit line OBL1 to form a pair, and store the 2-bit data to be given to the switching signal input terminal of the first selector SEL1. The control memory cells C12, C22 are both connected to the second external bit line OBL2 to form a pair, and store the 2-bit data to be given to the switching signal input terminal of the first selector SEL2. The control memory cells C13, C23 are both connected to the third external bit line OBL3 to form a pair, and store the 2-bit data to be given to the switching signal input terminal of the first selector SEL3. The control memory cells C14, C24 are both connected to the fourth external bit line OBL4 to form a pair, and store the 2-bit data to be given to the switching signal input terminal of the first selector SEL4.

Moreover, the control memory cells C11 to C14, C21 to C24 are constructed in a way to store the data given by the corresponding external bit lines OBL1 to OBL4 when the word lines RWL1, RWL2 are activated. Furthermore, the control memory cells C11 to C14, C21 to C24 are reset with reset signals from the reset signal line RED-RESET.

The 2-bit control memory cells (C11, C21), (C12, C22), (C13, C23), (C14, C24) connected in pairs respectively to the respective external bit lines OBL1 to OBL4 are constructed in a way to allow writing of 4 different kinds of data (0, 0), (0, 1), (1, 0), (1, 1), but only 3 data or (0, 0), (0, 1), (1, 0) are used for switching control of the respective selectors SEL1 to SEL4 of the group of selectors 16 while (1, 1) is ignored.

Figure 6:
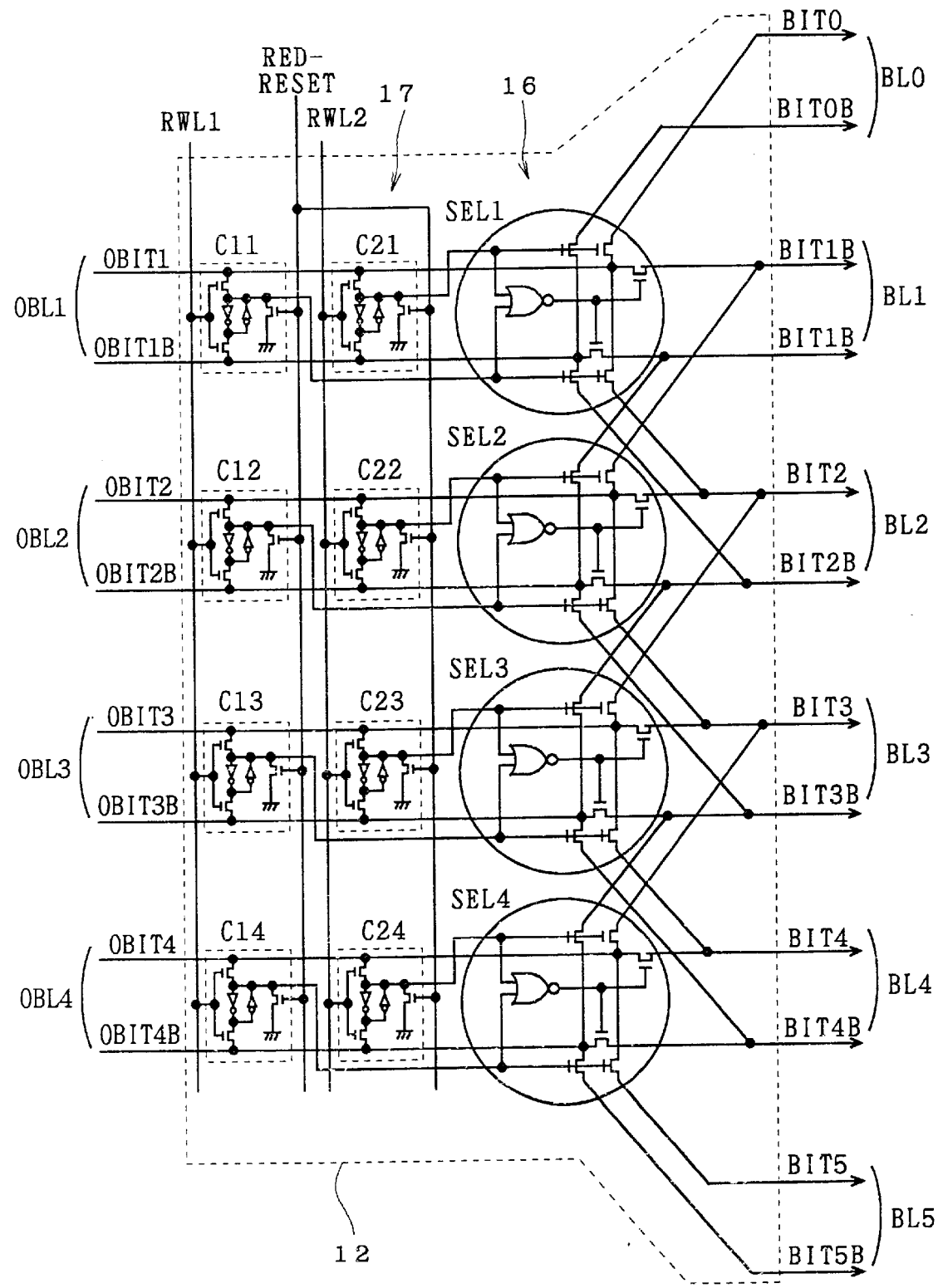
FIG. 6 is a circuit diagram showing the redundancy control circuit in the memory circuit of the fourth embodiment of the present invention.

FIG. 6 is a circuit diagram showing the redundancy control circuit of this embodiment. As shown in FIG. 6, the external bit lines OBL1 to OBL4 are composed of non reversed external bit lines OBIT1 to OBIT4 and reversed external bit lines OBIT1B to OBIT4B. For example, the external bit line OBL1 consists of a non reversed external bit line OBIT1 and a reversed external bit lines OBIT1B.

Similarly, the internal bit lines BL0 to BL5 are composed of non reversed internal bit lines BIT0 to BIT5 and reversed internal bit lines BIT0B to BIT5B. For example, the internal bit line BL1 consists of a non reversed internal bit line BIT1 and a reversed internal bit lines BIT1B.

The selectors SEL1 to SEL4 are composed with 6 transistors and 1 NOR circuit, and the respective selectors SEL1 to SEL4 are controlled by 2 control memory cells C11 to C14.

To be concrete, the selector SEL1 is controlled by the 2-bit control memory cells (C11, C21) as shown in FIG. 6, for example. When (0, 0) is set for the control memory cells (C11, C21) concerned, the output of the NOR circuit of the selector SEL1 which is put in correspondence thereto becomes "1" and, as part of the transistors controlled by this NOR circuit are put under voltage, OBIT1 and BIT1, OBIT1B and BIT1B are connected to each other respectively. Moreover, if (0, 1) is set for the control memory cells (C11, C21) concerned, OBIT1 and BIT0, OBIT1B and BIT0B are connected. Moreover, when (1, 0) is set for the control memory cells (C11, C21) concerned, OBIT1 and BIT2, OBIT1B and BIT2B are connected.

Figure 7:
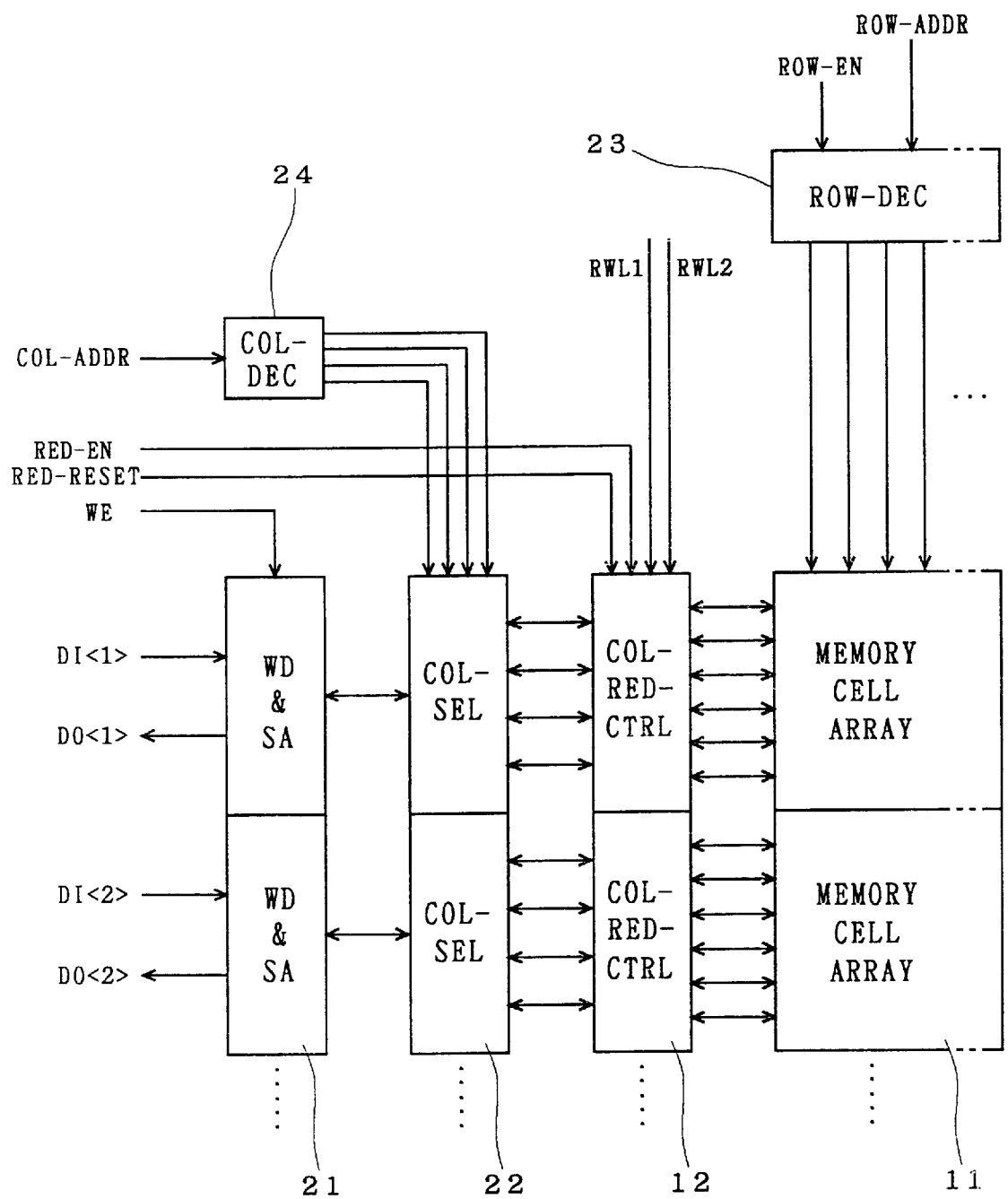
FIG. 7 is a circuit diagram showing the general construction of the memory circuit of the fourth embodiment of the present invention.

Here, FIG. 7 is a circuit diagram showing the general construction of the memory circuit of this embodiment. Here, 2 pieces each of memory cell array 11 and column redundancy control circuit 12 are provided respectively. Moreover, the symbol 21 in FIG. 7 represents 2 writing drivers and sense amplifier (WD & SA), while the symbol 22 shows 2 column selectors (COL-SEL), and they correspond at 1:1 to the respective column redundancy control circuits 12. And, the control data for the respective column redundancy control circuits 12 is constructed in a way to be input from the write data input terminals DI<1>, DI<2> of respective bits. Furthermore, the symbol 23 is a row decoder (word line decoder: ROW-DEC) for switching the word lines of the memory cell array 11, the symbol 24 is a column decoder (bit line decoder: COL-DEC) for switching the bit lines of the memory cell array 11, ROW-EN is a redundancy enable signal, COL-ADDR and ROW-ADDR are address assigning signals, and RED-EN is a redundancy enable signal line used when enabling transmission of redundancy enable signal as indication of willingness for switching selectors of the group of selectors 16 as in the third embodiment indicated in FIG. 3, for example. The redundancy enable signal line RED-EN is not particularly required in the construction of FIG. 4 and, therefore, may be omitted.

<Actions>

Explanation will be given on the actions of the memory circuit of above-mentioned construction. For example, in case of occurrence of any failure such as breaking of wire or short-circuiting, etc. of the second internal bit line BL2 and the 2 internal bit lines of the internal bit lines BL3 or occurrence of any failure in the memory cells M12, M13, M22, M23, M32, M33, . . . connected to the internal bit lines BL2, BL3, the selectors SEL1 to SEL4 are switched in a way to keep correspondence between the first external bit line OBL1 and the "0"th internal bit line BL0, between the second external bit line OBL2 and the first internal bit line BL1, between the third external bit line OBL3 and the fourth internal bit line BL4, and between the fourth external bit line OBL4 and the fifth internal hit line BL5 as shown in FIG. 4. This switching is made with writing of "0, 1", "0, 1", "1, 0", "1, 0" respectively in the respective control memory cells (C11, C21), (C12, C22), (C13, C23), (C14, C24) made through the external bit lines OBL1 to OBL4.

In this way, it is possible to easily relieve failure data of two internal bit lines even without using any laser unit and reduce the manufacturing cost compared with the first prior art and the second prior art.

{Fifth embodiment}

<Construction>

Figure 8:
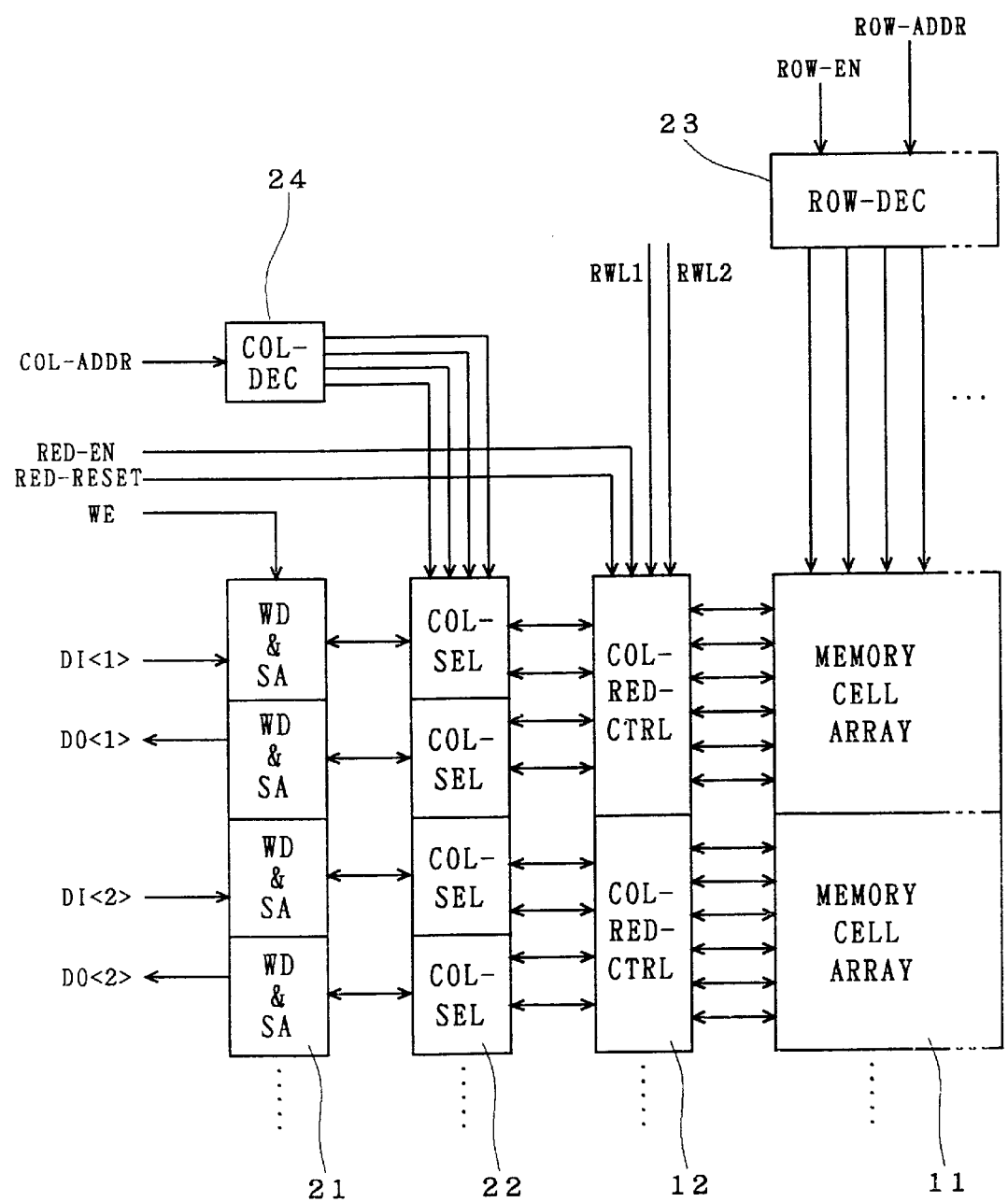
FIG. 8 is a circuit diagram showing the general construction of the memory circuit of the fifth embodiment of the present invention.

FIG. 8 is a drawing showing the memory circuit of the fifth embodiment of the present invention. In FIG. 8, the same symbols are put to devices having the same functions as in the fourth embodiment. The memory circuit of this embodiment is realized by assigning a plural number (2 pcs. in FIG. 8) of column selectors to one column redundancy control circuit 12.

Namely, the control data to the respective column redundancy control circuits 12 is input from 2 pairs of write data input terminals (DI<1>, DI<2>), (DI<3>, DI<4>), and the readout data from the memory cell array 11 is output from mutually adjacent 2 pairs of data readout terminals (DO<1>, DO<2>), (DO<3>, DO<4>).

Other construction is similar to that in the fourth embodiment and, especially, the construction of the column redundancy control circuit 12 and the memory cell array 11 is the same as that shown in FIG. 4. So, explanation on such construction will not be repeated here.

<Actions>

Explanation will be given on the actions of the memory circuit constructed as described above. For example, to relieve some failure data existing in the memory cell array 11 corresponding to DI<1> and DI<2>, (the memory circuit) writes (0, 1) (0, 1) in the control memory cells (C11, C21), (C12, C22) indicated in FIG. 4 from DI<1> to be relieved and, at the same time, writes (1, 0) (1, 0) in the control memory cells (C13, C23), (C14, C24) in FIG. 4 from DI<2>. Explanation on the subsequent actions will be omitted because they are the same as those in the fourth embodiment. Also in this embodiment, it is possible to easily relieve failure data of two internal bit lines even without using any laser unit and reduce the manufacturing cost compared with the first prior art and the second prior art.

{Sixth embodiment}

Figure 9:
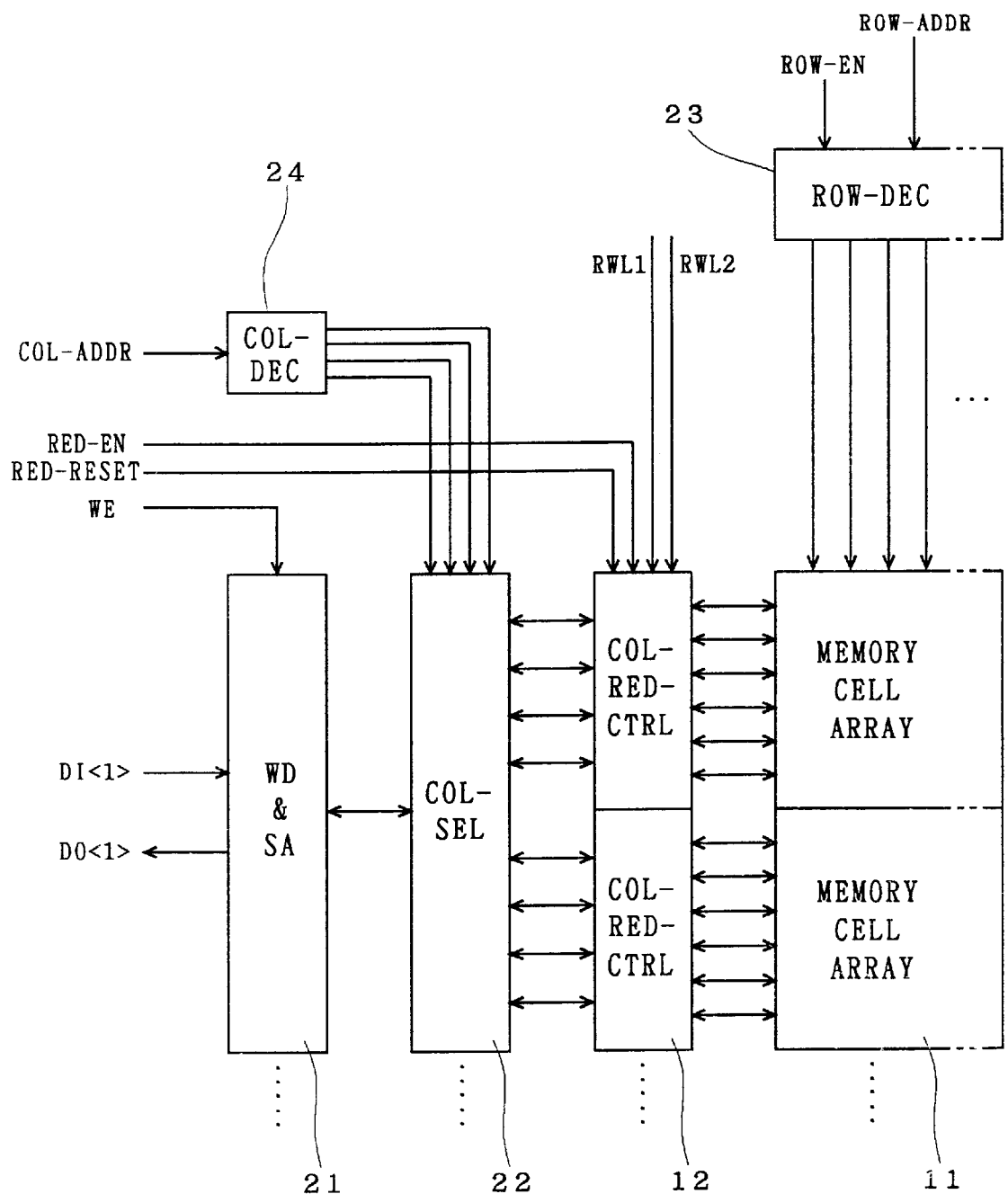
FIG. 9 is a circuit diagram showing the general construction of the memory circuit of the sixth embodiment of the present invention.

FIG. 9 is a drawing showing the memory circuit of the sixth embodiment of the present invention. The memory circuit of this embodiment is realized by assigning a plural number (2 pcs. in FIG. 9) of redundancy control circuits 12c to one column selector 22.

Namely, the control data to mutually adjacent 2 column redundancy control circuits 12 is input from one write data input terminal DI<1>, and in which column redundancy control circuits 12 to write the control data is controlled with column address control signal COL-ADDR. Moreover, the readout data from the memory cell array 11 is output from one readout terminals DO<1>.

Other construction is similar to that in the fifth embodiment and, especially, the construction of the memory cell array 11 and the column redundancy control circuit 12 is the same as that shown in FIG. 4. So, explanation on such construction will be omitted.

Also in this embodiment, it is possible to easily relieve failure data of two internal bit lines even without using any laser unit and reduce the manufacturing cost compared with the first prior art and the second prior art.

{Seventh embodiment}

Figure 10:
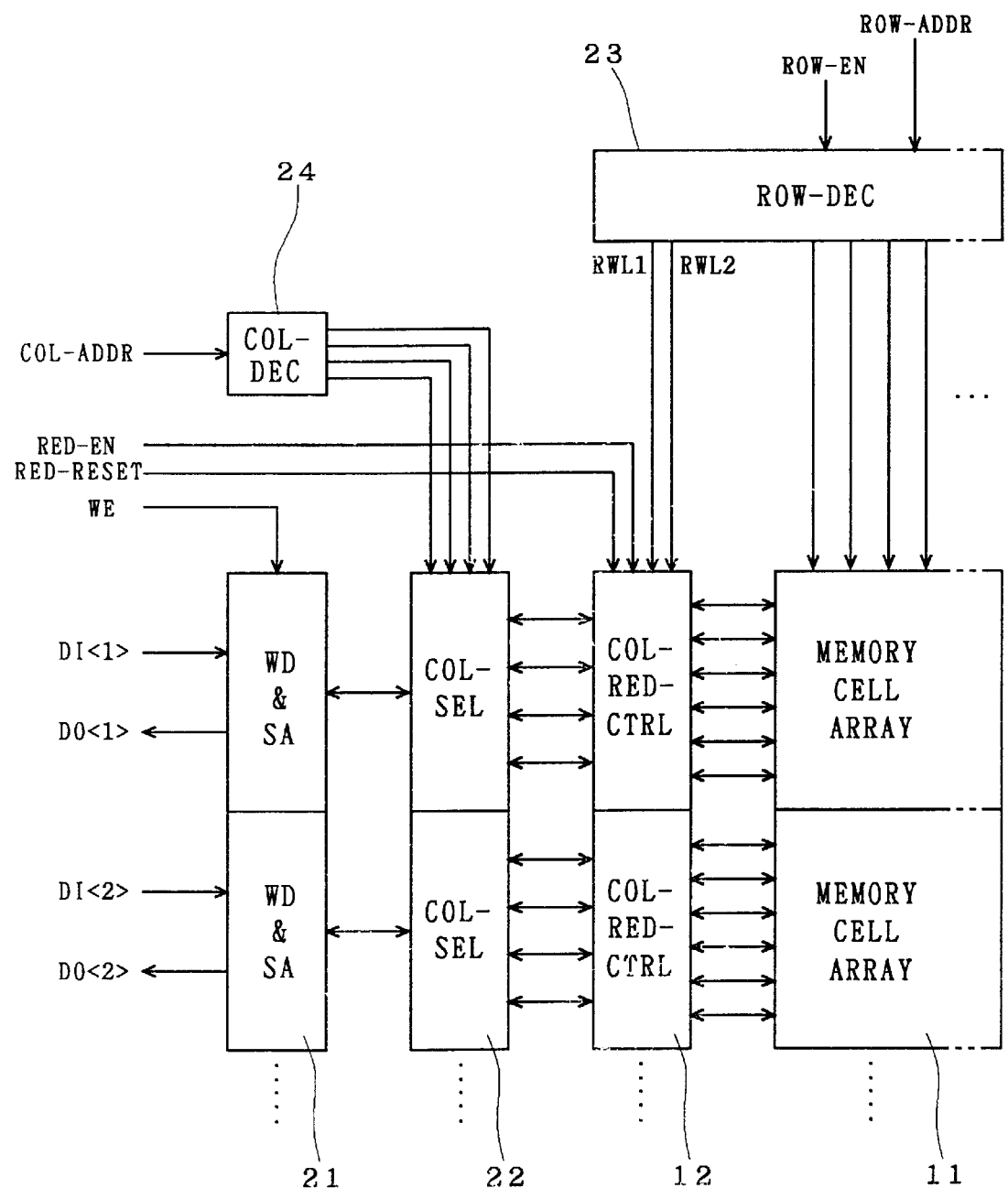
FIG. 10 is a circuit diagram showing the general construction of the memory circuit of the seventh embodiment of the present invention.

FIG. 10 is a drawing showing the memory circuit of the seventh embodiment of the present invention. The memory circuit of this embodiment is realized by diverting the superfluous bit portion of the row decoder 23 for normal action as selecting circuit of word lines RWL1, RWL2 for controlling the column redundancy control circuits 12. Namely, if the internal word lines of the memory cell array 11 available are for 120 words only even if the row decoder 23 theoretically has output terminals for $2^7=128$ bits, there exist 8 superfluous bits. So, to reduce waste of circuits, Nods. 127 and 126 (pre decoder, for example) among the output terminals of the row decoder 23 are assigned to word lines RWL1, RWL1.

Other construction is similar to that in the fourth embodiments, so explanation on such construction will be omitted. Also in this embodiment, it is possible to easily relieve failure data of two internal bit lines even without using any laser unit and reduce the manufacturing cost compared with the first prior art and the second prior art.

{Eighth embodiment}

<Construction>

Figure 11:
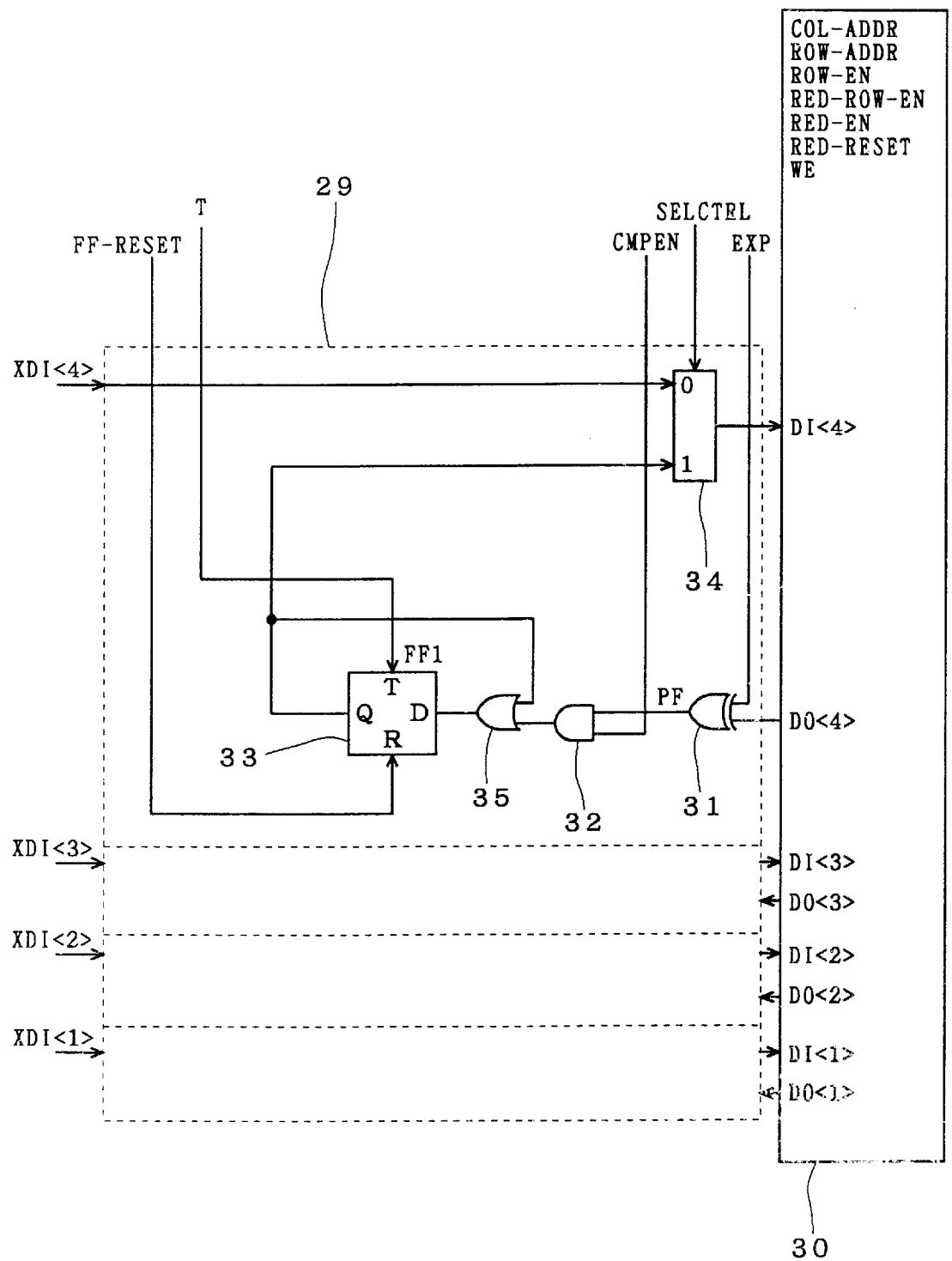
FIG. 11 is a circuit diagram showing the data control circuit of the eighth embodiment of the present invention.

FIG. 11 is a drawing showing a data control circuit 29 (data generating circuit for control memory cell) relating to the memory circuit having a column redundancy control circuit with a relative redundancy of 1 as indicated in FIG. 1, of the eighth embodiment of the present invention. The data control circuit 29 of this embodiment is provided for each of the respective external bit lines OBL1 to OBL4 of the memory circuit indicated in FIG. 1, and comprises one exclusive logical sum (Ex. OR) circuit 31, one logical product (AND) circuit 32, one flip-flop 33 and one selector 34 (first selecting means).

The exclusive logical sum circuit 31 and the logical product circuit 32 function as expected value comparing means for judging by comparison whether or not the readout data in the respective output ports DO<1> to DO<4> disagrees with prescribed expected value signal EXP. Given from outside and, based on that result of comparison, generating a value for control PF to be given to the data input terminal of the control memory cells of the group of control memory cells. One terminal of the exclusive logical sum circuit 31 is connected to the expected value input terminal to which the expected value signal EXP. Is given, while the other terminal is connected to the respective output ports DO<1> of the memory circuit 30. One terminal of the logical product circuit 32 is connected to the compare enable signal input terminal to which the compare enable signal CM PEN is given, while the other terminal is connected to the output terminal of the exclusive logical sum circuit 31.

The flip-flop 33, provided with resetting function, is reset with reset signal OFF-RESET from outside. Moreover, the data input terminal D of the flip-flop 33 is connected to the output terminal of the logical product circuit 32 through the logical sum (OR) circuit 35 for data feedback. The flip-flop 33 maintains the value "1" unless any resetting is made with reset signal OFF-RESET by data feedback of the logical sum (circuit 35, after the output from the logical product circuit 32 became "1". The flip-flop 33 may be of either asynchronous reset type or synchronous reset type. The numeral T in FIG. 11 denotes a clock signal.

The "0" side input terminal of the selector 34 is connected with the write data input terminal DI<1> to DI<4> from outside, while the "1" side input terminal is connected with the data output terminal Q of the flip-flop 33. And, it has the function of selecting the write data from out and the value for control PF from the exclusive logical sum circuit 31 and the logical product circuit 32, based on select signal SELLER from outside.

<Actions>

Explanation will be given on the actions of the data control circuit 29 of the construction described above. First, it resets the flip-flop 33 to "0" with reset signal OFF-RESET.

Next, the exclusive logical sum circuit 31 compares the expected value signal EXP. And the respective data output DO<1> to DO<4> by sequentially switching the internal bit lines from BL1 to BL5 and, if they are different, output "1" as value for control PF. If, in this state, clock T is given when the compare enable signal CM PEN is "1", "1" is set in the flip-flop 33. If, at this point in time, the select signal SELECT is given as "1", the value "1" is written in the respective control memory cells C11 to C14 of the group of control memory cells 17 indicated in FIG. 1, through each of DO<1> to DO<4>. On the contrary, in the absence of any failure data in the respective internal bit lines BL0 to BL5, the respective control memory cells C11 to C14 maintain the value "0". According to such value of the control memory cells C11 to C14, the selectors SEL1 to SEL4 of the group of selectors 16 perform prescribed selection and switching.

For example, in case of failure of the second internal bit line BL2 or memory cells M12, M22, M32, . . . For normal indicated in FIG. 1, "0", "1", "1", "1" are written in the respective control memory cells C11 to C14, thus enabling proper switching of redundancy circuits.

The write data into the memory cell array I1 at the time of testing may be given from the write data input terminals DI<1> to DI<4> in the state of select signal SELECT="0".

This embodiment also makes it possible to easily relieve failure data relating to one internal bit line even without using any laser unit and reduce the manufacturing cost compared with the first prior art and the second prior art.

{Ninth embodiment}

<Construction>

Figure 12:
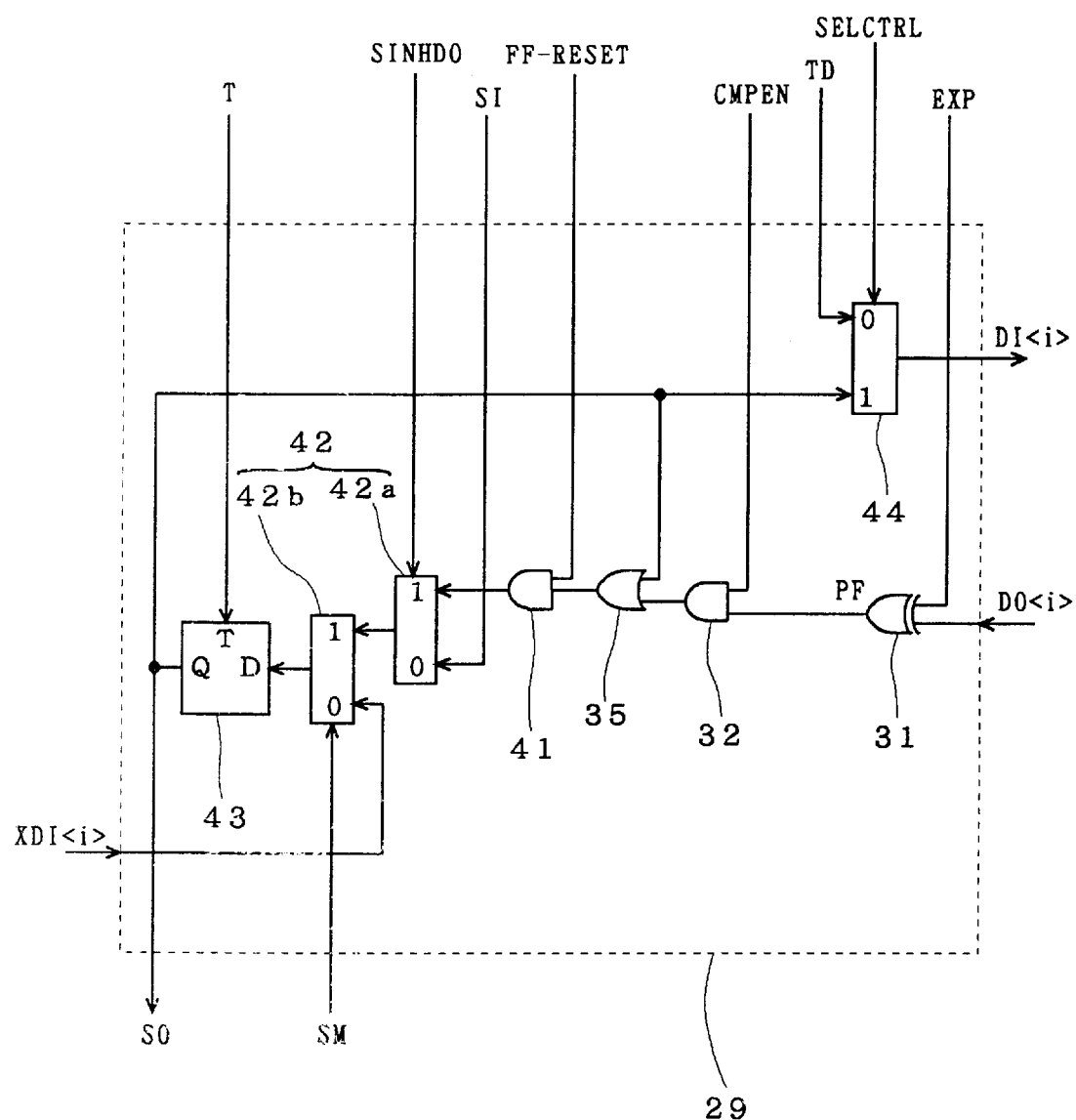
FIG. 12 is a circuit diagram showing the data control circuit of the ninth embodiment of the present invention.
Figure 13:
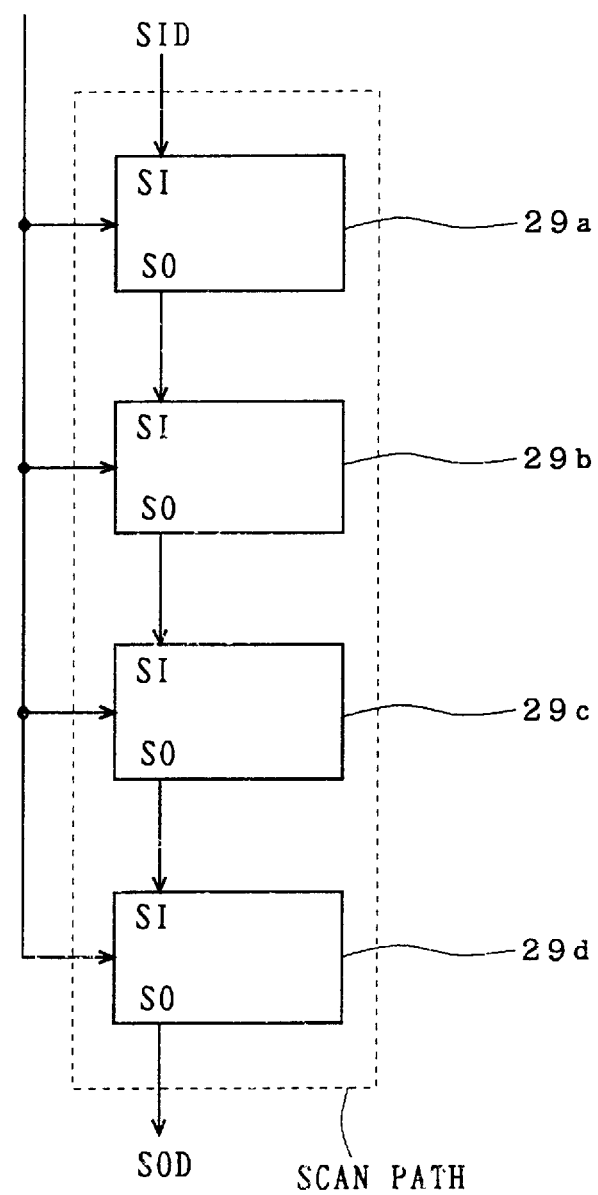
FIG. 13 is a circuit diagram showing the state in which the data control circuit of the ninth embodiment of the present invention forms a scan path.

FIG. 12 is a drawing showing the data control circuit 29 (data generating circuit for control memory cells) of the ninth embodiment of the present invention. In FIG. 12, same symbols are put to devices having the same function as in the eighth embodiment. The data control circuit 29 of this embodiment makes the flip-flop for storing output information from expected value comparing means also usable for storing write data, and a plural number of data control circuits 29 are serially connected to form a scan path as shown in FIG. 13.

Namely, each data control circuit 29 is provided with exclusive logical sum circuit 31 and logical product circuit 32 as expected value comparing means same as that explained in the eighth embodiment, one logical product circuit 41 for reset signal input connected to the output terminal of the logical product circuit 32 through one logical sum circuit 35 for data feedback, first selecting means 42 for selecting and outputting 3 different kinds of information i.e. signal from logical product circuit 41, the shift-in signal SI to be described later and write data input from write data input terminal DI<i>, one flip-flop 43 for storing the output information from first selecting means 42, and second selecting means 44 for selecting 2 different kinds of information i.e. output information from flip-flop 43 and test data from outside (write data at the time of memory test) TD.

The logical product circuit 41 is designed to perform "0" resetting to the flip-flop 43 when flip-flop 43 without resetting function is used, and has the function of outputting "0" if "0" is input as reset signal OFF-RESET, regardless of the value from the logical product circuit 35.

The first selecting means 42 is composed of 2 selectors 42a, 42b.

The "1" side input terminal of one selector 42a is connected to the output terminal of the logical product circuit 41, and shift-in signal SI is input in the "0" side input terminal. Here, the shift-in signal SI refers, in the scan path indicated in FIG. 13, to signal from outside as far as the data control circuit 29a in the frontmost stage is concerned but data given by the data control circuit adjacent relatively on the front stage side (lower bit side) in the case of the data control circuit 29b to 29d in the next stage (higher bit side) and after.

The "1" side input terminal of the other selector 42b is connected to the output terminal of the selector on one side 42a, while the "0" side input terminal is connected to the write data input terminal DI<i>.

The both selectors 42a, 42b perform selection and switching respectively based on prescribed signals SINHDO, SM from outside.

The data input terminal of the flip-flop 33 is connected to the output terminal of the selector 42b on the other side. Moreover, the data output terminal Q of the flip-flop 33 is transmitted to the second selecting means 44 and also outputs shift-out signal SO to be transmitted to the data control circuit 29 (located) relatively in the next stage.

The second selecting means 44 is composed of one selector, and test data from outside is input in the "0" side input terminal, while the "1" side input terminal is connected to the data output terminal Q of the flip-flop 43 and performs selection and switching based on select signal SELECT from outside.

Explanation on other construction will be omitted because it is the same as in the eighth embodiment.

<Actions>

Explanation will be given on the data control circuit 29 constructed as described above. In FIG. 12, in the state of signal SIHNDO="1", signal SM="1", the same control data as that of the circuit in FIG. 11 is output on Q.

In the state of signal SM="0", the write data obtained from the write data input terminal DI<i> is supplied to the data input terminal D. Therefore, during a normal operation, it is possible to set as SM="0", SELECT="1" and divert the flip-flop 46 as OFF for data input of the RAM.

In this embodiment, in which scan design is applied as shown in FIG. 13, it is possible to perform serial actions by setting as SM="1", SINHDO="0". For example, the test results can be read out easily with serial shift operation, enabling easy identification of the failing data bit.

The write data to the memory cell array 11 at the time of testing is supplied as test data TD in the state of SELECT="0".

The resetting action of the flip-flop 43 can be performed by giving clock signal T in the state of SINHDO="1", SM="1", OFF-RESET="0". However, because resetting can be made with "shift-in" of "0" by serial shift motion, it is all right to delete the reset signal OFF-RESET and the logical product circuit 41 in which to input this signal.

Moreover, it is also all right to delete the logical product circuit 41 and use a flip-flop 43 with asynchronous resetting function or synchronous resetting function.

This embodiment also makes it possible to easily relieve failure data relating to one internal bit line even without using any laser unit and reduce the manufacturing cost compared with the first prior art and the second prior art.

{Tenth embodiment}

<Construction>

Figure 14:
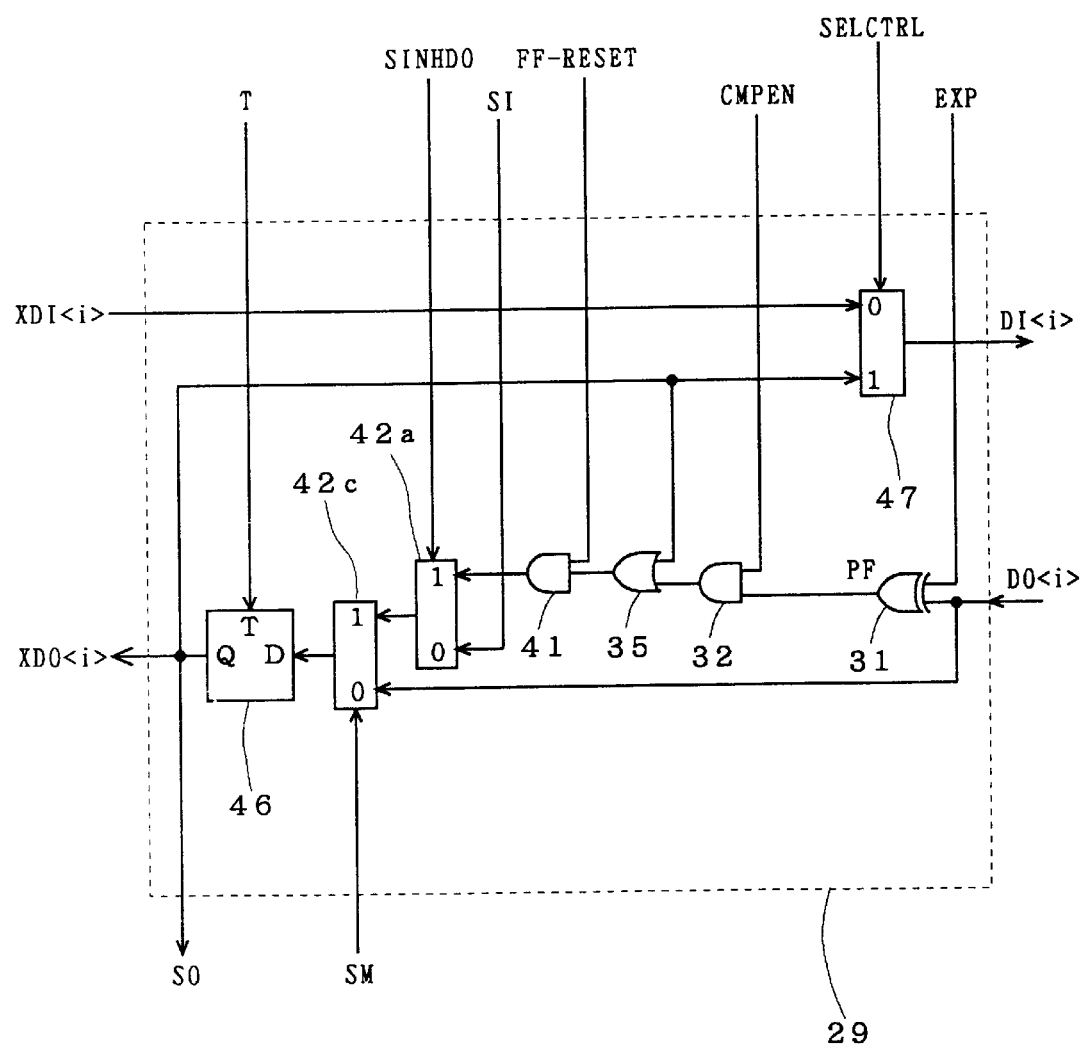
FIG. 14 is a circuit diagram showing the data control circuit of the tenth embodiment of the present invention.

FIG. 14 is a drawing showing the data control circuit 29 of memory circuit of the tenth embodiment of the present invention. The data control circuit 29 of this embodiment makes the flip-flop for storing output information from expected value comparing means also usable for storing readout data from memory circuit. It is the same as that of the ninth embodiment in that a plural number of data control circuits 29 are serially connected to form a scan path as shown in FIG. 13.

Namely, each data control circuit 29 is provided with exclusive logical sum circuit 31, logical product circuit 32, logical sum circuit 35, logical product circuit 41 and selector 42a same as those explained in the ninth embodiment, and is further provided with one selector 42c, one flip-flop 46 and one selector 47.

The selector 42c is the same as the selector 42b in the ninth embodiment in that the "1" side input terminal is connected to the selector 42a, but is different from the selector 42b in that the "0" side input terminal is connected to the data readout terminal DO<i>.

The flip-flop 46 is the same as the ninth embodiment in that the data input terminal is connected to the output terminal of the selector 42b, but is different from the ninth embodiment in that the data output terminal Q not only outputs shift-out signal SO but also takes charge of output to selector 47 and output of readout data to outside.

The "1" side input terminal of the selector 47 is connected to the data output terminal of the flip-flop 46, while the "0" side input terminal is connected to the write data input terminal DI<i>.

<Actions>

Explanation will be given on the data control circuit 29 constructed as described above. For example, in the state of SIHNDO="1", SM="1", the same output data as that of the circuit in FIG. 11 is output on the data output terminal Q regarding the flip-flop 46.

On the other hand, in the state of SM="0", the readout signal DO<i> is supplied to the data input terminal D of the flip-flop 46. Therefore, during a normal operation, it is possible to set as SM="0" and divert the flip-flop 46 as register for data output of the RAM. During a normal operation, the write data into the memory cell array 11 is given from the write data input terminal DI<i> with a setting of SELECT="0".

In this embodiment, in which scan design is applied, it is possible to perform serial actions by setting as SM="1", SINHDO="0". For example, the test results can be read out easily with serial shift operation, enabling easy identification of the failing data bit. The write data into the memory cell array 11 is supplied from the write data input terminal DI<i> in the state of SELECT="0".

The resetting action of the flip-flop 46 can be performed by giving clock signal T in the state of SINHDO="1", SM="1", OFF-RESET="0".

{Eleventh embodiment}

<Construction>

Figure 15:
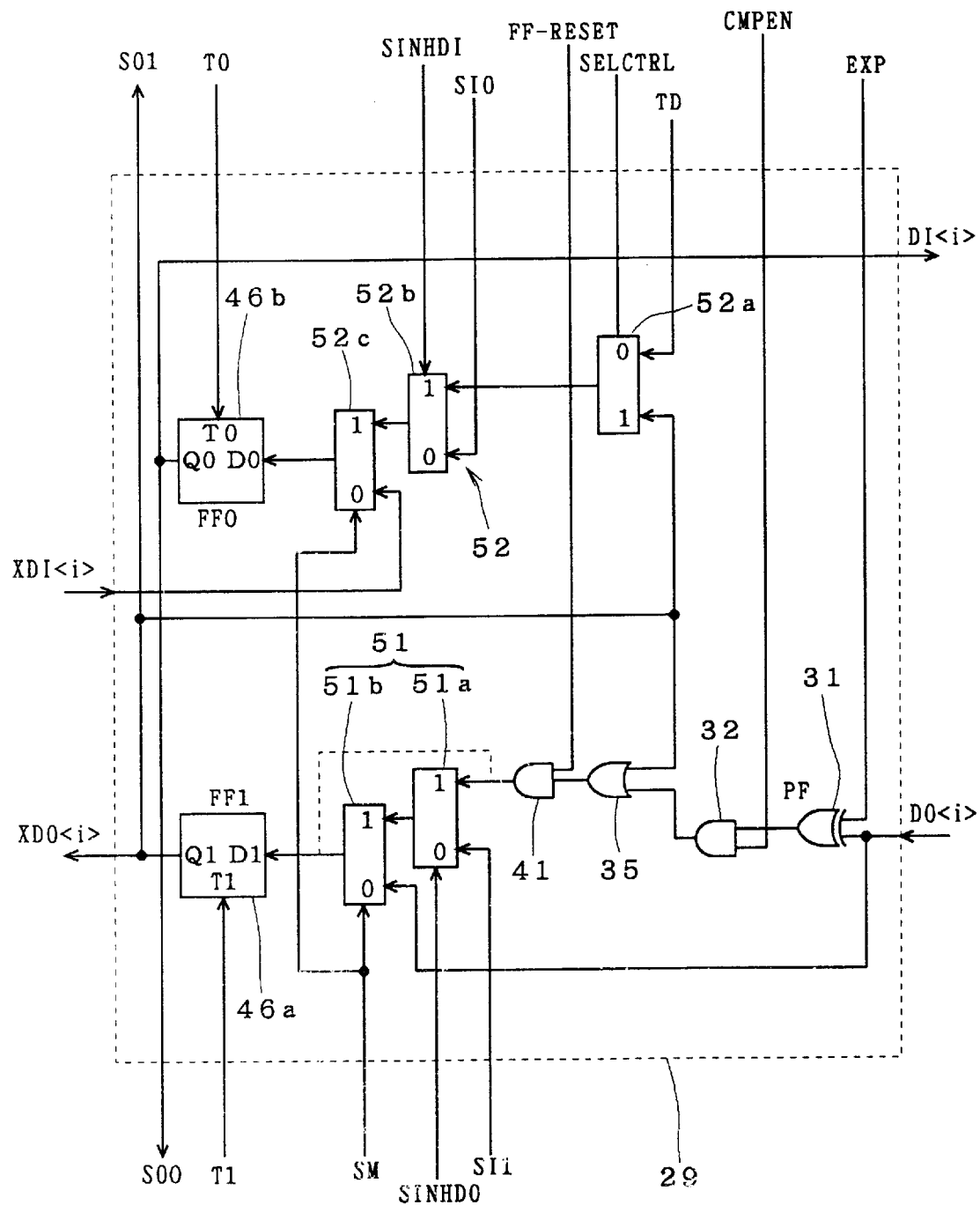
FIG. 15 is a circuit diagram showing the data control circuit of the eleventh embodiment of the present invention.

FIG. 15 is a drawing showing the data control circuit 29 of memory circuit of the eleventh embodiment of the present invention. In FIG. 15, same symbols are put to devices having the same function as in the ninth and the tenth embodiments.

The data control circuit 29 of this embodiment is provided with 2 flip-flops (registers) for storing output information from expected value comparing means to make the flip-flops usable also for storing write data and for storing readout data respectively. Moreover, a plural number of data control circuits 29 (29a to 29d) are serially connected to form a scan path as shown in FIG. 16.

Figure 16A:
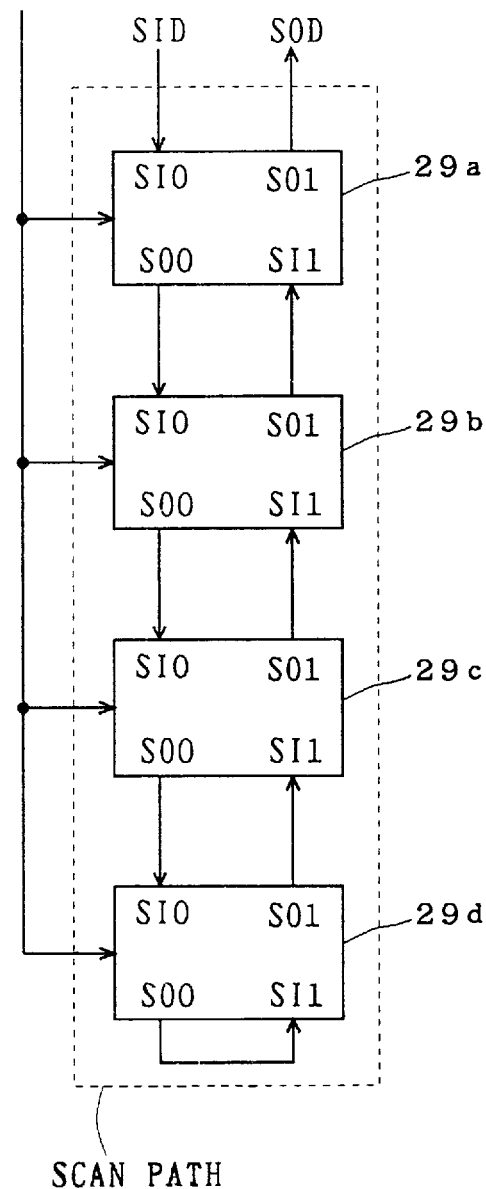
FIG. 16 is a circuit diagram showing the state in which the data control circuit of the eleventh embodiment of the present invention forms a scan path.
Figure 16B:
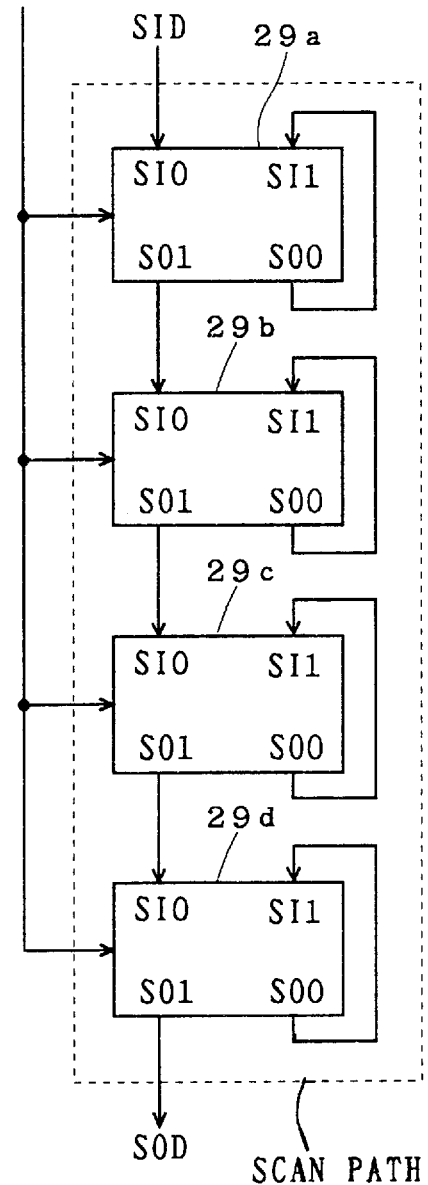

The scan path is constituted by connecting a plural number of circuits of FIG. 15 serially as shown in FIG. 16. Either of the connections in FIG. 16 (a), (b) may be used, and the scan path may be constructed in any other order. In FIG. 16 (a), the shift-in signal SI1 refers to the shift-out signal SO0 of this same data control circuit 29d as far as the data control circuit 29d on the highest bit side is concerned, but to the shift-out signal SO1 from the data control circuit adjacent relatively on the higher bit side in the case of the data control circuits 29a to 29c in the next stage (lower bit side) and after.

On the other hand, in FIG. 16 (b), the shift-in signal SI0 refers to signal SID from outside, as far as the data control circuit 29d on the lowest bit side is concerned, but to the shift-out signal SO1 from the data control circuit adjacent relatively on the lower bit side in the case of the data control circuits 29b to 29d in the next stage (higher bit side) and after. Moreover, the shift-in signal SI1 in FIG. 16 (b) refers to the shift-out signal SO0 of the same data control circuits 29a to 29d. Namely, in FIG. 16 (b), the scan path data is transmitted in the order of SI0 ~SO0~SI1~SO1, in the scan path actions of the respective data control circuits 29a to 29d.

Here, exclusive logical sum circuit 31, logical product circuit 32, logical sum circuit 35, and logical product circuit 41 are the same as those indicated in the ninth and the tenth embodiments.

And, the data control circuit 29 of this embodiment is further provided with first selecting means 51 for selecting 3 different kinds of information i.e. value for control PF given by the logical product circuit 41, shift-in signal SI1 given from other data control circuits adjacent on the lower bit side from the data control circuit 29 concerned and readout data DO<i> from memory cell array 11, first flip-flop (FF1) 46a for storing the information selected by the first selecting means 51, second selecting means 52 for selecting 4 different kinds of information i.e. output information from the first flip-flop 46a in the data control circuit 29 concerned, test data TD, shift-in signal SI0 given from other data control circuits adjacent on the lower bit side from the data control circuit 29 concerned and write data XD1 from outside to be written in memory cell array 11, and second flip-flop (FF0) 46b for storing the information selected by the second selecting means 52.

The first selecting means 51 is composed of 2 selectors 51a, 51b. In the "0" side input terminal of one selector 51a of the two, the shift-in signal SI1 (shift-out signal SO1) given from other data control circuits adjacent on the lower bit side from the data control circuit 29 concerned is input, while, in the "1" side input terminal, the value for control PF given by the logical product circuit 41 is input. Moreover, in the "0" side input terminal of the other selector 51b, the readout data DO<i> from memory cell array 11 is input, while, in the "1" side input terminal, the information selected by one selector 51a is input. The selectors 51a, 51b perform selection and switching respectively based on pre-scribed signals SINHDO, SM from outside.

In the data input terminal D1 of the first flip-flop 46a, the information selected by the other selector 51b is input, and the data output information Q1 is output on the readout data output terminal XDO<i> and the second selecting means 52 and is also output at shift-out signal SO1 to other data control circuits adjacent on the higher bit side from the data control circuit 29 concerned. T1 in FIG. 15 represents clock signal and the terminal for inputting this (clock signal).

The second selecting means 52 is composed of 3 selectors 52a to 52c. In the "0" side input terminal of the selector 52a, the test data TD given from outside is input, while, in the "1" side input terminal, the output information from the flip-flop 46a in the data control circuit 29 concerned is input. Moreover, in the "0" side input terminal of the selector 52b, the shift-in signal SI0 given from other data control circuits adjacent on the lower bit side from the data control circuit 29 concerned is input, while, in the "1" side input terminal, the information selected by the selector 52a is input. Furthermore, in the "0" side input terminal of the selector 52c, the write data DI<i> given from outside is input, while in the "1" side input terminal, the information selected by the selector 52b is input. The selectors 52a to 52c perform selection and switching respectively based on prescribed signals SELECT, SINHDI, SM from outside.

In the data input terminal D0 of the second flip-flop 46b, the information selected by the selector 52c is input, and the data output information Q0 is transmitted to the write data input terminal DI<i> of the memory circuit and is output from the data control circuit 29 concerned as shift-out signal SO0 to other data control circuits. T0 in FIG. 15 represents clock signal and the terminal for inputting this (clock signal). And, during testing and serial shifting, waveforms of one same timing are used for the both clocks T0, T1.

<Actions>

Explanation will be given on the data control circuit 29 constructed as described above. First, in the state of SINHDO="1", SM="1", control data similar to that of the circuit indicated in FIG. 11 is output at Q1. If, setting is made as SELECT="1", SINHDI="1" here, this control data is output at Q0 with a delay of one clock. After waiting until the control data is transferred to Q0, (the data control circuit 29) writes (this control data) in the control memory cells C11 to C14, and then switches the column redundancy control circuit 12 of the memory circuit.

Setting is made as SM="0" during a normal operation. In the state of SM="0", the signal of DO<i> is supplied to the first flip-flop 46a as input data D1 through the selector 51b. During a normal operation, it is possible to set as SM="0" and divert the flip-flop 46a as register for data output of the RAM. Moreover, in the state of SM "0", where the signal of DI<i> is supplied to the second flip-flop 46b as input data D0, the second flip-flop 46b is used as register for data output of the RAM.

Moreover, in this embodiment, in which scan design is applied, it is possible to perform serial actions by setting as SM="1", SINHDO="0", and SINHDI="0". For example, the test results can be read out with serial shift operation, enabling easy identification of the failing data bit.

In the circuit of FIG. 12 or that of FIG. 14, any increase in the number of data bits increases the delay of test data TD and signal SELECT and, as a result, the timing of change of signals to the write data input terminal D1<i> is determined by the number of data bits. Therefore, there was a fear of producing a necessity of different timings of light pulse for normal operation and for testing. On the contrary, in this embodiment, the write data to the memory cell array 11 during testing is supplied from outside as test data TD, in the state of SELECT="0". The design of timing is very easy because the test data TD is also made to pass through the flip-flop 46b. Namely, the input data to the write data input terminal DI<i> of the memory cell array 11 changes in synchronization with the clock T0, and this timing does not change even with any increase in the number of data bits. Therefore, there is no need of having different timings of light pulse for normal operation and for testing.

The resetting action of the flip-flop 46a can be performed by giving clock signal T1 in the state of SJNHDO="1", SM="1", OFF-RESET="0".

{Twelfth embodiment}

Figure 17:
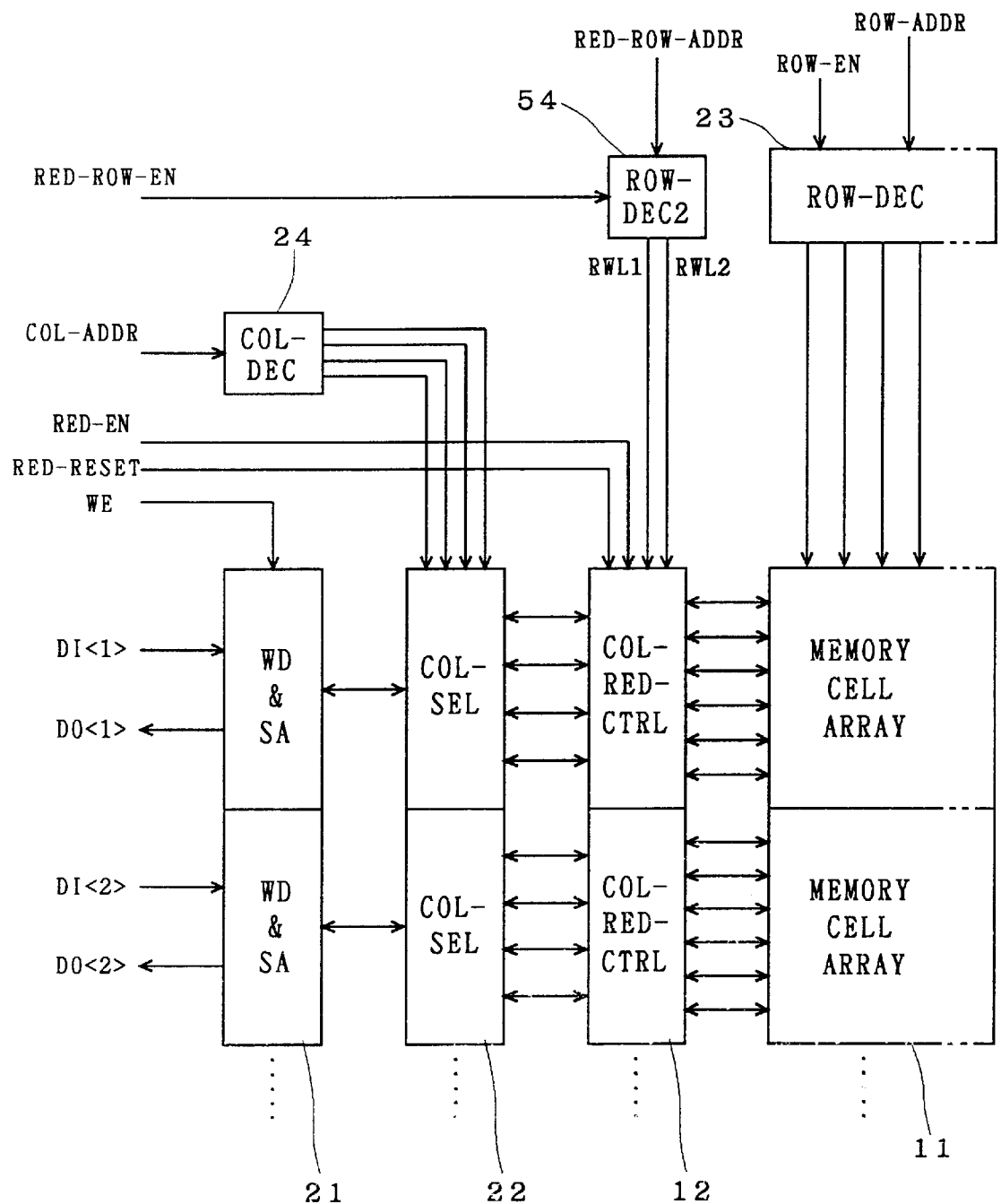
FIG. 17 is a circuit diagram showing the general construction of the memory circuit of the twelfth embodiment of the present invention.

FIG. 17 is a drawing showing the memory circuit of the twelfth embodiment. The memory circuit of this embodiment is a circuit realized by adding a special row decoder (ROW-DEC2) 54 for selecting control memory cell for the entire circuits of the memory circuit with column redundancy function indicated in FIG. 7. However, the column redundancy control circuit 12 must be of a redundancy of "2" as shown in FIG. 4.

The row decoder 54 selects and activates either one of 2 word lines RWL1, RWL1, depending on the address signal RED-ROW-ADDR from outside. However, in the case where the enable signal RED-ROW-EN is not active, neither of the 2 word lines RWL1, RWL1 can be activated.

In this embodiment, supplementation of the row decoder 54 facilitates the selection of control memory cell with the address signal RED-ROW-ADDR and also facilitates application of data control circuit 29 adapted to the column redundancy of "2" in the thirteenth embodiment (FIG. 18), etc. to be described later.

{Thirteenth embodiment}

<Construction>

Figure 18:
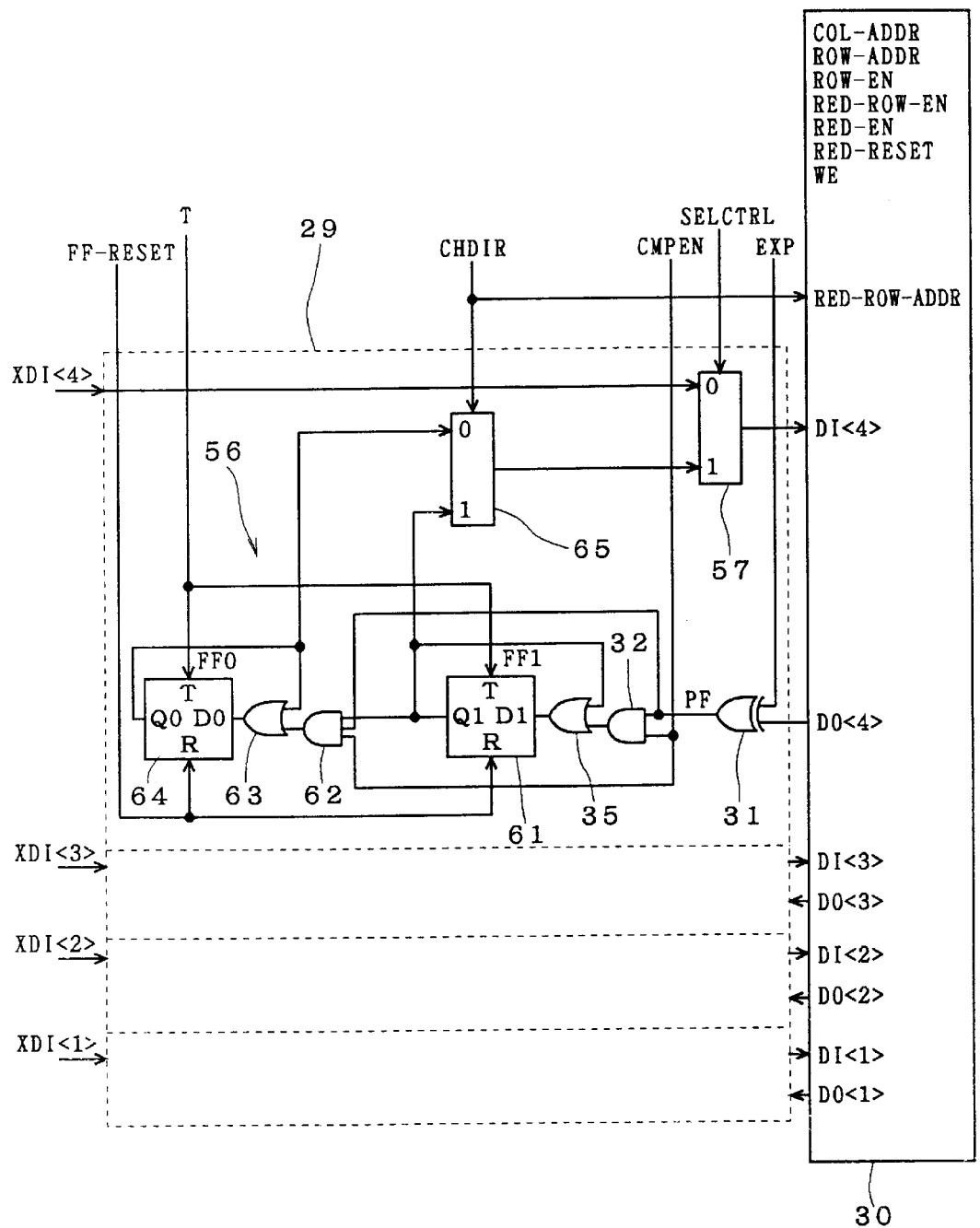
FIG. 18 is a circuit diagram showing the data control circuit of the thirteenth embodiment of the present invention.

FIG. 18 is a drawing showing the data control circuit 29 of the memory circuit of the thirteenth embodiment of the present invention. The data control circuit 29 of this embodiment is a data generating circuit for control memory cell having a column redundancy control circuit 12 with a redundancy of "2" as shown in the twelfth embodiment indicated in FIG. 17.

The row redundancy address terminal RED-ROW-ADDR of the memory circuit 30 receives a supply of signal CHDIR from outside. As a result, one word line RWL1 in FIG. 17 is selected in the case of CHDIR="1". On the other hand, the other word line RWL1 is selected in the case of CHDIR="0". Such is the way the memory circuit 30 is constructed.

The data control circuit 29 of this embodiment is further provided, in addition to exclusive logical sum circuit 31, logical product circuit 32 and logical sum circuit 35 constituting expected value comparing means in the same way as in the respective embodiments explained earlier, with control data generating means 56 for generating control data for memory circuit 30 based on the value for control PF generated by the exclusive logical sum circuit 31 and first selector 57 for selecting and outputting the control data output from the control data generating means 56 and the write data DI<i> given from outside.

The control data generating means 56 outputs the first value (0, 0) to the group of control memory cells 17 of the column redundancy control circuit 12 indicated in FIG. 4 when the expected value comparing means (31, 32) obtained a result that the readout data DO<1> to DO<4> from the memory cell array 11 is identical with the prescribed expected value signal EXP., outputs the second value (0, 1) to the group of control memory cells 17 when the expected value comparing means (31, 32) obtained for the first time a result that the readout data DO<1> to DO<4> from the memory cell array 11 disagrees with the prescribed expected value EXP., and outputs the third value (1, 0) to the group of control memory cells 17 when the expected value comparing means (31, 32) obtained for the second time a result that the readout data DO<1> to DO<4> from the memory cell array 11 disagrees with the prescribed expected value EXP.

To be concrete, the control data generating means 56 is provided with first flip-flop (FF1: first register) 61 for storing output information from the expected value comparing means (31, 32), second flip-flop (FF0: second register) 64 for storing output information from the first flip-flop 61 through one logical product (AND) circuit 62 (disagreeing value output means) and one logical sum (OR) circuit 63, and second selector 65 for selecting and outputting output information from the first flip-flop 61 and the second flip-flop 64.

The first flip-flop 61 is of a type provided with resetting function in which "0" is stored in advance as initial value, and the value stored in the first flip-flop 61 changes from "0" to "1" when the expected value comparing means (31, 32) obtained for the first time a result that the readout data DO<1> to DO<4> from the memory cell array 11 disagrees with the prescribed expected value EXP.

The logical product circuit 62 outputs "0" only when it obtained a result that both the value stored in the first flip-flop 61 and the readout data DO<1> to DO<4> from the memory cell array 11 disagree with the prescribed expected value EXP. The logical product circuit 62 is of 3-input type, and compare enable signal CM PEN is input in the remaining 1 input terminal.

The logical sum circuit 63 is used for data feedback regarding the second flip-flop 64, in the same way as the logical sum circuit 35 for the first flip-flop 61.

The second flip-flop 64 is of a type provided with resetting function in which "0" is stored in advance as initial value, and the value stored in the first flip-flop 61 changes from "0" to "1" as the output from the logical product circuit 62 changes from "0" to "1", when the expected value comparing means (31, 32) obtained for the second time a result that the readout data DO<1> to DO<4> from the memory cell array 11 disagrees with the prescribed expected value EXP. The first flip-flop 61 and the second flip-flop 64 are driven by clock signal T from outside and are reset with reset signal OFF-RESET from outside.

The second selector 65 is for performing selection and switching with a signal CHDIR from outside, and its "0" side input terminal is connected to the output terminal Q0 of the second flip-flop 64, while the "1" side input terminal is connected to the output terminal Q1 of the first flip-flop 61.

The first selector 57 is for performing selection and switching with a signal SELECT from outside, and its "0" side input terminal is connected to external write data input terminals DI<1> to DI<4> while the "1" side input terminal is connected to the output terminal of the second selector 65.

<Actions>

The actions of the data control circuit 29 constructed as above will be explained with reference to FIG. 4 and FIG. 17. Here, the explanation will be given on the supposition of a failure of the internal bit line BL2 and the internal bit line BL3 in FIG. 4.

When (the data control circuit 29) is used with CHDIR fixed at "1", it can relieve the failure of one bit line. However, in the case where relieving is impossible with actions fixed at CHDIR="1" i.e. in the case of a failure regarding 2 word lines RWL1, RWL1, the relieving is made with the actions described hereafter.

Because supposition is made of failure such as short-circuiting or breaking of bit line, only the memory cell array 11 farthest from the selectors SEL1 to SEL4 of FIG. 4 is tested. For example, only M13 is tested for BL1 of FIG. 4. Therefore, the test is performed by fixing the value of the row address signal ROW-ADDR.

First, in FIG. 4, the control memory cells C11 to C14, C21 to C24 are reset with reset signal RED-RESET. Moreover, in FIG. 18, the first flip-flop 61 and the second flip-flop 64 are both reset to "0" with reset signal RED-RESET.

Next, in the state of CHDIR="0", (the data control circuit 29) controls various signals such as expected value signal EXP., compare enable signal CM PEN, other prescribed signals such as WE, SELECT, etc. in FIG. 4 properly to test the farthest memory cell M34 among those connected to the internal bit line BL4. The write data to the memory cell array 11 during the testing is given from the write data input terminal DI<i> in the state of SELECT="0".

And, in FIG. 18, the exclusive logical sum circuit 31 compares the expected value signal EXP. And the readout data DO<i> and, when it detected that they are different for the first time, outputs "1" as value for control PF. If, in this state, clock T is given when the compare enable signal CM PEN is "1", "1" is set in the first flip-flop 61 and its output data Q1 becomes "1". Namely, if the first failure is detected, the output Q1 of the first flip-flop 61 changes from "0" to "1".

If clock T is given in the state where the output Q1 of the first flip-flop 61 is "1", the value for control PF is "1" and the compare enable signal CM PEN is "1", "1" is set in the second flip-flop 64 and its output data Q0 becomes "1". Namely, if the second failure is detected, the output Q0 of the second flip-flop 64 changes from "0" to "1".

And, the second selector 65 selects the output of the second flip-flop 64 when the signal CHDIR is "0" but the output of the first flip-flop 61 when the signal CHDIR is "1" and, in the state of SELECT="1", writes control data in the corresponding control memory cell C24 in FIG. 4.

In this way, (the data control circuit 29) makes similar actions by switching the object of bit lines in order as BL3, BL2, BL1 i.e. by switching the control memory cells C23, C22, C21 of the group of control memory cells 17 in order.

With the above actions, "1", "1", "0", "0" are written in the control memory cells C21 to C24 of the group of control memory cells 17 if 2 memory cells M33, M32 are judged defective. In this stage, the first external bit line OBL1 is connected to the "0"th internal bit line BL0, the second external bit line OBL2 is connected to the first internal bit line BL1, the third external bit line OBL3 is connected to the third internal bit line BL3, the fourth external bit line OBL4 is connected to the fourth internal bit line BL4 respectively and, therefore, only the failure of the second internal bit line BL2 of the 2 internal bit lines is relieved.

Next, the first flip-flop 61 in FIG. 18 is reset. In the state of CHDIR="1", (the data control circuit 29) controls various signals such as expected value signal EXP., compare enable signal CM PEN, other prescribed signals such as WE, SELECT, etc. properly to test the memory cell M30 connected to the external bit line OBL1. And, in the state of SELECT="1", (the data control circuit 29) writes control data in the corresponding memory cell C11. In this way, (the data control circuit 29) makes similar actions by switching the object of bit lines in order as OBL2, OBL3, OBL4 i.e. by switching the control memory cells C12, C13, C14 in order.

With the above actions, the control data changes to "1" after the memory cell M33 is judged defective. As a result, "0", "0", "1", "1" are written in C11 to C14.

In this stage, the first external bit line OBL1 is connected to the "0"th internal bit line BL0, the second external bit line OBL2 is connected to the first internal bit line BL1, the third external bit line OBL3 is connected to the fourth internal bit line BL4, the fourth external bit line OBL4 is connected to the fifth internal bit line BL5 respectively and the failure of both BL2 and BL3 is relieved.

{Fourteenth embodiment}

Figure 19:
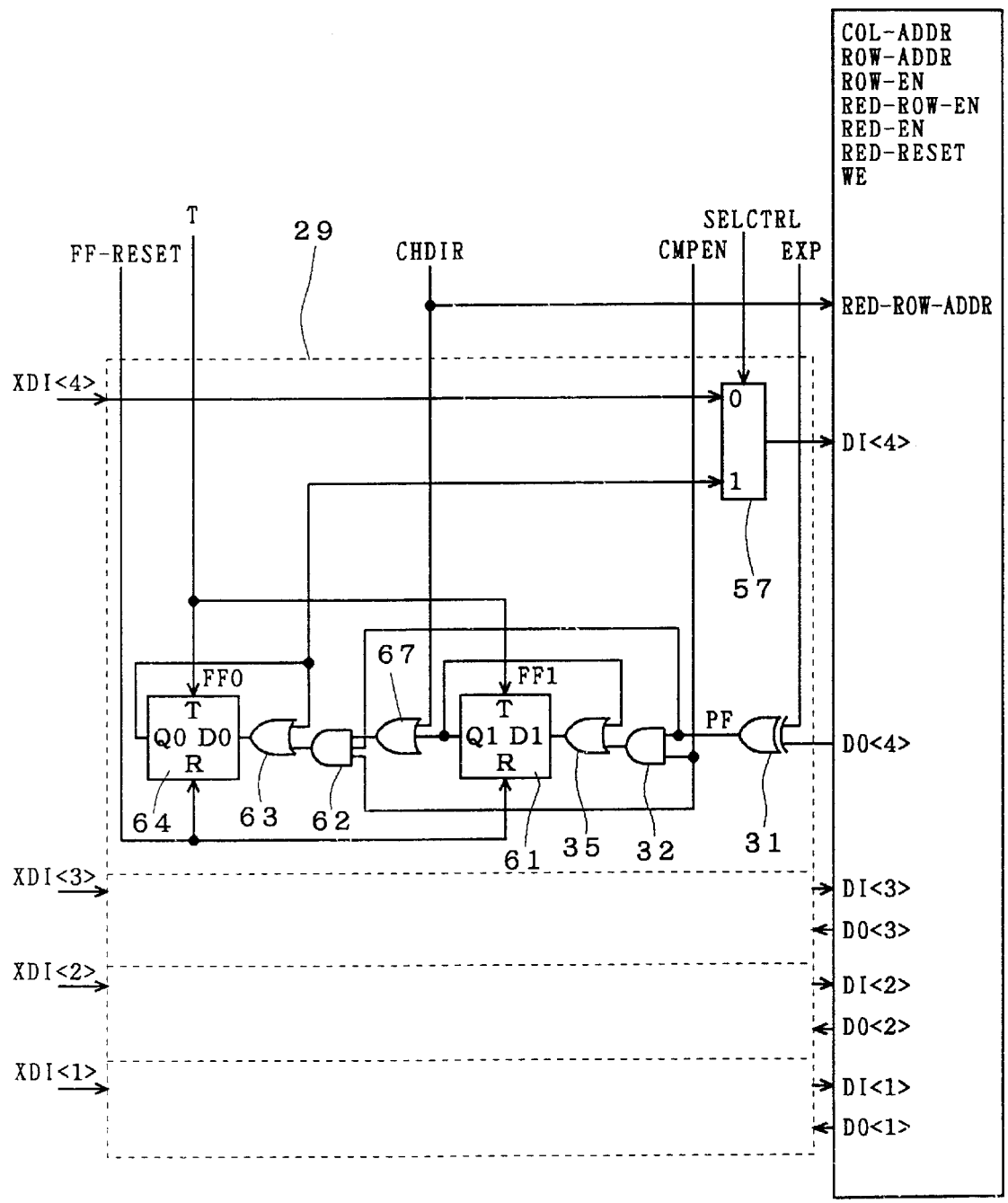
FIG. 19 is a circuit diagram showing the data control circuit of the fourteenth embodiment of the present invention.

FIG. 19 is a drawing showing the data control circuit 29 of the memory circuit of the fourteenth embodiment of the present invention. The data control circuit 29 of this embodiment has the same function as that explained in the thirteen embodiment in FIG. 18 but uses one logical sum (OR) circuit 67 instead of the selector controlled with external signal CHDIR so as to detect the first failure with both the first flip-flop (FF1) 61 and the second flip-flop (FF0) 64 by putting CHDIR as "1". In this embodiment, the scale of circuit becomes smaller compared with that of FIG. 18.

{Fifteenth embodiments}

<Construction>

Figure 20:
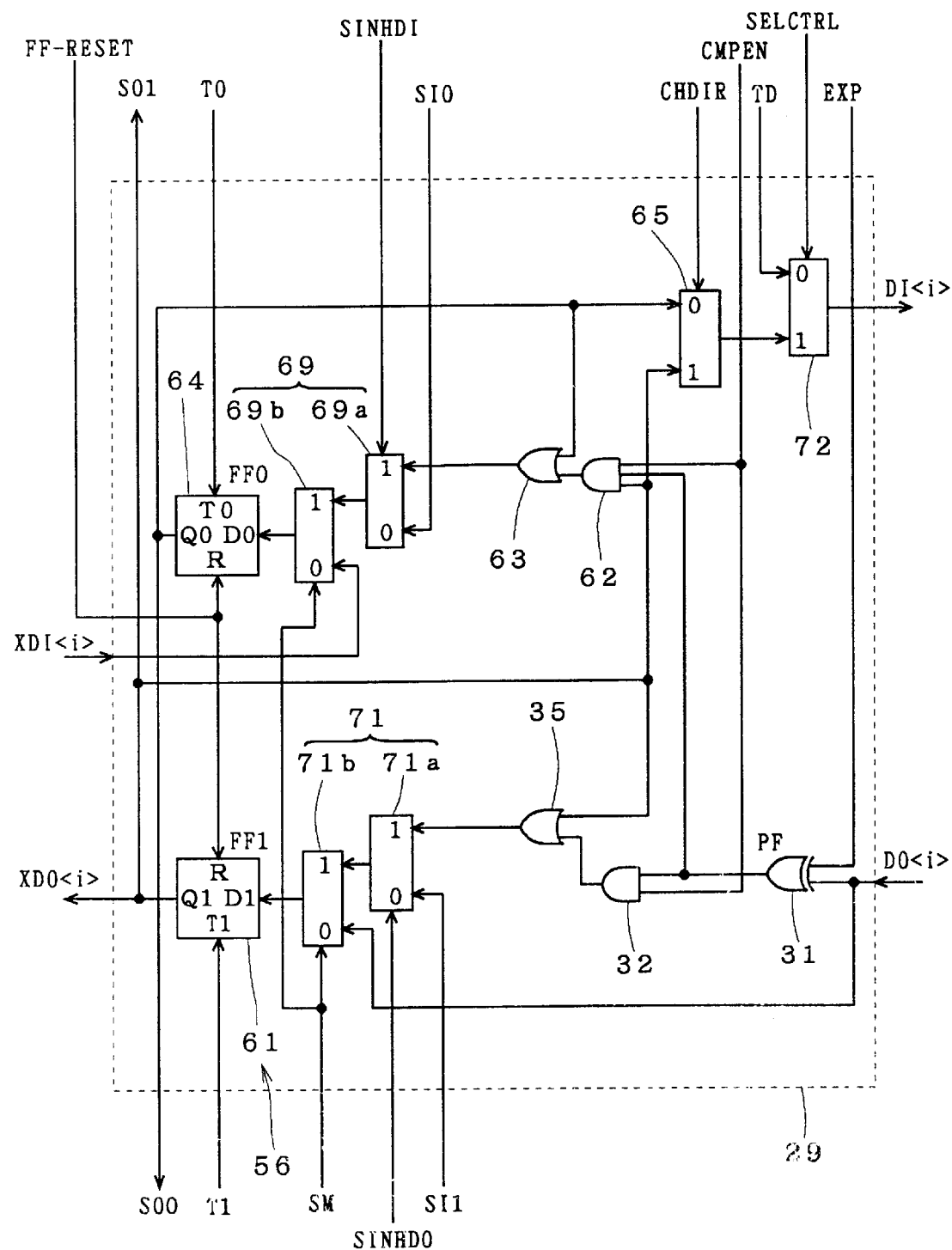
FIG. 20 is a circuit diagram showing the data control circuit of the fifteenth embodiment of the present invention.

FIG. 20 is a drawing showing the data control circuit 29 of the memory circuit of the fifteenth embodiment of the present invention. In FIG. 20, same symbols are put to devices having the same function as in the fifteenth (thirteenth?) embodiment. The data control circuit 29 of this embodiment is realized by constructing the data control circuit indicated in FIG. 18 in the form of scan register as the data control circuit shown in FIG. 16 (*a*), (*b*). The connection of FIG. 16 (*a*) or (*b*) may be used, and the scan path may be constructed in whatever order.

Here, exclusive logical sum circuit 31, logical product circuit 32, logical sum circuit 35, logical product circuit 62, logical sum circuit 63 and selector 65 in FIG. 20 are the same as those indicated in the thirteenth embodiment in FIG. 18.

Moreover, while in the thirteenth embodiment the first selector 57 for selecting and outputting the control data to be given to the group of memory cells 17 of the memory circuit and the write data DI<i> given from outside was disposed between the second selector 65 and the write data input terminal DI<i>, selecting means 69 disposed between the logical product circuit 63 and the second flip-flop 64 is provided in place of the first selector 57 of the thirteenth embodiment, in this embodiment. Here, the selecting means 69 is composed of 2 selectors 69*a*, 69*b*, and one selector 69*a* is switched and controlled with signal SINHDI from outside, its "1" side input terminal is connected to the output terminal of the logical product circuit 63 and, in the "0" side input terminal, shift-in signal SIO given from the adjacent data control circuit 29 is input. The other selector 69*b* is switched and controlled with signal SM from outside, its "0" side input terminal is connected to the write data input terminal DI<i>, while the "1" side input terminal is connected to the output terminal of the selector 69*a*.

Moreover, between the logical sum circuit 35 and the first flip-flop 61, selecting means 71 for selecting shift-in signal SI1 from the adjacent data control circuit 29, readout data DO<i> of memory circuit and value for control PF given by the logical sum circuit 35 is provided. The selecting means 71 is composed of 2 selectors 71*a*, 71*b*, and one selector 71*a* is switched and controlled with signal SINHDO from outside, its "1" side input terminal is connected to the output terminal of the logical sum circuit 35 and, in the "0" side input terminal, shift-in signal SI1 given from the adjacent data control circuit 29 is input. The other selector 71*b* is switched and controlled with signal SM from outside, and readout data DO<i> is input in its "0" side input terminal, while the "1" side input terminal is connected to the output terminal of the selector 71*a*.

And, the data control circuit 29 of this embodiment is provided with a selector 72 for selecting and controlling output information from selector 65 and test data TD from outside with signal SELECT.

Moreover, the first flip-flop 61 and the second flip-flop 64 of this embodiment have about the same functions as those in the thirteenth, but are provided with resetting function i.e. reset signal OFF-RESET is input in the reset terminal R. For the resetting, setting is made as SM="1", SINHDI="1", SINHDO="1", OFF-RESET="0" and clocks T0, T1 are given.

Figure 21:
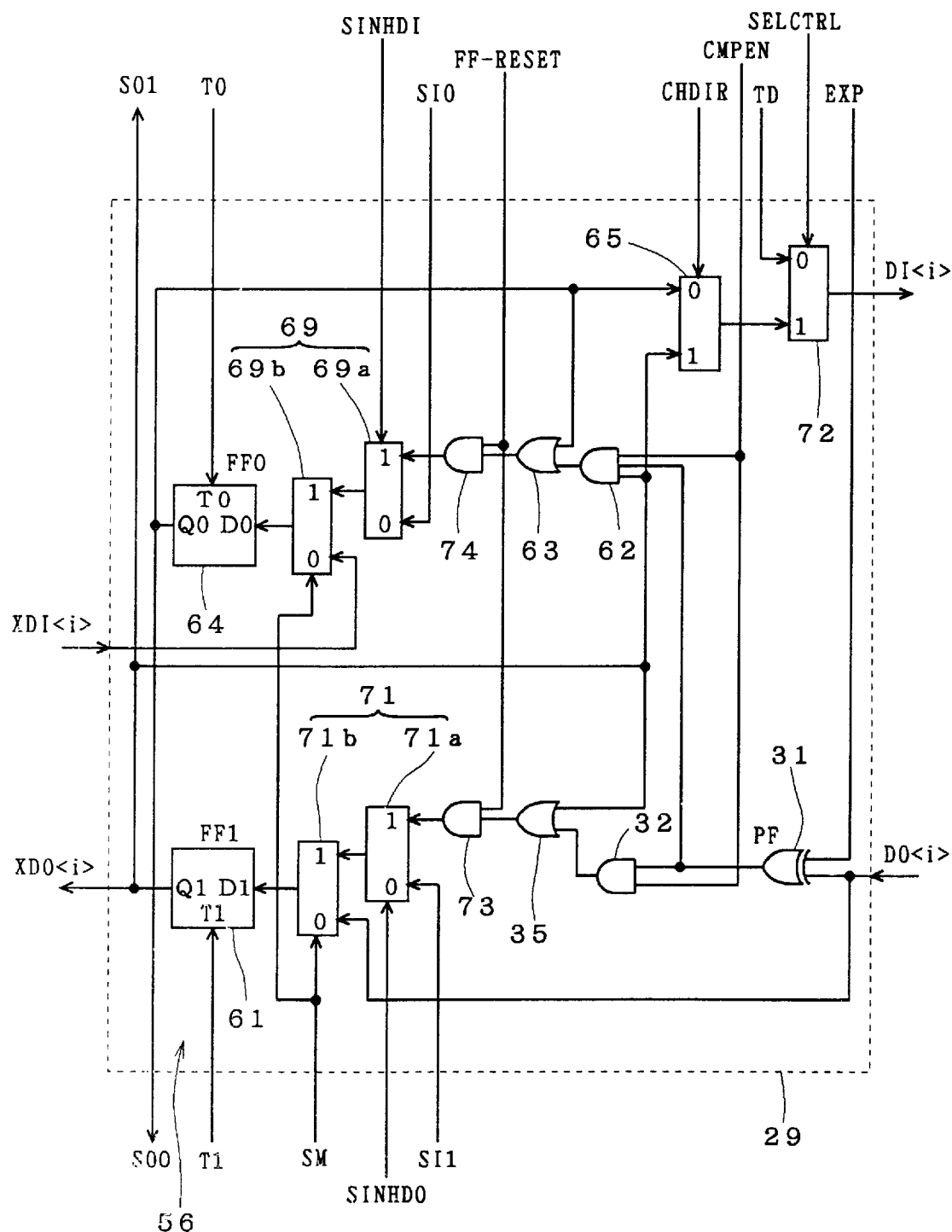
FIG. 21 is a circuit diagram showing the data control circuit of the sixteenth embodiment of the present invention.

When using flip-flops without resetting function as first flip-flop 61 and second flip-flop 64, those indicated in FIG. 21 may be used as variation of this embodiment. Here, it will be all right to insert logical product (AND) circuits 73, 74 in the storing loops constituted with first flip-flop 61 ~ logical sum circuit 35 ~ selecting means 71, and second flip-flop 64 ~ logical product circuit 63 ~ selecting means 69, respectively, and perform synchronous resetting.

<Actions>

Explanation will be given on the actions of the data control circuit 29 indicated in FIG. 20 and FIG. 21. First, in the state of setting of SM="1", SINHDI="1", SINHDO="1", the data control circuit 29 makes the same actions as those of the data control circuit 29 of the thirteenth embodiment indicated in FIG. 18.

On the other hand, during a normal operation, it becomes possible to use the first flip-flop 61 for data output to readout data output terminal XDO<i> and the second flip-flop 64 for data input from write data input terminal DI<i>, by setting as SM="0", CHDIR="0", SELECT="1". This makes it possible to construct a RAM of synchronous type against data.

Moreover, (the data control circuit 29) performs shift operations by setting as SM="1", SINHDO="0", SINHDI= "0" and giving clock signals T0, T1 of waveforms of one same timing.

{Sixteenth embodiment}

<Construction>

Figure 22:
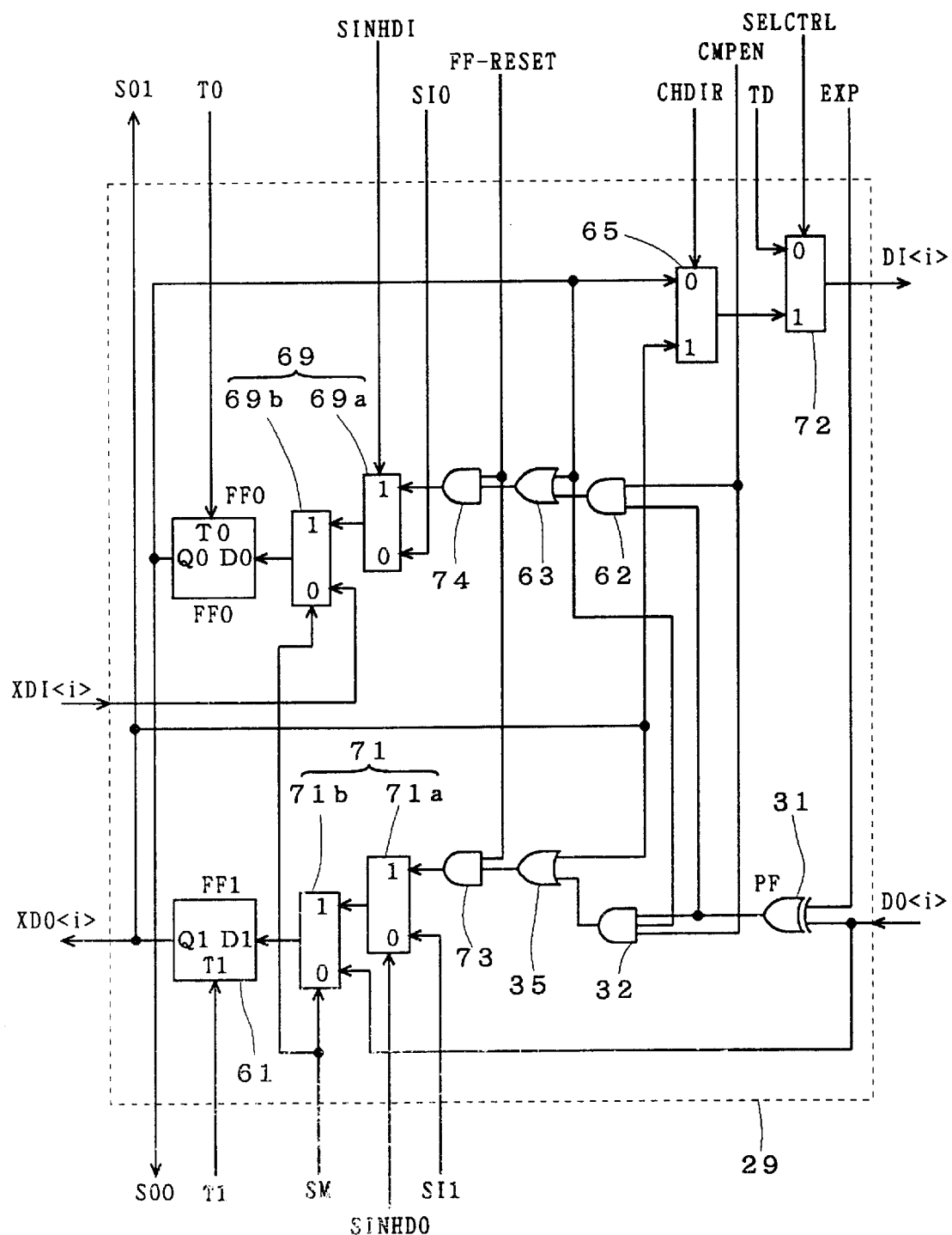
FIG. 22 is a circuit diagram showing the data control circuit of the sixteenth embodiment of the present invention.

FIG. 22 is a drawing showing the data control circuit 29 of the memory circuit of the sixteenth embodiment of the present invention. In FIG. 22, same symbols are put to devices having the same function as in the thirteenth embodiment (especially FIG. 21). The data control circuit 29 of this embodiment indicated in FIG. 22 is a variation of the circuit of FIG. 21, in which the tributary relation of the first flip-flop 61 and the second flip-flop 64 is set opposite to that of the circuit in FIG. 21. Therefore, the data output Q0 of the second flip-flop 64 is given not only to the "1" side input terminal of the selector 65 but also to the logical product circuit 32 constituting comparing means, while the data output Q1 of the first flip-flop 61 is given to the "0" side input terminal of the second selector without being given to the logical product circuit 62.

<Actions>

Explanation will be given on the actions of the data control circuit 29 constructed as described above. First, the second flip-flop 64 detects the first failure, and the first flip-flop 61 detects the second failure.

In the state where setting is made as SM="1", SINHDI= "1", SINHDO="1", (the data control circuit 29) makes the same actions as those of the data generating circuit for redundancy control of FIG. 18.

Moreover, during a normal operation, it becomes possible to use the first flip-flop 61 for data output to readout data output terminal XDO<i> and the second flip-flop 64 for data input from write data input terminal DI<i>, by setting as SM="0", CHDIR="1", SELECT="1". This makes it possible to construct a RAM of synchronous type against data.

Furthermore, it is all right to perform shift operations by setting as SM="1", SINHDO="0", SINHDI="0" and giving clock signals T0, T1 of waveforms of one same timing.

{Seventeenth embodiment}

<Construction>

Figure 23:
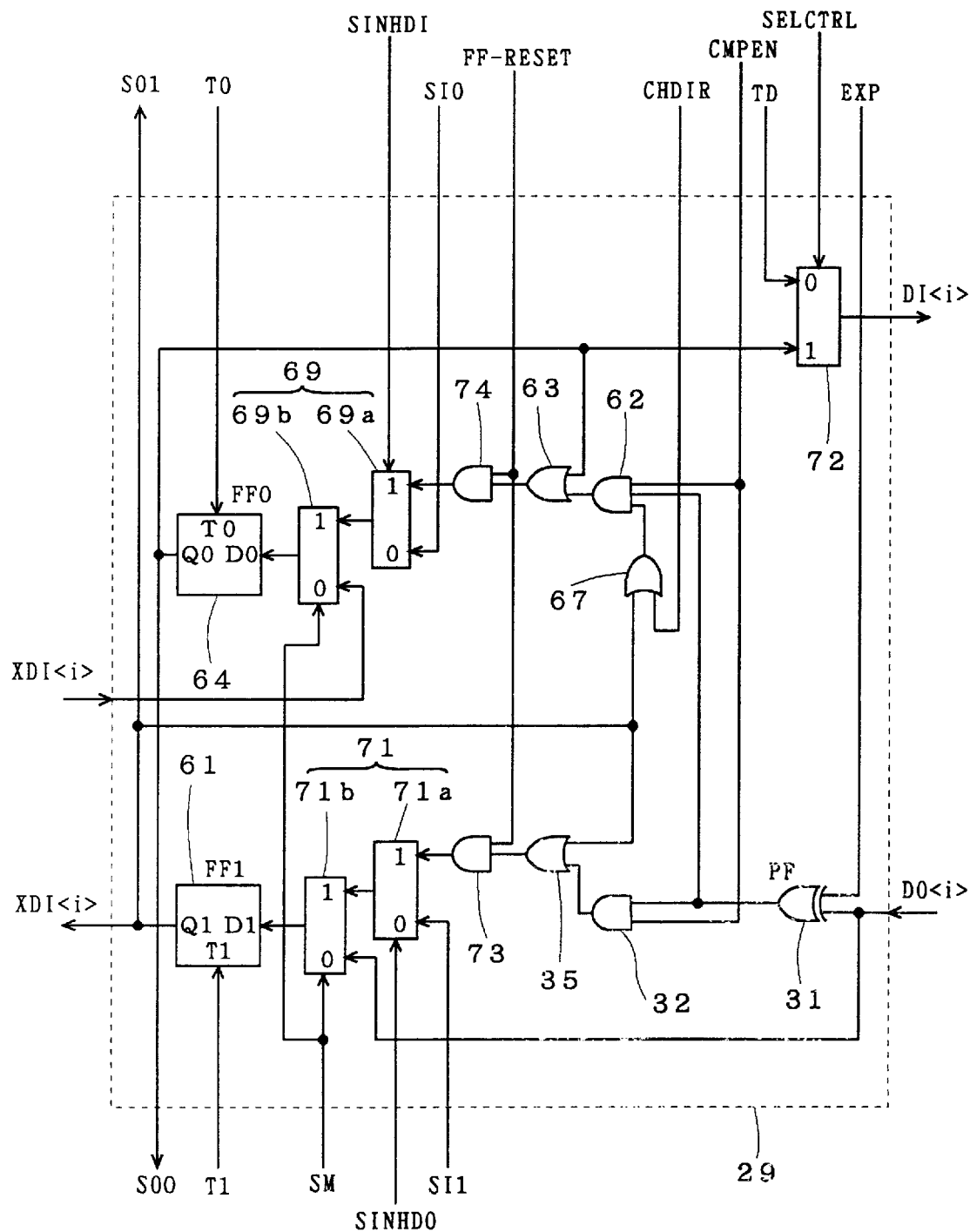
FIG. 23 is a circuit diagram showing the data control circuit of the seventeenth embodiment of the present invention.

FIG. 23 is a drawing showing the data control circuit 29 of the memory circuit of the seventeenth embodiment of the present invention. In FIG. 23, same symbols are put to devices having the same function as in the fourteenth embodiment. The data control circuit 29 of this embodiment is realized by constructing the data control circuit 29 of the fourteenth embodiment indicated in FIG. 19 in the form of scan register.

To be concrete, (the data control circuit 29) is provided with exclusive logical sum circuit 31, logical product circuit 32, logical sum circuit 35, first flip-flop 61, logical product circuit 62 and second flip-flop 64 same as those explained in the fourteenth embodiment, and further provided with selecting means 69 (69a, 69b), 71 (71a, 71b), selectors 72 and logical product circuits 73, 74 same as those in FIG. 21 and FIG. 22.

The scan path in this embodiment is constructed by serially connecting a plural number of the circuit of FIG. 23 as shown in FIG. 16. The connection of either FIG. 16 (a) or (b) may be used, and the scan path may be constructed in whatever order. CHDIR signal is also connected commonly to the respective data control circuits 29.

<Actions>

Explanation will be given on the actions of the data control circuit 29 constructed as described above. First, in the state where setting is made as SM="1", SINHDI="1", SINHDO="1", (the data control circuit 29) makes the same actions as the data generating circuit for redundancy control of FIG. 18.

Moreover, during a normal operation, it becomes possible to use the first flip-flop 61 for data output to readout data output terminal XDO<i> and the second flip-flop 64 for data input from write data input terminal DI<i>, by setting as SM="0", SELECT="1". This makes it possible to construct a RAM of synchronous type against data.

Furthermore, (the data control circuit 29) performs shift operations by setting as SM="1", SINHDO="0", SINHDI= "0" and giving clock signals T0, T1 of waveforms of one same timing.

The write data at the time of testing is given from outside as test data TD in the state of SELECT="0".

In this embodiment, it is possible to reduce the circuit size by using a logical sum circuit 67 of simple construction in place of the selector 65 used in FIG. 21 and FIG. 22.

{Eighteenth embodiment}

<Construction>

Figure 24:
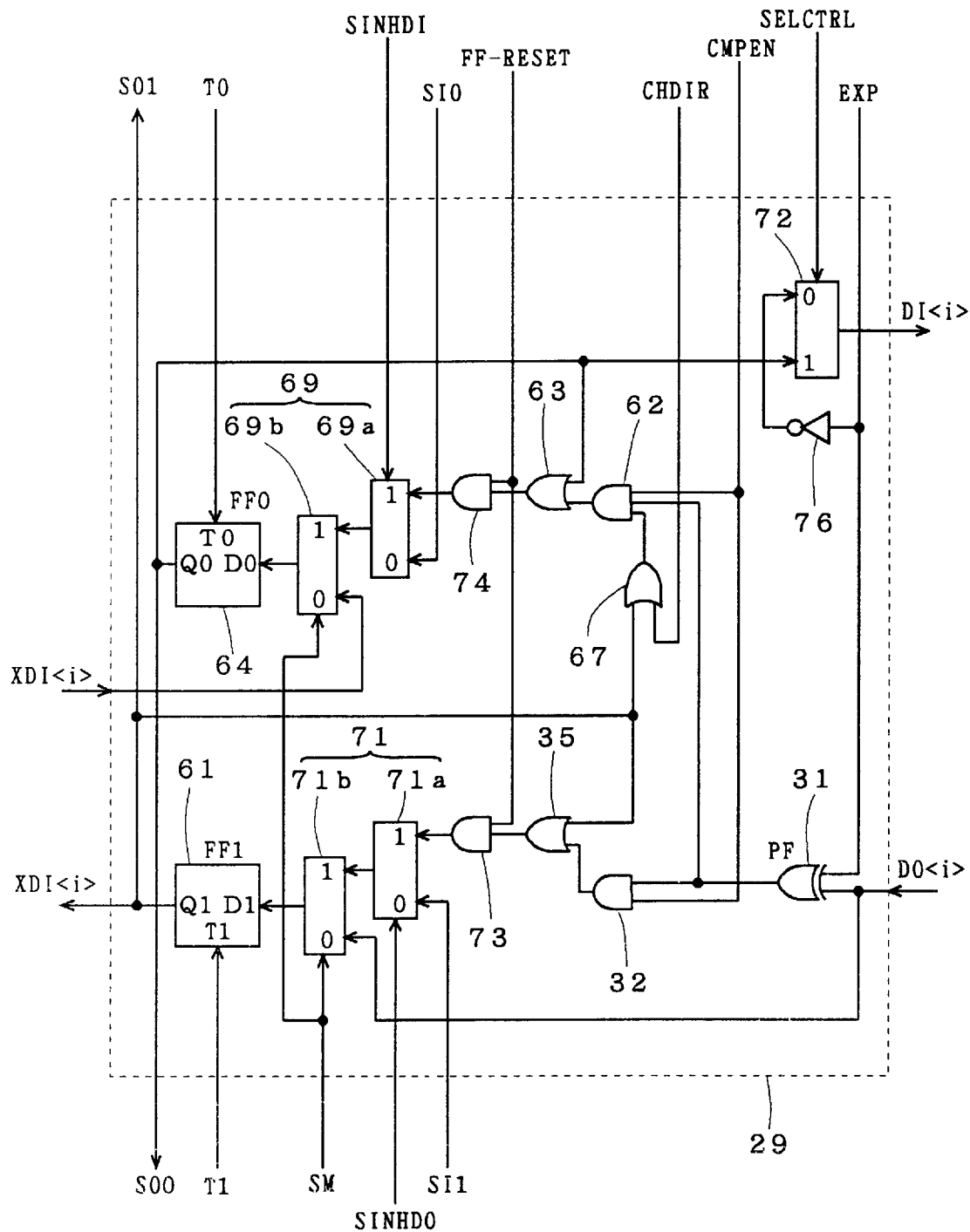
FIG. 24 is a circuit diagram showing the data control circuit of the eighteenth embodiment of the present invention.

FIG. 24 is a drawing showing the data control circuit 29 of the memory circuit of the eighteenth embodiment of the present invention. In FIG. 24, same symbols are put to devices having the same function as in the seventeenth embodiment indicated in FIG. 23. The data control circuit 29 of this embodiment is constructed in a way to use reversed signal of expected value signal EXP. as test data, by omitting the terminal (TD terminal) for giving write data (test data TD) at the time of testing (SELECT="0") from outside and providing an inverter 76 between the input terminal of expected value signal (EXP. terminal) and the "0" side input terminal of the selector 72. Needless to say, use of reversed signal of expected value signal EXP. Is not absolutely necessary, and non reversed signal is also usable. In this case, it is all right to connect the EXP. terminal to the "0" side input terminal of the selector 72 directly by omitting the inverter 76 of FIG. 24. Such omission of terminal for test data TD is also applicable to the circuits of FIGS. 20, 21 and 22.

{Nineteenth embodiment}

Figure 25:
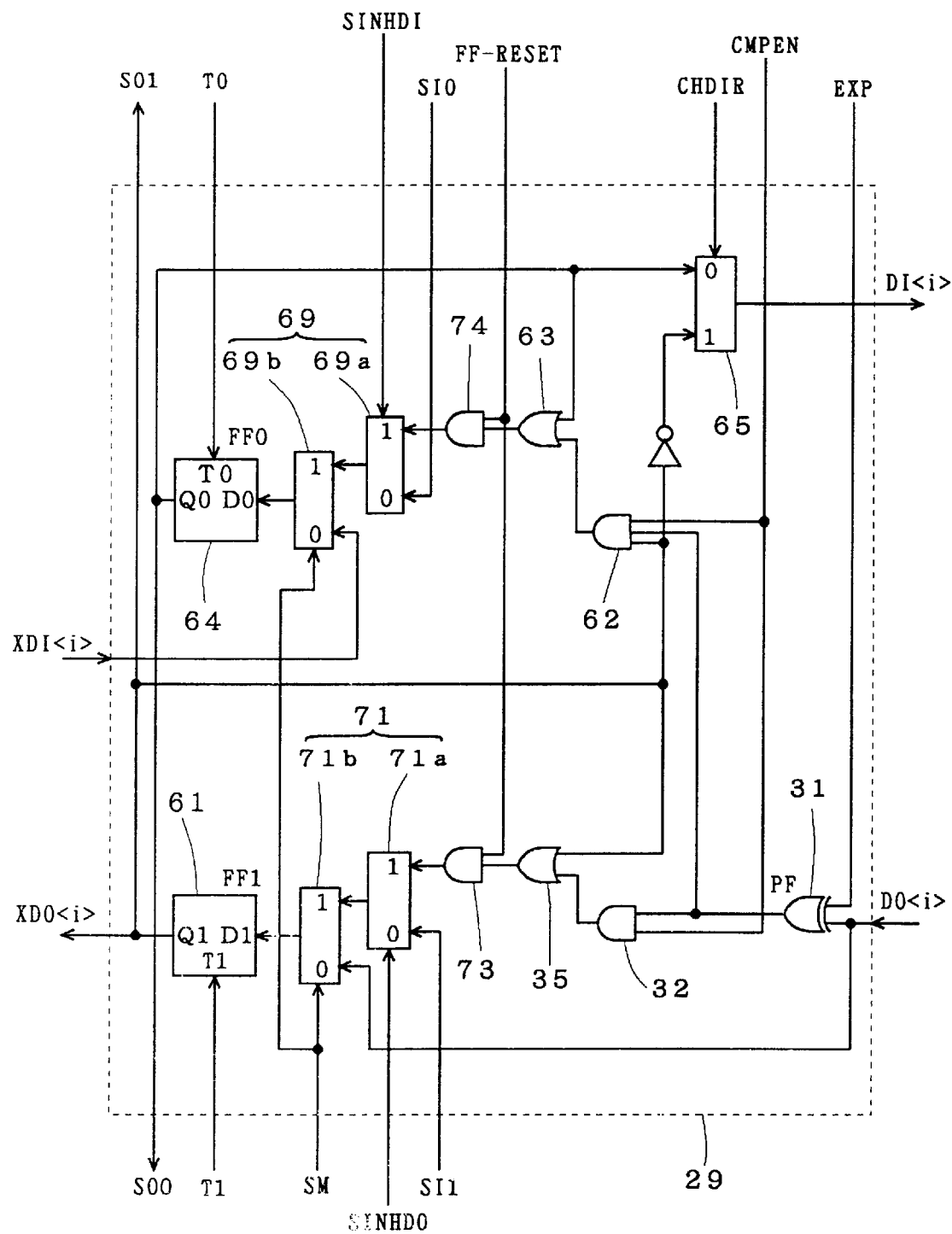
FIG. 25 is a circuit diagram showing the data control circuit of the nineteenth embodiment of the present invention.

FIG. 25 is a drawing showing the data control circuit 29 of the memory circuit of the nineteenth embodiment of the present invention. In FIG. 25, same symbols are put to devices having the same function as in the fifteenth to the eighteenth embodiments. While the write data to the memory cell array 11 at the time of testing was given from either TD terminal or EXP. terminal in the fifteenth to the eighteenth embodiments, write data "0" is prepared from the data output terminal Q0 of the second flip-flop 64 and the write data "1" is prepared from the data output terminal Q1 of the first flip-flop 61 in this embodiment. Therefore, for the purpose of preparing data "1" from the data output terminal Q1 of the first flip-flop 61, one inverter 77 is provided between the data output terminal Q1 of the first flip-flop 61 and the selector 65.

Moreover, the selector corresponding to signal TD (selector 74 in FIG. 20 to FIG. 24) is deleted because no signal TD is used.

In the above construction, until any failure is detected after resetting of the second flip-flop 64 and the first flip-flop 61, the write data can be changed with a control of signal CHDIR. "0" which is the data of the data output terminal Q0 of the second flip-flop 64 is supplied to the write data input terminal D1<i> in the state of CHDIR="0", while "1" which is the reversed data of the data output terminal Q1 of the first flip-flop 61 is supplied to the write data input terminal DI<i> in the state of CHDIR="0", to be used as write data to the memory cell array 11.

While the write data is fixed depending on the control of signal CHDIR, actions same as those of FIG. 18 are possible.

Figure 26:
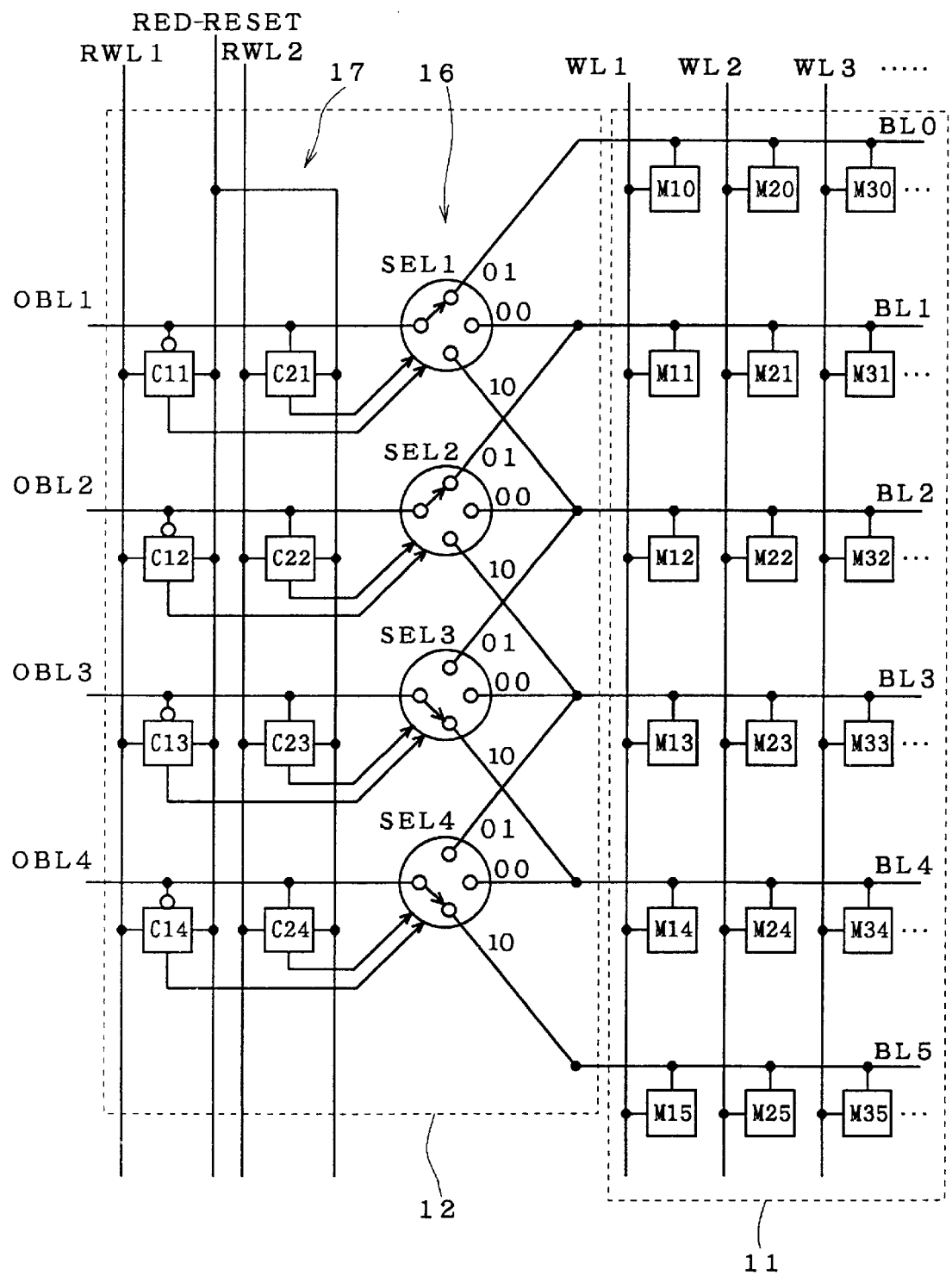
FIG. 26 is a circuit diagram showing the memory circuit of the twentieth embodiment of the present invention.

However, because the control data of the control memory cells C11 to C14 is also reversed in the state of CHDIR="1", it is necessary to reverse the data I/O terminal of the control memory cells C11 to C14 of the column redundancy control circuit 12 as in the twentieth embodiment (FIG. 26).

{Twentieth embodiment}

FIG. 26 is a drawing showing the memory circuit of the twentieth embodiment of the present invention. In FIG. 26, same symbols are put to devices having the same function as in the nineteenth embodiment indicated in FIG. 25. The memory circuit of this embodiment is a memory circuit corresponding to the data control circuit 29 of the nineteenth embodiment indicated in FIG. 25, and the memory cells C11 to C14 of the group of control memory cells 17 of the column redundancy control circuit 12 are constructed as memory cells of reversed input & output against the external bit lines OBL1 to OBL4.

Namely, in the case of supposition that RWL1 is selected in the state of CHDIR="1" in FIG. 25, the control data is also reversed at the time of CHDIR="1" and, therefore, the logic of the data of the control memory cells C11 to C14 are reversed with those selected by the respective word lines RWL1, RWL1.

Figure 27:
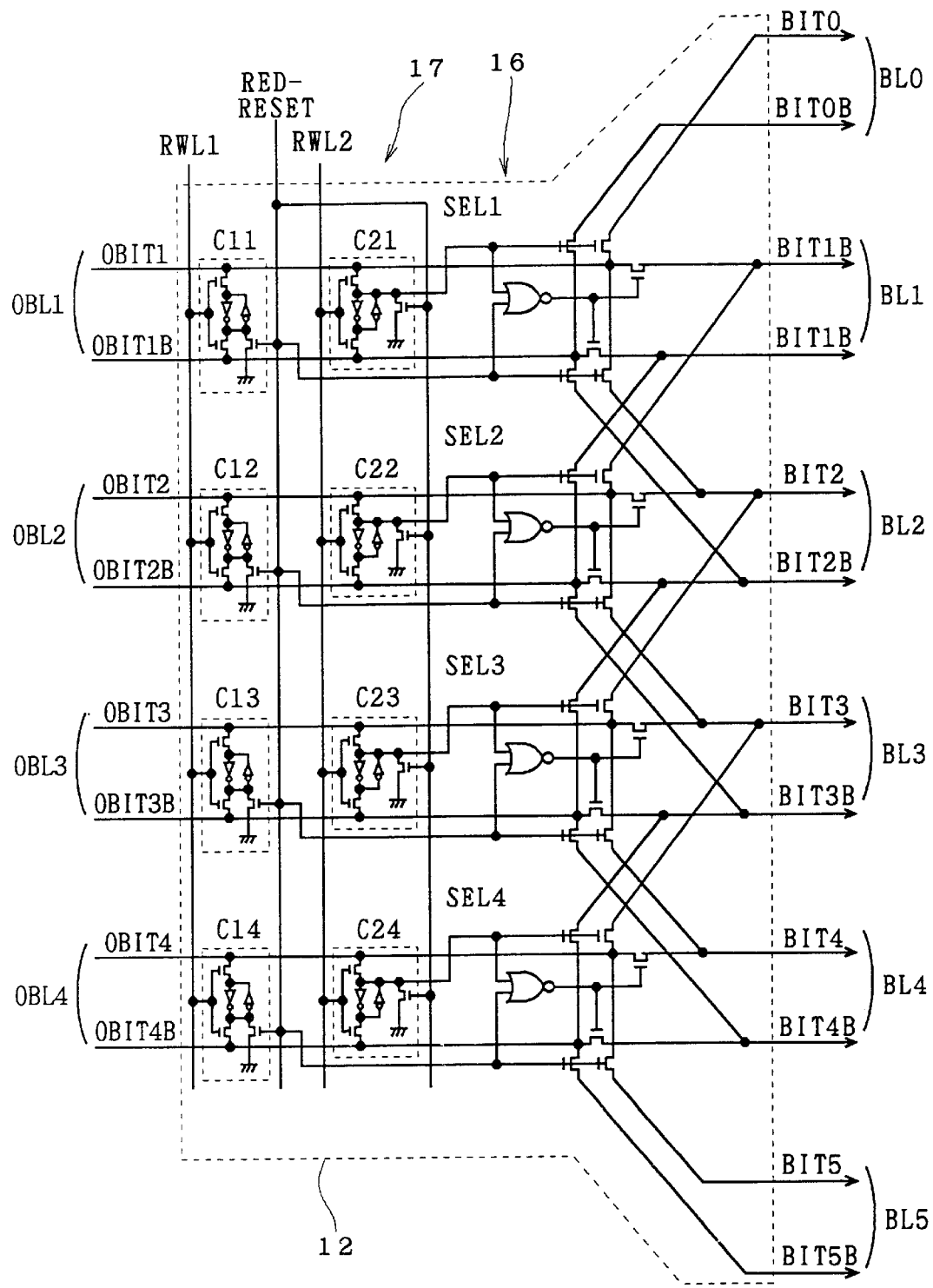
FIG. 27 is a circuit diagram showing the redundancy control circuit in the memory circuit of the twenty-first embodiment of the present invention.

FIG. 27 is a concrete example of FIG. 26 for general static RAM. Compared with FIG. 6, it is different from FIG. 26 in the position of the resetting transistor and the position for taking out control signals of selectors, but is theoretically equivalent to FIG. 26.

{Twenty-first embodiments}

Figure 28:
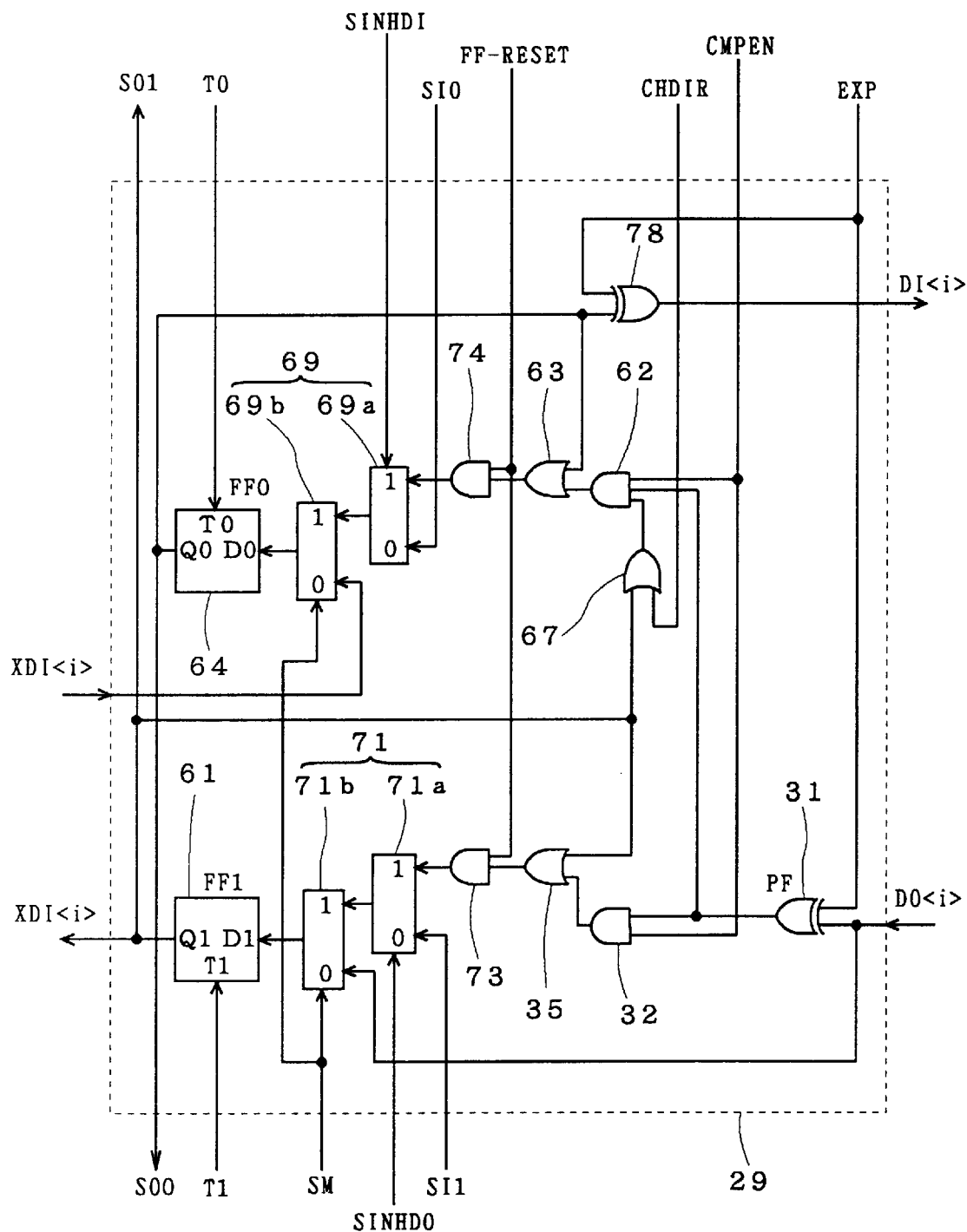
FIG. 28 is a circuit diagram showing the data control circuit of the twenty-first embodiment of the present invention.

FIG. 28 is a drawing showing the data control circuit 29 of the memory circuit of the twenty-first embodiment of the present invention. In FIG. 28, same symbols are put to devices having the same function as in the seventeenth embodiment indicated in FIG. 23. While in the seventeenth embodiment the write data to the memory cell array 11 at the time of testing was given from outside as test data TD, the write data to the memory cell array 11 is prepared, in this embodiment, by carrying, either in reversed or non reversed state, the output data from the data output terminal Q0 of the second flip-flop 64 to the write data input terminal DI<i>. The control of reversal or non reversal is made with the expected value signal EXP. In this way, as device for performing control of reversal/non reversal with expected value signal EXP., one exclusive logical sum (Ex. OR) circuit 78 is provided in which the input terminal on one side is connected to the EXP. terminal and the other input terminal is connected to the data output terminal Q0 of the second flip-flop 64. However, it will be all right to use a reversed exclusive logical sum (Ex. NOR) circuit in place of this exclusive logical sum circuit 78. In this embodiment, the selector corresponding to test data D is deleted because no test data TD is used here.

In the above construction, until any failure is detected with the second flip-flop 64 after resetting of the second flip-flop 64, the write data can be changed with expected value signal EXP. "0" which is the reversed data of the data output terminal Q0 of the second flip-flop 64 is supplied to the write data input terminal DI<i> in the state of EXP.="0", while "1" which is the reversed data of the data output terminal Q0 of the second flip-flop 64 is supplied to the write data input terminal D1<i> in the state of EXP.="1", to be used as write data to the memory cell array 11. With such actions, the same actions as those in FIG. 18 can be made.

However, when writing control data in the control memory cells C11 to C14, what must be done is to just set for EXP.="0".

{Twenty-second embodiments}

Figure 29:
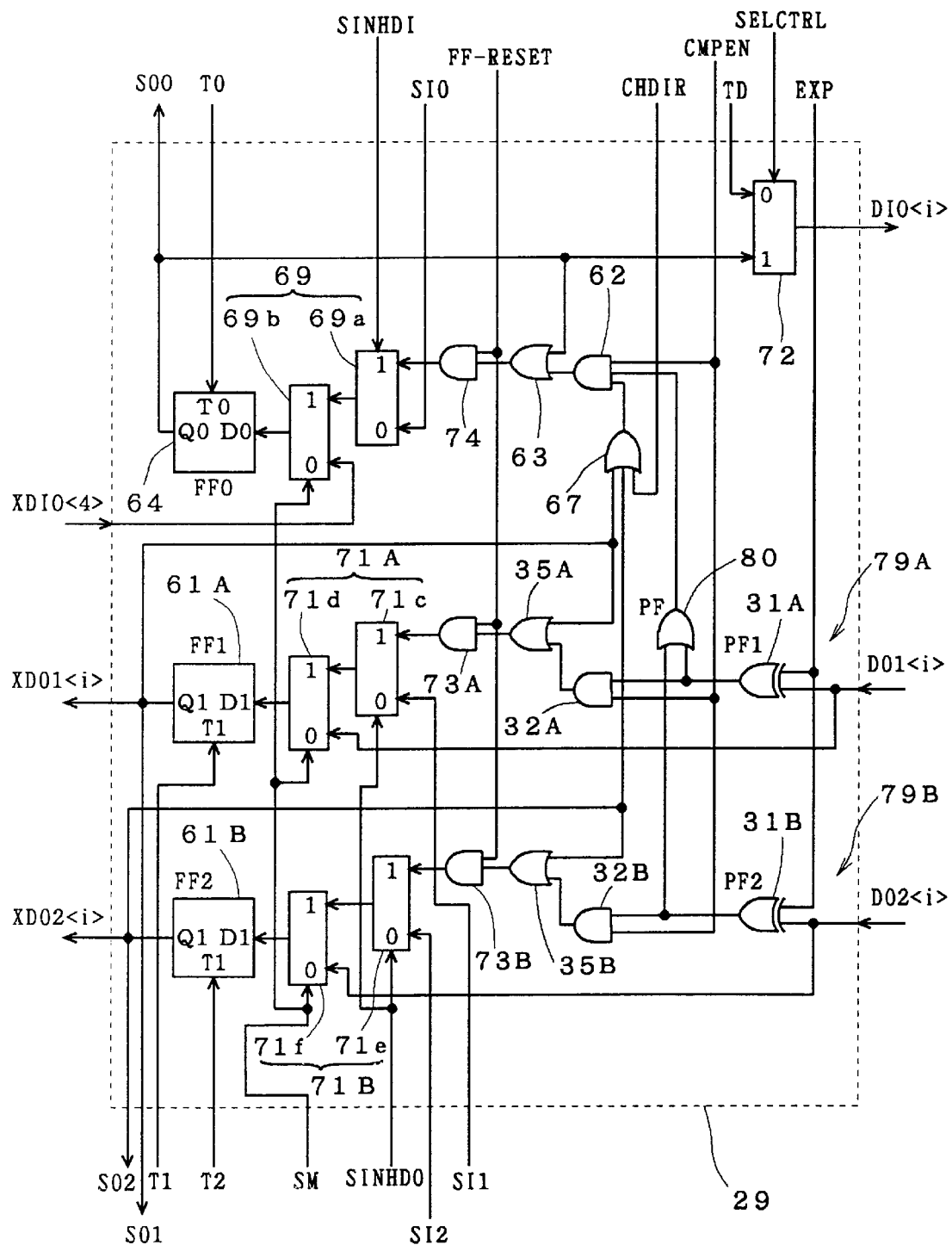
FIG. 29 is a circuit diagram showing the data control circuit of the twenty-second embodiment of the present invention.

FIG. 29 is a drawing showing the data control circuit 29 of the memory circuit of the twenty-second embodiment of the present invention. In FIG. 29, same symbols are put to devices having the same function as in the seventeenth embodiment indicated in FIG. 23. The data control circuit 29 of this embodiment is realized by improving the circuit of FIG. 23 to be applicable to 3-port RAM. Namely, the data control circuit 29 of this embodiment is one which is adapted to 3-port RAM, having one write data terminal DI0<i> corresponding to the write only port and two readout terminals DO1<i>, DO2<i> corresponding to read only ports.

To be concrete, while in the seventeenth embodiment (the data control circuit 29) was provided with only one circuit (hereinafter referred to as "circuit adapted to readout data") composed of exclusive logical sum circuit 31, logical product circuit 32, logical sum circuit 35, logical product circuit 73, selecting means 71 and first flip-flop 61, for adaptation to readout data DO<i>, two circuits adapted to readout data 79A, 79B are provided for adaptation to readout data DO1<i>, DO<i> in this embodiment. The respective circuits adapted to readout data 79A, 79B, exclusive logical sum circuit 31A, 31B, logical product circuit 32A, 32B, logical sum circuit 35A, 35B, logical product circuit 73A, 73B, selecting means 71A, 71B, selectors 71c, 71e, selectors 71d, 71f, first flip-flop 61A (FF1), 61B (FF2) and values for control PF1, PF2 correspond respectively to logical sum circuit 31, logical product circuit 32, logical sum circuit 35, logical product circuit 73, selecting means 71, selectors 71a, 71b, first flip-flop 61 (FF1) and value for control PF in FIG. 23.

Moreover, one logical sum (OR) circuit 80 is further provided between the two exclusive logical sum circuit 31A, 31B and the logical product circuit 62, so that the value for control PF may be transmitted to the logical product circuit 62 when at least one of the two exclusive logical sum circuits 31A, 31B detected any failure data.

Figure 30A:
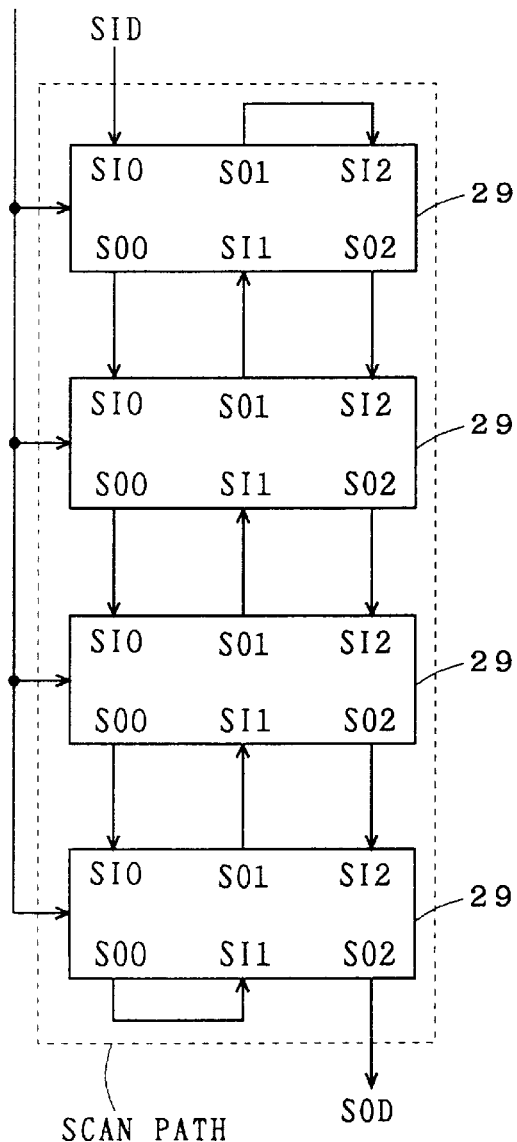
FIG. 30 is a circuit diagram showing the state in which the data control circuit of the twenty-second embodiment of the present invention forms a scan path.
Figure 30B:
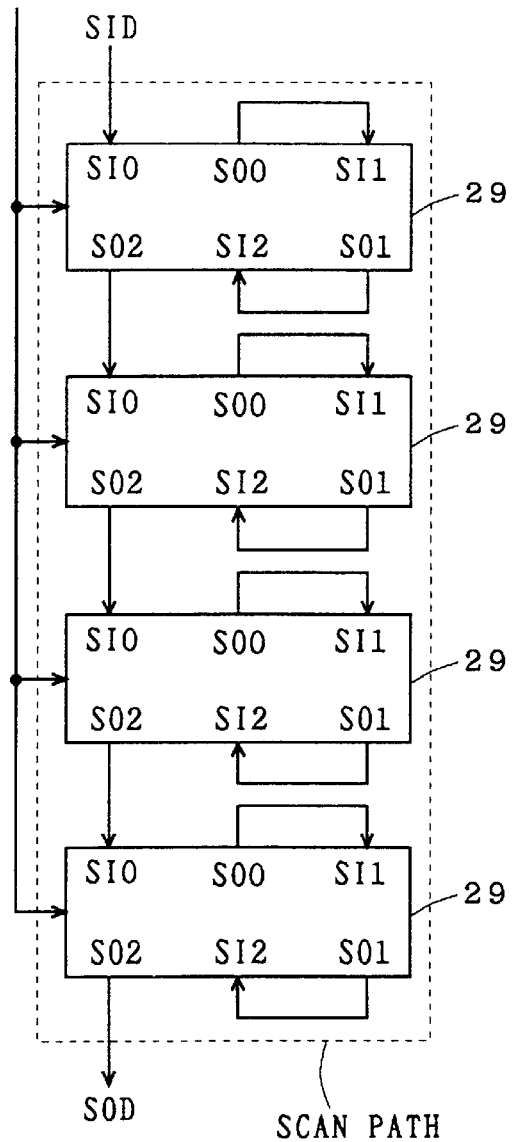

In this embodiment, scan path is constructed by connecting a plural number of circuits of FIG. 29 as shown in FIG. 30 in the same way as in some other embodiments described earlier. Here, the connection of either FIG. 30 (a) or 30 (b) may be used, and the scan path may be constructed in whatever order.

<Actions>

Explanation will be given on the actions of the data control circuit 29 constructed as above. First, (the data control circuit 29) performs tests as in the case of single-port RAM while giving one same address to the respective ports at the time of testing.

The results of detection of failure of a pair of read only ports are stored in the respective flip-flops 61A, 61B of the respective circuits adapted to readout data 79A, 79B.

If one readout data terminal DO1<i> detected the first failure, PF1 becomes "1", and the output Q1 of the first flip-flop 61 changes from "0" to "1".

In the same way, if other readout data terminal DO2<i> of read only ports detected the first failure, PF2 becomes "1", and the output Q2 of the first flip-flop 61 changes from "0" to "1".

If, in the case of CHDIR="0", the first failure after either Q1 or Q2 changed from "0" to "1" (i.e. second failure) is detected, the data output terminal Q0 of the first flip-flop 61 changes from "0" to "1".

If, in the case of CHDIR="1", the first failure is detected by either of the readout data terminals DO1<i>, DO2<i>, PF becomes "1" and the data output terminal Q0 of the second flip-flop 64 changes from "0" to "1".

Namely, the control data is made to change from "0" to "1" at the point in time when the first failure is detected in the case of CHDIR="1", but changes from "0" to "1" at the point in time when the second failure is detected in the case of CHDIR="0". Therefore, it becomes possible to perform proper switching of redundancy circuit with the same actions as those in FIG. 18.

{Twenty-third embodiment}

FIG. 31 is a drawing showing the data control circuit 29 of the memory circuit of the twenty-third embodiment of the present invention. In FIG. 31, same symbols are put to devices having the same function as in the ninth embodiment indicated in FIG. 12. The data control circuit 29 of this embodiment is realized by improving the data generating circuit for control memory cell of FIG. 12 to be applicable to 3-port RAM. Therefore, it is provided in correspondence to a column redundancy control circuit 12 with a column redundancy of "1" as in FIGS. 1, 2 and 3. In this embodiment, it is intended for a 3-port RAM having one write only port and 2 read only ports.

The write data input terminal DI0<i> is connected to the write only port of the memory circuit, while a pair of readout data terminals DO1<i>, DO2<i> are connected to a pair of read only ports respectively.

And, in this embodiment, a pair of exclusive logical sum circuits 31A, 31B, logical product circuits 32A, 32B and one logical sum circuit 81 for generating the value control PF by computing those logical sums are provided, in place of the exclusive logical sum circuit 31 in the ninth embodiment.

<Actions>

Explanation will be given on the actions of the data control circuit 29 constructed as above. First, at the time of testing, (the data control circuit 29) performs tests as a single-port RAM while giving one same address to the address signal of the respective ports. And, if any value different from the expected value signal is detected by at least either one of the read only ports, either of the outputs PF1, PF2 of the exclusive logical sum circuits 31A, 31B changes to "1" and, therefore, the output (value for control) PF of the logical sum circuit 81 becomes "1".

If, in this state, clock signal T is given at the time of CM PEN="1", SM="1", SINHDO="1", OFF-RESET="1", "1" is set in the flip-flop 43. Namely, the output Q of OFF changes from "0" to "1" if any failure is detected. Other actions are the same as those of the circuit of FIG. 12. In this way, (the data control circuit 29) can perform proper switching of redundancy to the 3-port RAM.

{Twenty-fourth embodiment}

Figure 32A:
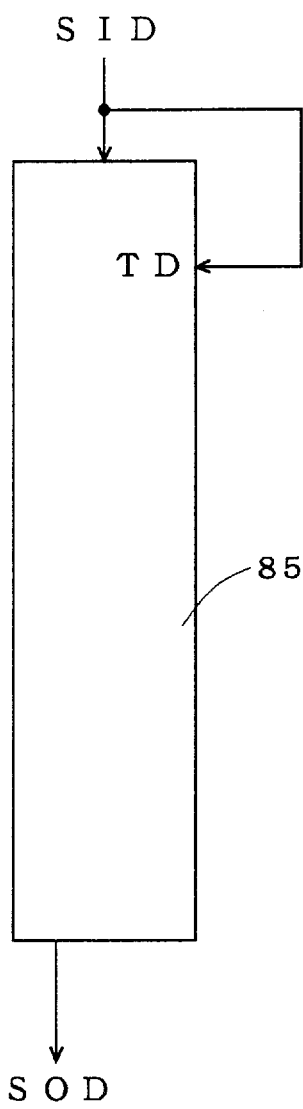
FIG. 32 is a circuit diagram showing the data control circuit as scan path of the memory circuit of the twenty-fourth embodiment and the twenty-fifth embodiment of the present invention forms a scan path.
Figure 32B:
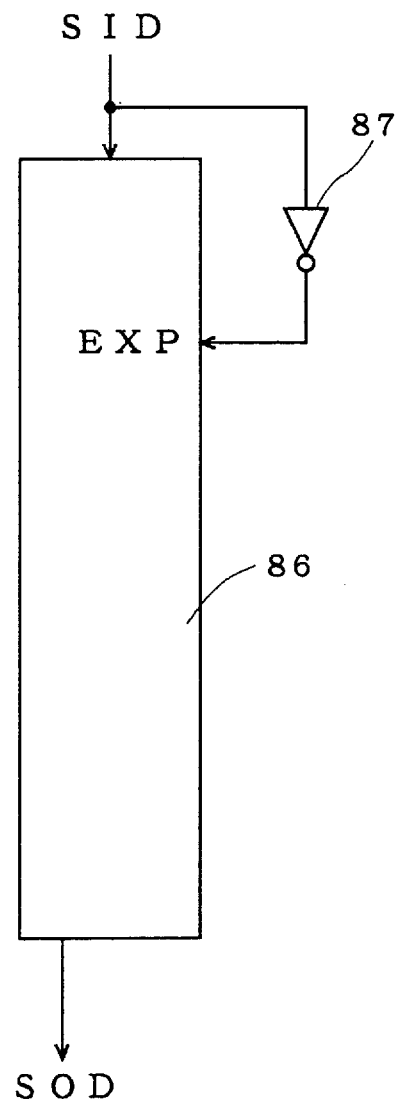

FIG. 32 (a) is a drawing showing a scan path constructed with the data control circuit 29 of the twenty-third embodiment indicated in FIG. 31, as the twenty-fourth embodiment of the present invention. The data control circuit 29 of this embodiment does not make, when it has access to the respective memory cells of the memory cell array 11, any serial shift action of scan path and, therefore, the serial input terminal SID of the scan path (hereinafter referred to as SID) is not used. Therefore, test data TD can be input from the SID terminal.

In this case, the write data to the memory cells for normal actions is given from the SID terminal. It is also all right to supply reversed data of SID terminal as test data TD. In that case, the write data to the memory cell array 11 is given from the SID terminal.

{Twenty-fifth embodiments}

FIG. 32 (b) is a drawing showing a scan path constructed with the data control circuit 29 of the twenty-third embodiment indicated in FIG. 31, as the twenty-fifth embodiment of the present invention. The data control circuit 29 of this embodiment does not make, when it has access to the respective memory cells of the memory cell array 11, any serial shift action of scan path and, therefore, the serial input terminal SID of the scan path (hereinafter referred to as SID) is not used. Therefore, expected value signal EXP. can be input from the SID terminal. While in this embodiment the data of the SID terminal is input as expected value signal EXP. in reversed form, it may also be all right to supply non reversed data of the SID terminal as a variation of this embodiment.

Moreover, the construction of this embodiment and the construction of FIG. 32 (a) (twenty-fourth embodiment) may be applied at a time.

{Twenty-sixth embodiment}

FIG. 32 (b) is a drawing showing the memory circuit of the twenty-sixth embodiment of the present invention. While the memory circuit of the first embodiment indicated in FIG. 1 was intended to relieve failure of either one of the internal bit lines BL1 to BL5, the memory circuit of this embodiment is constructed in a way to relieve failure of either one of the internal word lines WL1 to WL5. Namely, the data control circuit 29 of this embodiment controls the selectors SEL1 to SEL4 with control memory cells R11 to R41 connected to the external word lines OWL1 to OWL4, and relieves failure by switching the relation of correspondence between the external word lines OWL1 to OWL4 and the internal word lines WL1 to OWL5. The symbol 91 in FIG. 33 represents a row redundancy control circuit (ROW-RED-CTRL), the symbol 92 represents a group of selectors and the symbol 93 represents a group of control memory cells.

For example, in case of occurrence of any failure (breaking of wire or short-circuiting) of the second internal word line WL2 itself or any failure in the memory cells M21, M22, M23, . . . connected to the second internal word line WL2, the selectors SEL1 to SEL4 are switched in a way to keep correspondence between the first external word line OWL1 and the first internal word line WL1, between the second external word line OWL2 and the third internal word line WL3, between the third external word line OWL3 and the fourth internal word line WL4, and between the fourth external word line OWL4 and the fifth internal word line WL5 as shown in FIG. 33. This switching is made with writing of "0", "1", "1", "1" respectively in the control memory cells R11, R21, R31, R41.

Because access to the memory cell array 11 is made from the external word lines OWL1 to OWL4, no failure relating to the second internal word line WL2 is observed from outside and (the memory circuit) can work as if it were a memory circuit without failure.

The control memory cells R11 to R41 may be or may not be provided with resetting function. In the case without resetting function, resetting is made by writing "0" in the respective control memory cells R11 to R41 from the external word lines OWL1 to OWL4 when the bit line RBL1 is activated. After the resetting, all selectors are switched to the input "0" side and, therefore, correspondence is established between the first external word line OWL1 and the first internal word line WL1, between the second external word line OWL2 and the second internal word line WL2, between the third external word line OWL3 and the third internal word line WL3, and between the fourth external word line OWL4 and the fourth internal word line WL4 respectively.

After the resetting, a test of the memory cell array 11 is made and, if any failure is detected, the failure is relieved with a switching of selectors made as described above.

As for the control memory cells R11 to R41, they may be either memory cells similar to those of single-port RAM or electrically programmable memory cells for ROM.

The respective word lines and the respective external word lines also include those constructed with a plural number of signal lines. For example, a multi-port RAM has signal lines relating to word lines for a plural number of ports, and those signal lines are generically called word lines WL or external word lines OWL. For example, in a 3-port RAM having one write only port and 2 readout ports, a word line WL or an external word line are constructed with at least 3 signal lines. Even in such case, the basic function remains unchanged.

{Twenty-seventh embodiment}

Figure 34:
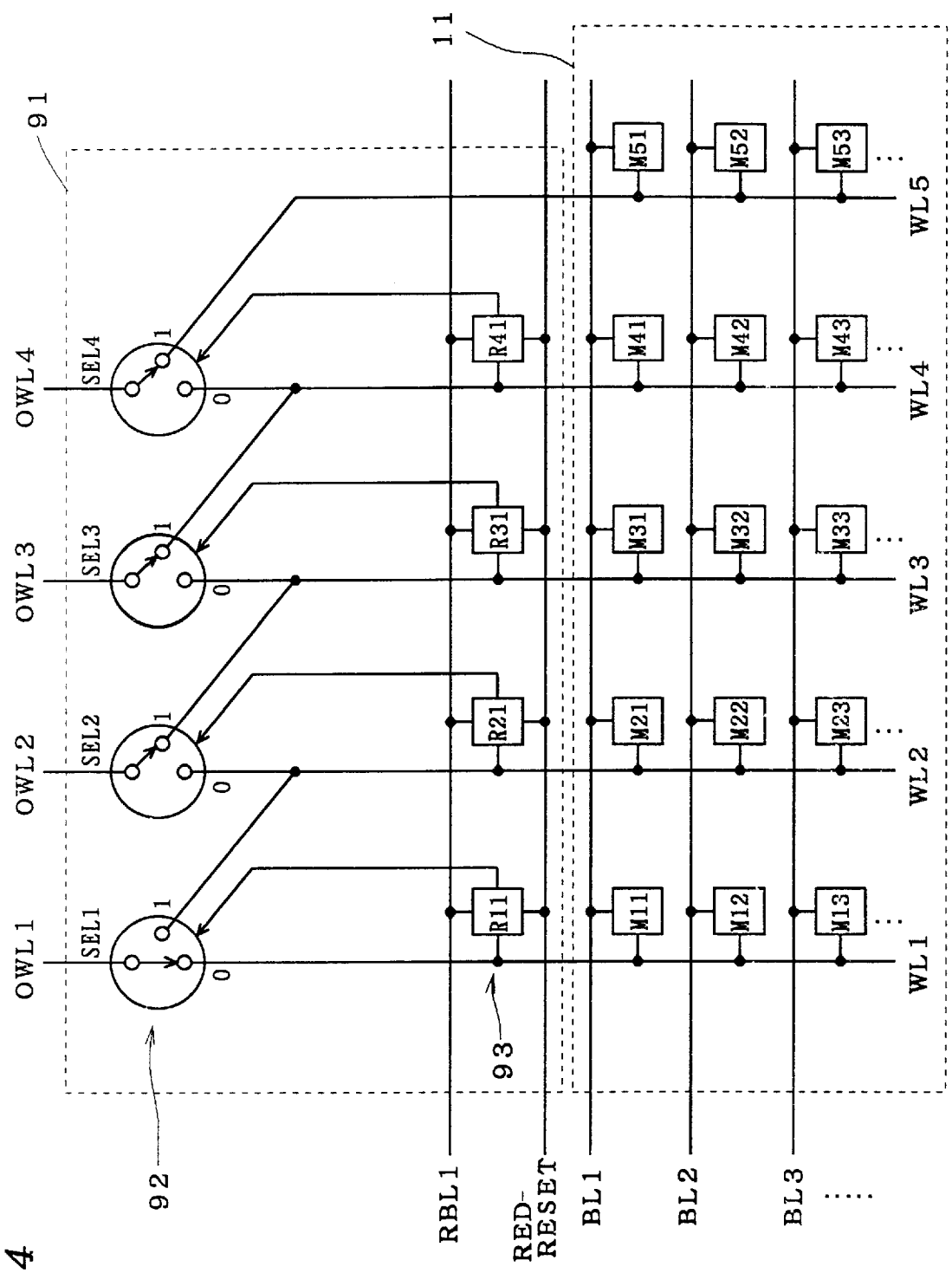
FIG. 34 is a circuit diagram showing the memory circuit of the twenty-seventh embodiment of the present invention.

FIG. 34 is a drawing showing the memory circuit of the twenty-seventh embodiment of the present invention. While the memory circuit of the second embodiment indicated in FIG. 2 was intended to relieve failure of either one of the internal bit lines BL1 to BL5, the memory circuit of this embodiment is constructed in a way to relieve failure of either one of the internal word lines WL1 to WL5. Namely, the memory circuit of this embodiment controls the selectors SEL1 to SEL4 with control memory cells R11 to R41 connected to the word lines WL1 to WL4, and relieves failure by switching the relation of correspondence between the external word lines OWL1 to OWL4 and the internal word lines WL1 to OWL5.

For example, in case of occurrence of any failure (breaking of wire or short-circuiting) of the second internal word line WL2 itself or any failure in the memory cells M21, M22, M23, . . . connected to the second internal word line WL2, the selectors SEL1 to SEL4 are switched in a way to keep correspondence between the first external word line OWL1 and the first internal word line WL1, between the second external word line OWL2 and the third internal word line WL3, between the third external word line OWL3 and the fourth internal word line WL4, and between the fourth external word line OWL4 and the fifth internal word line WL5 as shown in FIG. 34. This switching is made with writing of "0", "1", "1", "1" respectively in the control memory cells R11, R21, R31, R41.

In this embodiment, if "0", "1", "1", "1" are set in the control memory cells R11, R21, R31, R41 at the time of closing of power unfortunately, the control memory cell R21 is not connected to any of the external word lines OWL1 to OWL4 as shown in FIG. 34. And, if, the respective control memory cells R11 to R41 are not provided with resetting function, there is no means for setting "0" in the control memory cell R21. Therefore, there is no way of making any proper switching of redundancy circuits. So, in this embodiment, respective control memory cells R11 to R41 are preferably those provided with resetting function. However, no definite resetting function is required. For example, it will also be all right to design the memory cells themselves in such a way that the memory cells are all set for "0" at closing of power. For example, if the memory cell circuit is designed to be asymmetrical against "0", "1" of by changing the size of transistor, etc., all the memory cells can be set for "0" at the time of closing of power.

Moreover, in the case where the memory cells are memory cells for programmable ROM (UVEPROM) erasable by irradiation of light (ultraviolet ray), resetting by irradiation of light is possible.

Explanation on the actions after resetting will be omitted because they are the same as those of the circuit indicated in FIG. 33.

{Twenty-eighth embodiment}

Figure 35:
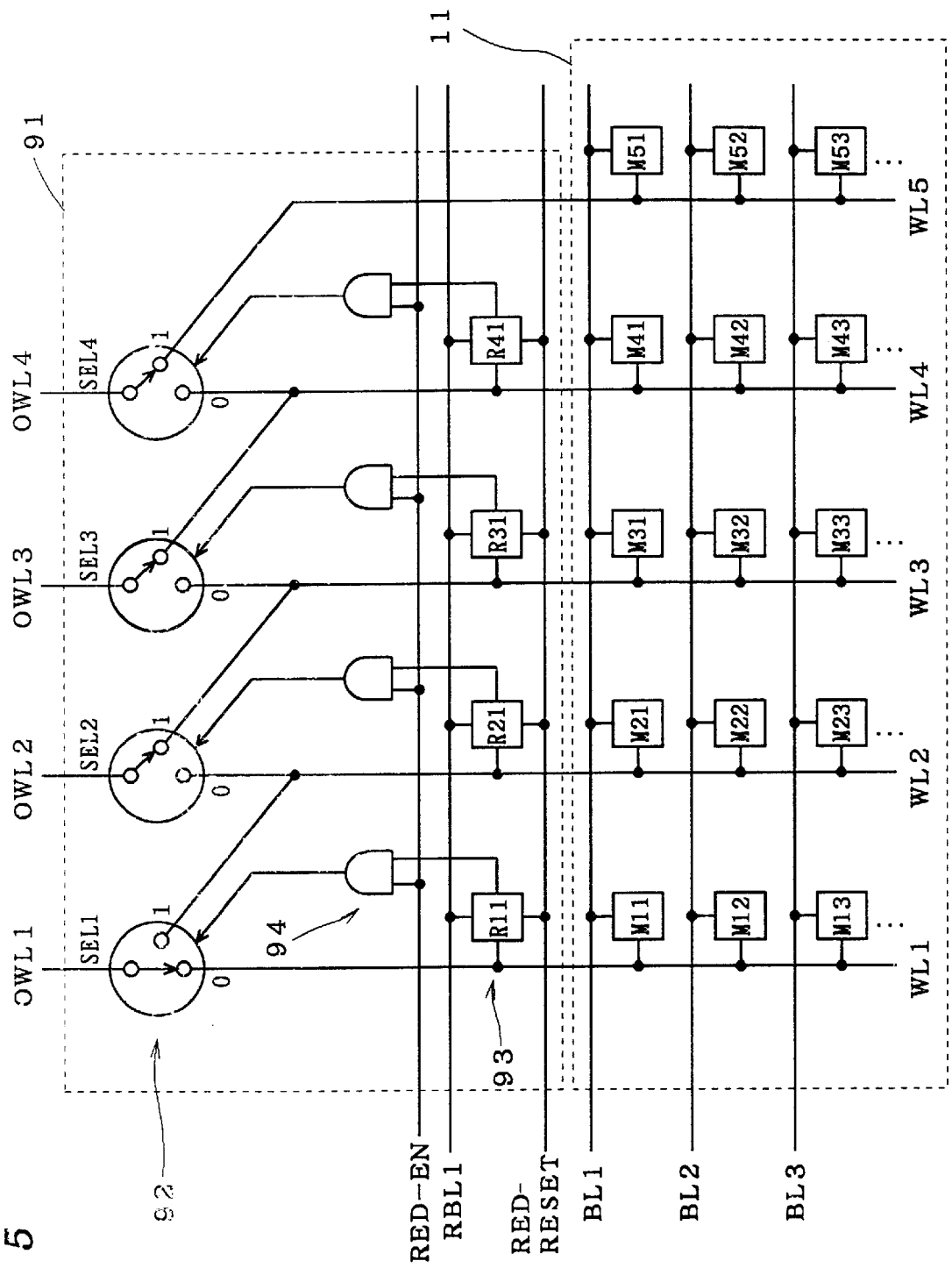
FIG. 35 is a circuit diagram showing the memory circuit of the twenty-eighth embodiment of the present invention.

FIG. 35 is a drawing showing the data control circuit 29 of the memory circuit of the twenty-eighth embodiment of the present invention. In the data control circuit 29 of this embodiment, while the memory circuit of the third embodiment indicated in FIG. 3 was intended to relieve failure of either one of the internal bit lines BL1 to BL5, the memory circuit of this embodiment is constructed in a way to relieve failure of either one of the internal word lines WL1 to WL5. Namely, the memory circuit of this embodiment controls the selectors SEL1 to SEL4 with control memory cells R11 to R41 connected to the internal word lines WL1 to WL5, and relieves failure by switching the relation of correspondence between the external word lines OWL1 to OWL4 and the internal word lines WL1 to OWL5. The symbol 94 in FIG. 35 represents a group of logical product circuits.

For example, in case of occurrence of any failure (breaking of wire, etc.) of the second internal word line WL2 itself or any failure in the memory cells M21, M22, M23, . . . connected to the second internal word line WL2, the selectors SEL1 to SEL4 are switched in a way to keep correspondence between the first external word line OWL1 and the first internal word line WL1, between the second external word line OWL2 and the third internal word line WL3, between the third external word line OWL3 and the fourth internal word line WL4, and between the fourth external word line OWL4 and the fifth internal word line WL5 as shown in FIG. 34. This switching is made with writing of "0", "1", "1", "1" respectively in the control memory cells R11, R21, R31, R41.

The control memory cells R11 to R41 may be or may not be provided with resetting function. In the case without resetting function, resetting is made by setting "0" in the redundancy enable signal line RED-EN and writing "0" in the control memory cells R11, R12, R13, R41 from the bit line RBL1 while activating the external word lines OWL1, OWL2, OWL3, OWL4 in order.

By setting "0" in the redundancy enable signal line RED-EN, it becomes possible to fix the relation of correspondence between the external word lines OWL1 to OWL4 and the control memory cells R11 to R41. Namely, because correspondence is established between the first external word line OWL1 and the first control memory cell R11, between the second external word line OWL2 and the second control memory cell R21, between the third external word line OWL3 and the third control memory cell R31, and between the fourth external word line OWL4 and the fourth control memory cell R41, it is easier to test the control memory cells themselves compared with the circuit of FIG. 34.

{Twenty-ninth embodiment}

Figure 36:
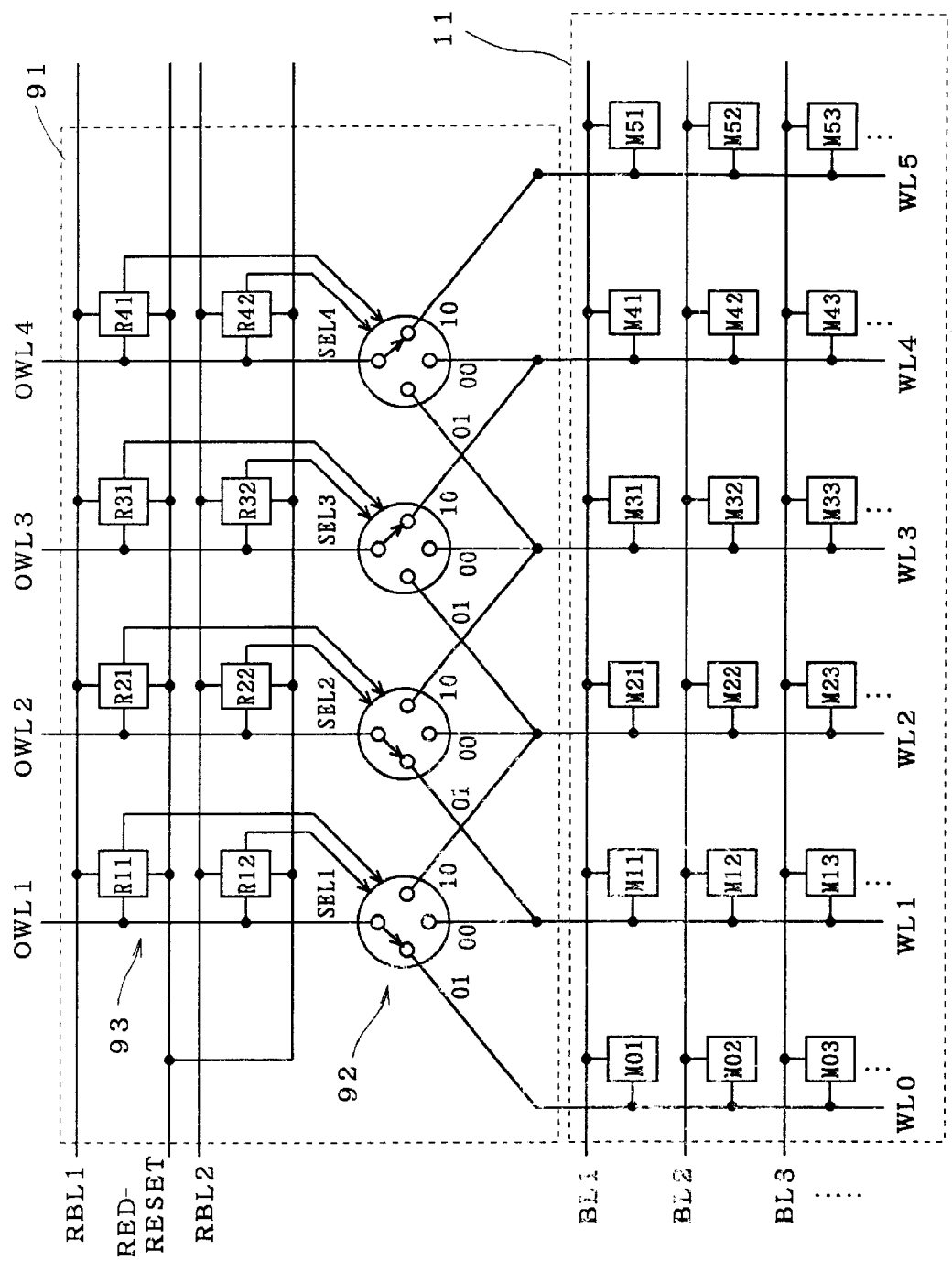
FIG. 36 is a circuit diagram showing the memory circuit of the twenty-ninth embodiment of the present invention.

FIG. 36 is a drawing showing the data control circuit 29 of the memory circuit of the twenty-ninth embodiment of the present invention. In the data control circuit 29 of this embodiment, while the memory circuit of the fourth embodiment indicated in FIG. 4 was intended to relieve failure of any two of the internal bit lines BL1 to BL5, the memory circuit of this embodiment is constructed in a way to relieve failure of any two of the internal word lines WL1 to WL5. Namely, the data control circuit 29 of this embodiment is provided with word lines RL0 to WL5 in a number 2 bits larger (6 bits) than the number of bits (4 bits) of the external word lines OWL1 to OWL4, and selects, from among 3 word lines (WL0, WL1, WL2, for example), the signal to be connected to the external word line of 1 bit (OWL1, for example) by means of 3-contact selectors SEL1 to SEL4. The respective 3-contact selectors are controlled by 2 control memory cells (SEL1 is controlled by R11 and R12, for example).

With such construction, it is possible to relieve failure in 2 word lines.

For example, in case of occurrence of any failure (breaking of wire, etc.) of the second internal word line WL2 and the third internal word line WL3 themselves or any failure in the memory cells M21, M22, M23, . . . , M31, M32, M33, connected to the second internal word line WL2 and the third internal word line WL3, the selectors SEL1 to SEL4 are switched in a way to keep correspondence between the first external word line OWL1 and the "0"th internal word line WL0, between the second external word line OWL2 and the first internal word line WL1, between the third external word line OWL3 and the fourth internal word line WL4, and between the fourth external word line OWL4 and the fifth internal word line WL5 as shown in FIG. 36. This switching is made with writing of "0, 1", "0, 1", "1, 0", "1, 0" in the control memory cells (R11, R12), (R21, R22), (R31, R32, (R41, R42).

In FIG. 36, the control memory cells R11 to R41 may be or may not be provided with resetting function. In the case without resetting function, resetting is made by writing "0" in the control memory cells R11 to R41 from the bit line RBL1, RBL2 while activating the external word lines OWL1, OWL2, OWL3, OWL4 in order.

Figure 37:
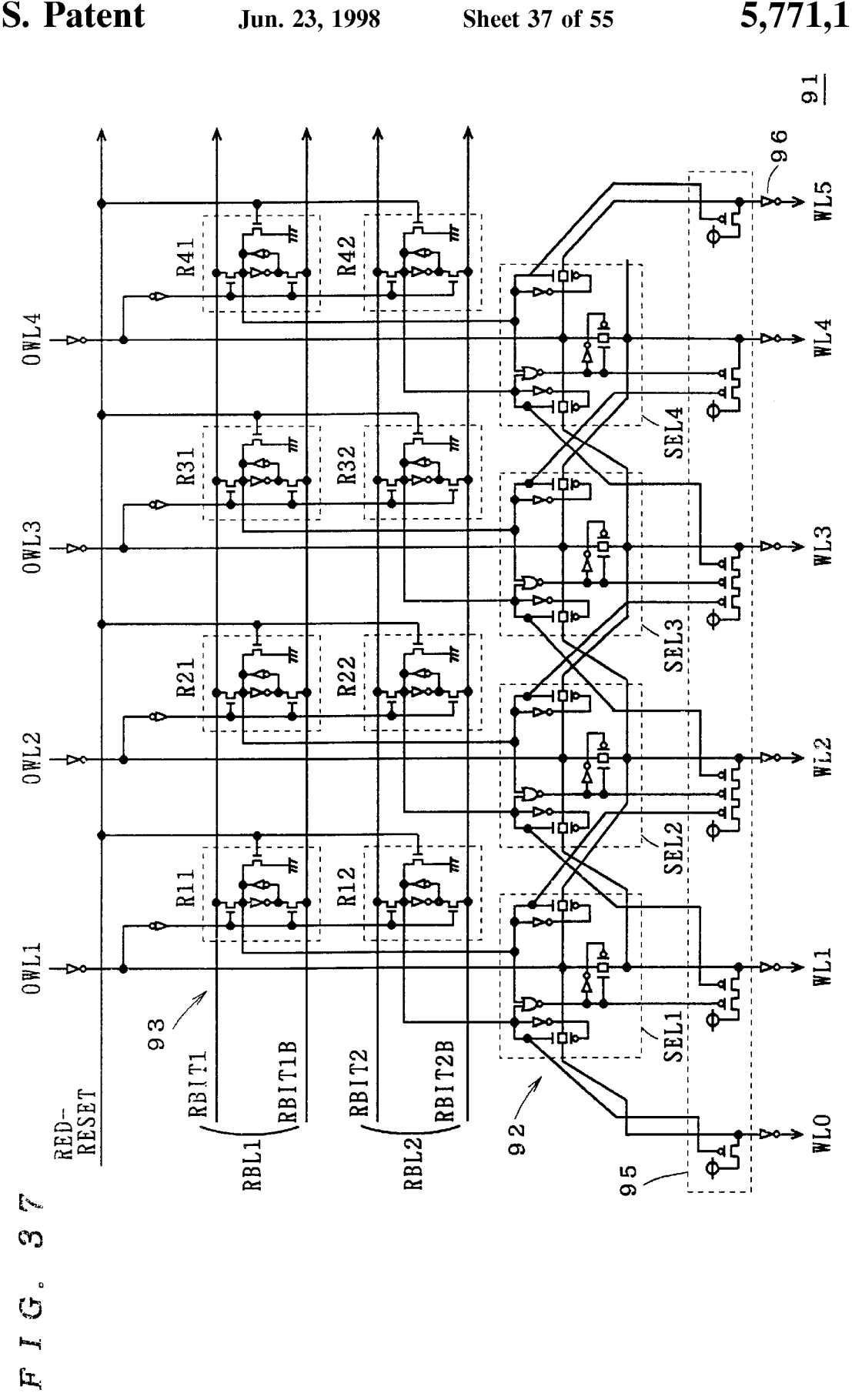
FIG. 37 is a circuit diagram showing the redundancy control circuit in the memory circuit of the thirtieth embodiment of the present invention.

FIG. 37 is a concrete circuit diagram of a case where, as thirtieth embodiment, the row redundancy control circuit (ROW-RED-CTRL) 91 of the twenty-ninth embodiment indicated in FIG. 36 is constructed with CMOS circuit. For example, if the selectors SEL1 to SEL4 are switched and "0, 1", "0, 1", "1, 0", "1, 0" are written in the control memory cells (R11, R12), (R21, R22), (R31, R32, (R41, R42) as in FIG. 36, the word lines WL2, WL3 get in unconnected state and may come to an unstable level in FIG. 36. If they reach an unstable level, the RAM makes an operating error.

To avoid such eventuality, a word line level fixing circuit 95 is added to the row redundancy control circuit 91 in FIG. 37.

The word line level fixing circuit 95 is constructed, for example, with 3 transistors i.e. P-channel transistor controlled by the control memory cell Ri 1, P-channel transistor controlled by the control memory cell R32, and P-channel transistor controlled by the NOR logic output from the control memory cell R21 and the control memory cell R22.

When the input of the inverter circuit 96, which is the driver of the internal word lines WL0 to WL5, gets in the state non connected with any of the external word lines OWL1 to OWL4, those 3 transistors all get in the ON state, and fix the input of that inverter circuit 96 at "1". As a result, the word lines are fixed to an inactive value "0". This makes it possible to avoid any operating error of the RAM.

Figure 38:
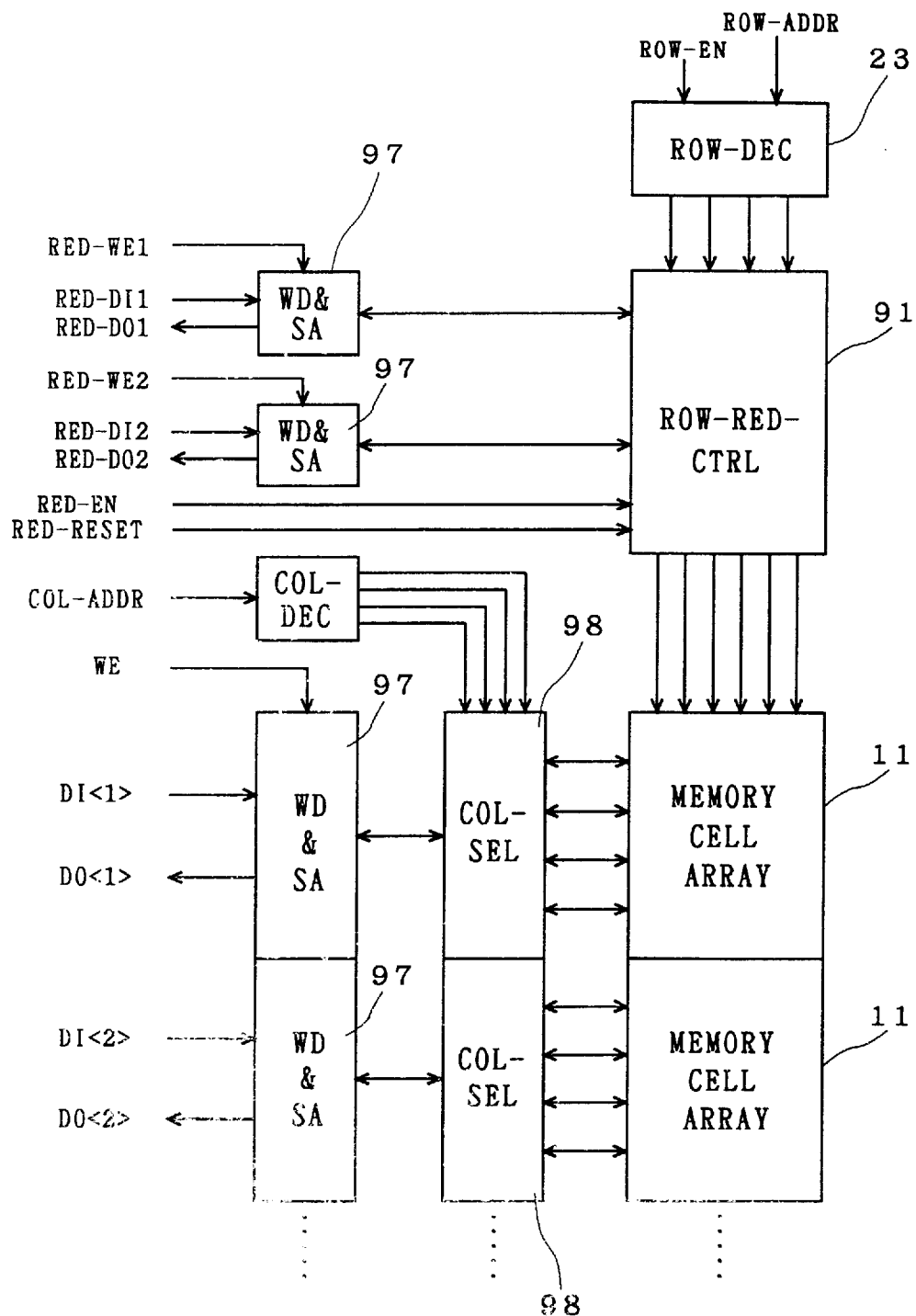
FIG. 38 is a circuit diagram showing the general construction of the memory circuit of the thirtieth embodiment of the present invention.

FIG. 38 is a circuit diagram of the entire memory circuit provided with row redundancy function constructed by using row redundancy control circuit 91. In FIG. 38, symbol 97 represents write driver and sense amplifier (hereinafter abbreviated as WD & SA), and symbol 98 is column selector (COL-SEL). In relation to the memory cell array 11, WD & SA 97 and column selector 98 correspond at 1:1.

In FIG. 38, as far as the control memory cells R11 to R41 are concerned, WD & SA 97 are provided independent for each of a pair of bit lines RBL1, RBL2 without provided column selector.

Therefore, the control data to the control memory cells R11, R21, R31, R41 relating to one bit line RBL1 is written from RED-DI1, and the control data to the control memory cells R12, R22, R32, R42 relating to the other bit line RBL2 is written from RED-DI2.

While the other bit line RBL2 is indicated in FIG. 38, this signal does not exist in the case of use of a row redundancy control circuit (ROW-RED-CTRL) 91 the redundancy of which is "1" (FIG. 33, FIG. 34, FIG. 35, for example).

Moreover, while the signal given by the redundancy enable signal line is indicated in FIG. 38, this signal does not exist depending on the type of row redundancy control circuit (ROW-RED-CTRL) 91 as in FIG. 33, FIG. 34, FIG. 36, for example.

Furthermore, while the reset signal RED-RESET is indicated in FIG. 38, this signal does not exist depending on the type of row redundancy control circuit (ROW-RED-CTRL) 91 as the case of use of control memory cells without resetting function in the circuit of FIG. 33, FIG. 35, FIG. 36, for example.

To test the control memory cells R11 to R41, it is desirable to provide sense amplifier as in FIG. 38, it may be deleted when unnecessary. In that case, output signals RED-DO1, RED-DO2 are also unnecessary.

{Thirty-first embodiment}

Figure 39:
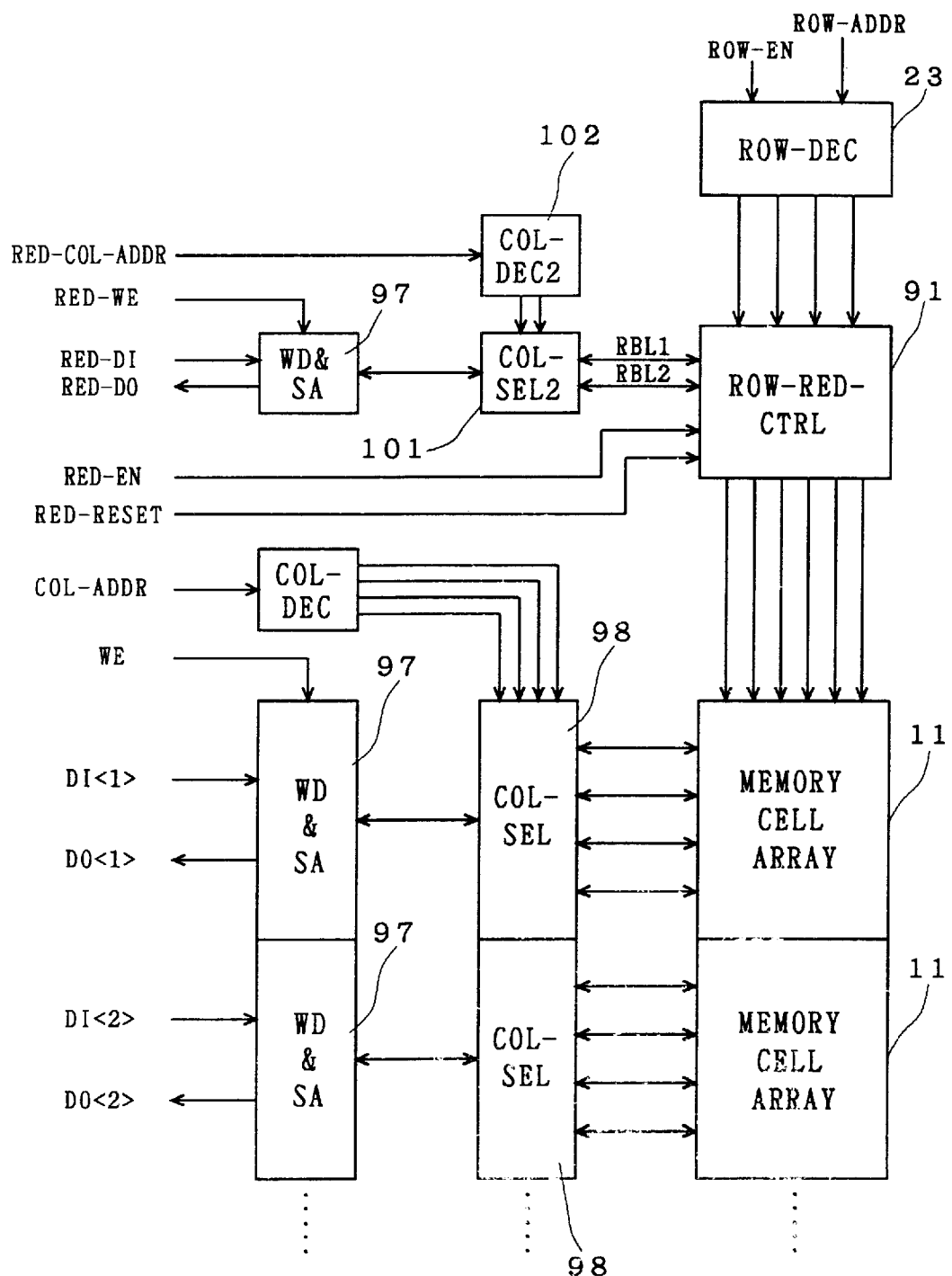
FIG. 39 is a circuit diagram showing the general construction of the memory circuit of the thirty-first embodiment of the present invention.

FIG. 39 is a general construction drawing indicating the memory circuit of the thirty-first embodiment of the present invention. In FIG. 39, same symbols are put to devices having the same function as in the thirtieth embodiment indicated in FIG. 38. The memory circuit of this embodiment is realized by improving the RAM with row redundancy function of FIG. 38 to be used for a row redundancy control circuit (ROW-RED-CTRL) 91 as indicated in FIG. 36 the redundancy of which is "2" or over.

A column selector (COL-SEL2) 101 and a column decoder (COL-DEC2) 102 are provided for the selection of a pair of bit lines RBL1, RBL2. Because of the adoption of such construction, the number of write drivers and sense amplifiers (WD & SA) 97 is reduced by one compared with the construction of FIG. 38.

As shown in FIG. 39, in this embodiment, only one selecting signal RED-COL-ADDR is enough for the bit lines RBL1, RBL2. Therefore, 2 signal wires are reduced as a whole compared with FIG. 38.

{Thirty-second embodiments}

Figure 40:
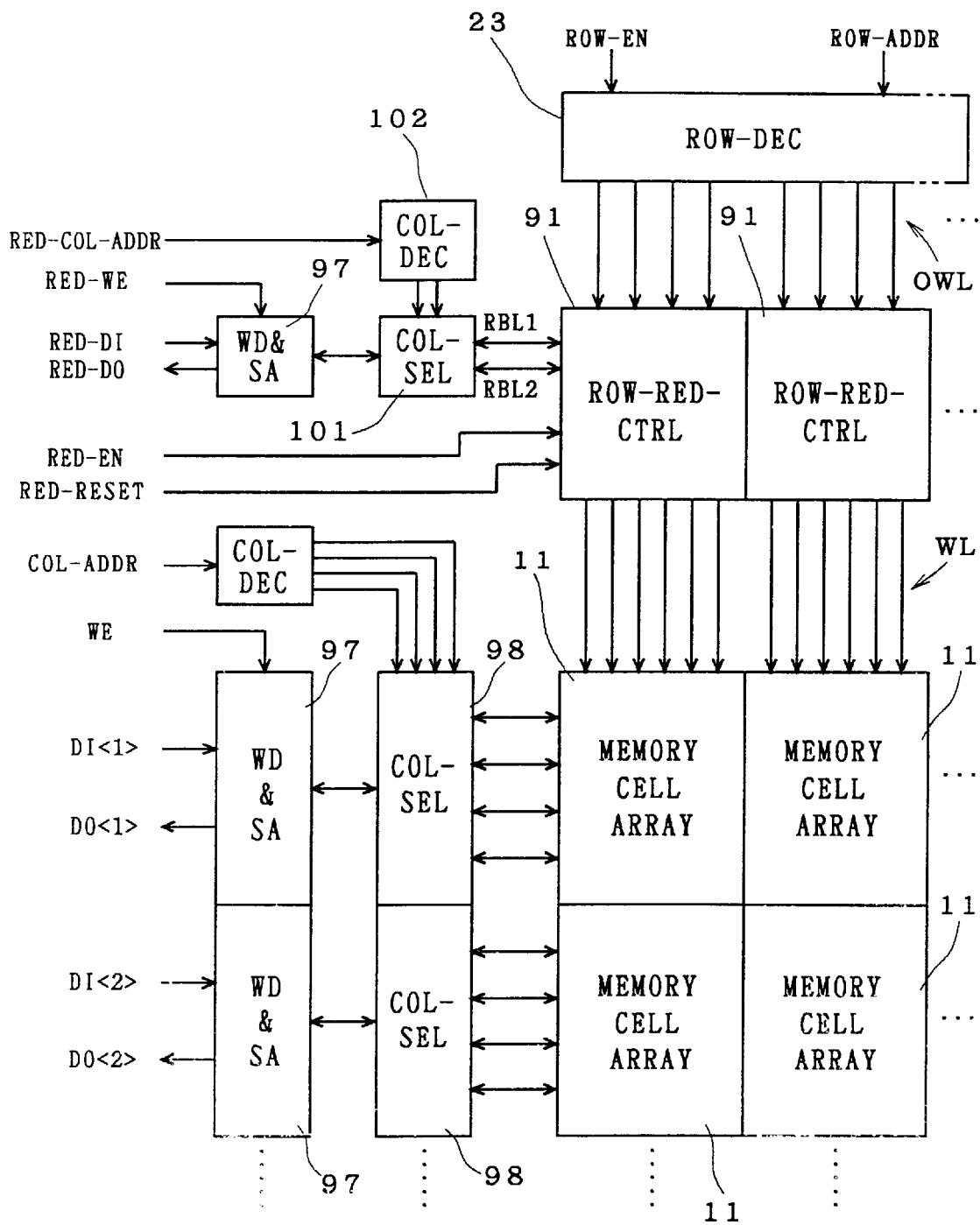
FIG. 40 is a circuit diagram showing the general construction of the memory circuit of the thirty-second embodiment of the present invention.

FIG. 40 is a drawing showing the memory circuit of the thirty-second embodiment of the present invention. In FIG. 40, same symbols are put to devices having the same function as in the thirty-first embodiment indicated in FIG. 39. The data control circuit 29 of this embodiment is a general circuit diagram of the RAM with row redundancy function so that it may also cope with cases where there are no less than 3 defects regarding word lines.

While in the thirty-first embodiment indicated in FIG. 39 one row redundancy control circuit (ROW-RED-CTRL) 91 was provided for one row decoder (ROW-DEC) 23, a plural number (2) of row redundancy control circuits (ROW-RED-CTRL) 91 are provided for one row decoder (ROW-DEC) 23.

Because one row redundancy control circuit (ROW-RED-CTRL) 91 can relieve failure of max. 2 word lines in the memory cell array 11 connected to it, relieving of failure in no less than 3 word lines also becomes possible by providing a plural number of row redundancy control circuits (ROW-RED-CTRL). To be concrete, because there are 64 external word lines OWL each (128 lines in total) from the row decoder 23 for the respective row redundancy control circuits 91 to relieve failure of 2 internal word lines WL at each row redundancy control circuit 91, the total number of 64+2=66 lines can be connected to each row redundancy control circuit 91 (132 lines in total). Namely, in this embodiment, relieving of failure is possible for 132−128=4 word lines.

While this embodiment is realized by improving the circuit of the thirty-first embodiment (FIG. 39), it is also all right to make this improvement on the basis of the circuit of the thirtieth embodiment (FIG. 38).

{Thirty-third embodiment}

<Construction>

Figure 41:
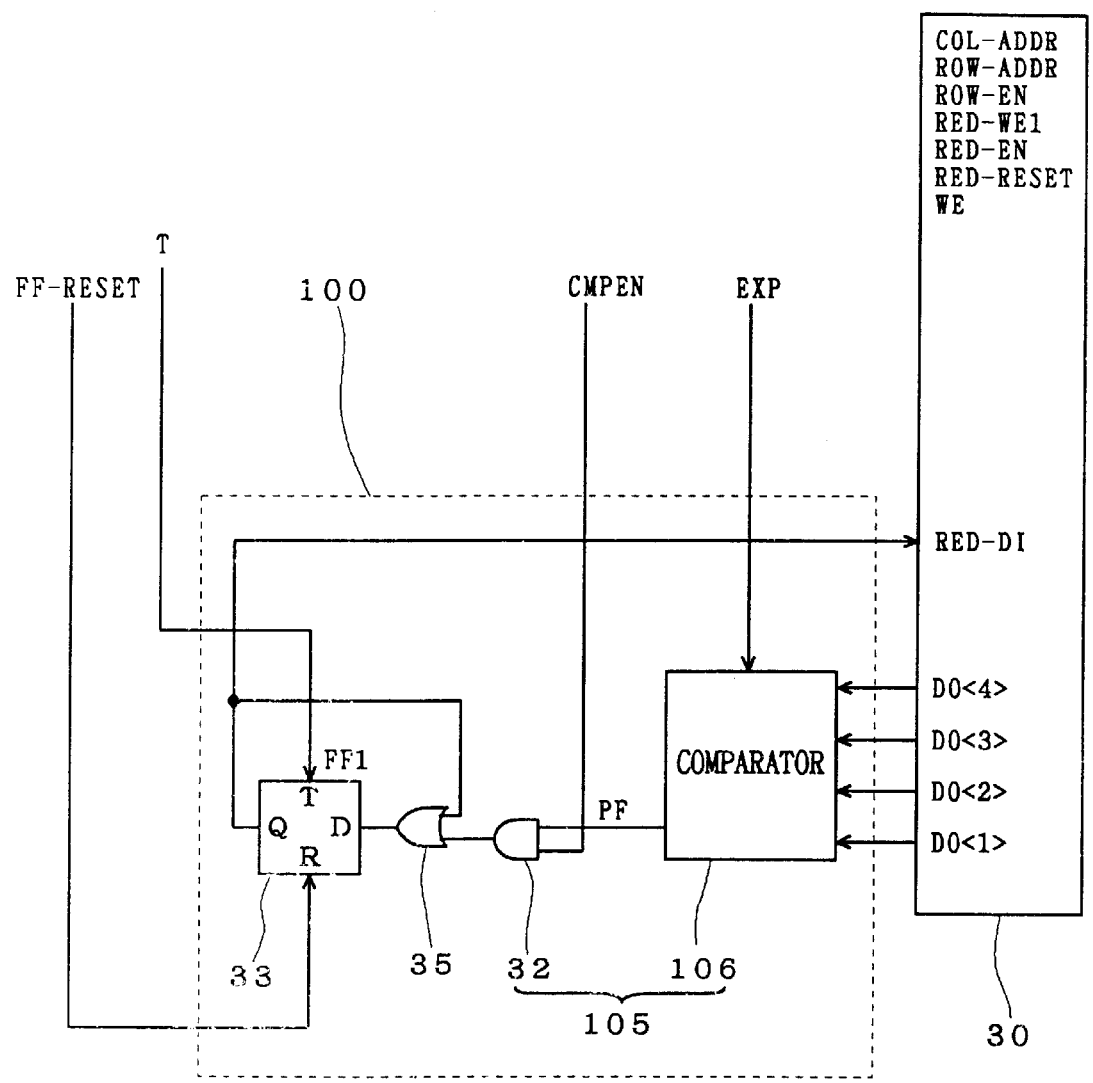
FIG. 41 is a circuit diagram showing the data control circuit of the thirty-third embodiment of the present invention.
Figure 42A:
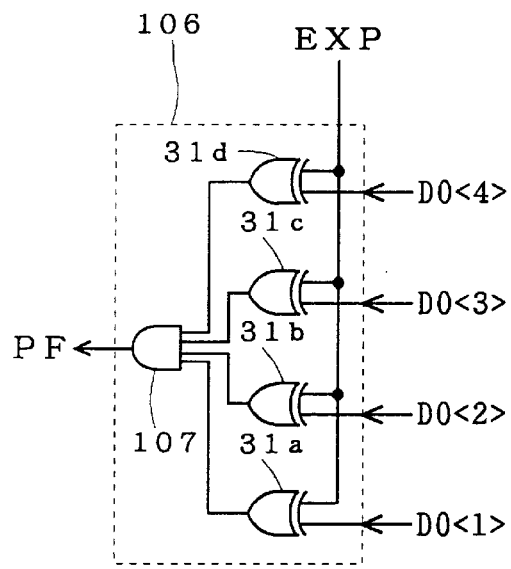
FIGS. 42A–42D are circuit diagrams showing the expected value comparing means in the data control circuit of the thirty-fourth embodiment, the thirty-fifth embodiment and the thirty-sixth embodiment of the present invention.
Figure 42B:
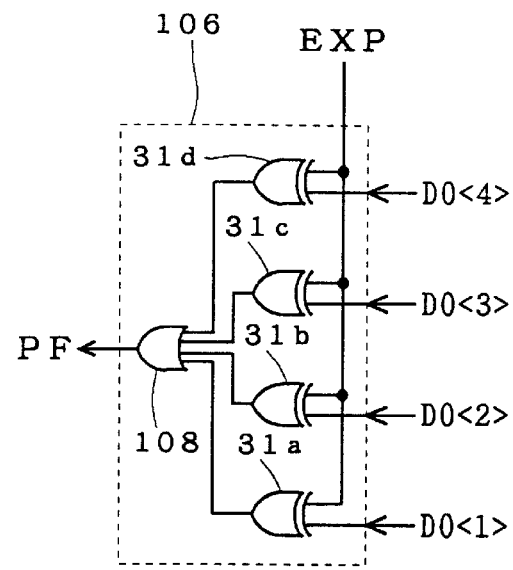
Figure 42C:
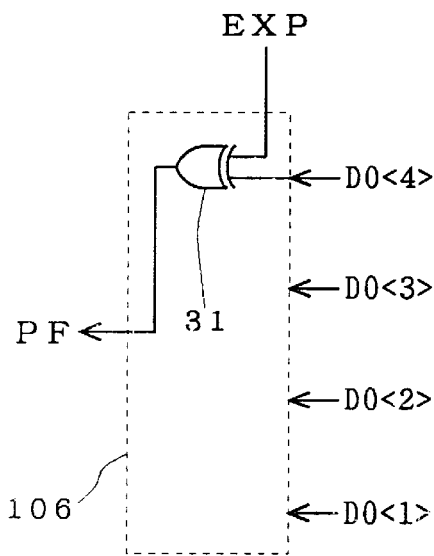
Figure 42D:
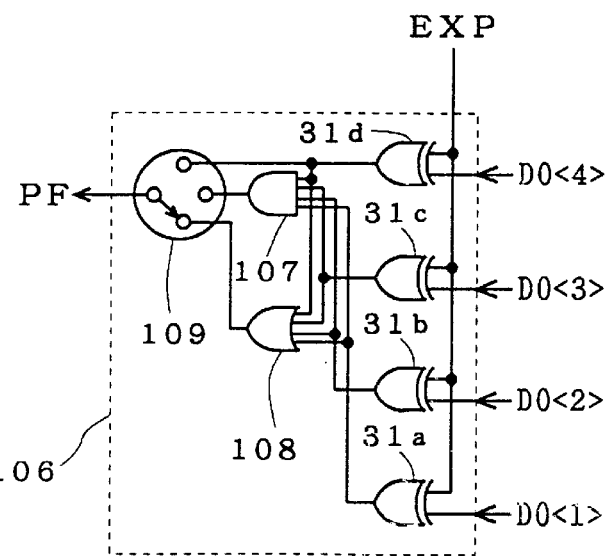

FIG. 41 is a drawing showing the data control circuit 100 for row redundancy control of the memory circuit of the thirty-third embodiment of the present invention. In FIG. 41, same symbols are put to devices having the same function as in the eighth embodiment indicated in FIG. 11. The data control circuit 100 of this embodiment is a circuit diagram showing the relation of connection between the memory circuit 30 of the twenty-sixth embodiment (FIG. 33) and the data control circuit 100 (data generating circuit for control memory cells) corresponding to it, for example.

The data control circuit 100 of this embodiment is provided with an expected value comparing means 105 for outputting the value for control PF by comparing the respective values of 4 readout data terminals DO<i> and the expected value signal, for example, and a logical sum circuit 35 and a flip-flop 33 similar to those explained in the eighth embodiment.

The expected value comparing means 105 is composed of a comparing means 106 as that of the thirty-fourth embodiment, the thirty-fifth embodiment and the thirty-sixth embodiment to be described later, and a logical product circuit 32 similar to that explained in the eighth embodiment.

The flip-flop 33 may be of either asynchronous reset type or synchronous reset type.

<Actions>

Explanation will be given on the actions of the data control circuit 100 constructed as described above. First, it resets OFF to "0" with a reset signal OFF-RESET.

Next, the comparing means 106 compares the expected value signal EXP. with the output from the readout data terminal DO<i> of the memory circuit 30and, if they are different, outputs "1" as value for control PF. If, in this state, clock signal T is given when the compare enable signal CM PEN is "1", "1" is set in the flip-flop 33. Name, if any failure is detected, the output Q of the flip-flop 33 changes from "0" to "1".

Next, explanation will be given on an example of actions of the whole circuit of FIG. 41 with reference to FIG. 33 and FIG. 38.

(1) First, in FIG. 33, the control memory cells R11, R21, R31, R41 are reset by such means as reset signal RED-RESET, etc.

(2) Next, in FIG. 41, the flip-flop 33 of the data control circuit 100 is reset by such means as reset signal OFF-RESET, etc.

(3) And, (the data control circuit 100) properly controls expected value signal EXP., compare enable signal CM PEN, other prescribed signals WE, SEL, etc. in FIG. 41 and writes the data (value for control PF) from the data output terminal Q of the flip-flop 33 in FIG. 41 in the corresponding control memory cell R11 in FIG. 33 each time when it tests the respective memory cells M11, M12, M13, connected to the first internal word line WL1 in FIG. 33.

(4) In this way, (the data control circuit 100) performs actions similar to those in (3) above while switching the word lines WL2, WL3, WL4 in order.

As explained above, in this embodiment, "0", "1", "1", "1" are written in the control memory cells R11, R21, R31, R41 as shown in FIG. 33, in the case of any failure of the second internal word line WL2 itself or failure of the memory cells M21, M22, M23, . . . connected to the second internal word line WL2, for example. Therefore, proper switching of redundancy circuit is performed.

{Thirty-fourth embodiment}

FIG. 42 (a) indicates an example (thirty-fourth embodiment) of the comparing means 106 used in the data control circuit 100 of the thirty-third embodiment indicated in FIG. 41. The comparing means 106 of this embodiment, which is for detecting failure only in the case of failure of all bit lines, is provided with 4 exclusive logical sum circuits (Ex. OR) 31a to 31d corresponding to all readout data terminals DO<1> to DO<4> and a logical product (AND) circuit 107.

In the above construction, in case of any failure such as short-circuiting of internal wire lines WL0 to WL5 with ground, for example, all data outputs relating to those internal wire lines WL0 to WL5 fail.

In this embodiment, comparison is made between the expected value signal EXP. And the respective data outputs DO<1>, DO<2>, DO<3>, DO<4> and, when all of them are found different, the value for control P1 becomes "1". This makes it possible to detect the short-circuit failure of the internal wire lines WL0 to WL5.

There is no need of taking up all data outputs as object of comparison. For example, considering that there is a high possibility of short-circuit failure of word lines WL0 to WL5 in the case of simultaneous failure of DO<4> and DO<1>, the exclusive logical sum circuit regarding DO<3>and DO<2> may be deleted. In this way, the circuit size can be reduced.

{Thirty-fifth embodiment}

FIG. 42 (b) indicates an example (thirty-fifth embodiment) of the comparing means 106 used in the data control circuit 100 of the thirty-third embodiment indicated in FIG. 41. In FIG. 42 (b), same symbols are put to devices having the same function as in the thirty-fourth embodiment indicated in FIG. 42 (a). The comparing means 106 of this embodiment, which is intended for detecting failure of the memory cell connected to either of the internal word lines WL0 to WL5 in FIG. 33, for example, is provided with a 4-input logical sum (OR) circuit 108 instead of the logical product circuit 107 of the thirty-fourth embodiment indicated in FIG. 42 (a).

In the above construction, in case of occurrence of any failure with either one of the memory cells in the memory cell array 11, only the corresponding data output fails.

In this embodiment, comparison is made between the expected value signal EXP. And the value of the respective data outputs DO<1>, DO<2>, DO<3>, DO<4> by the respective exclusive logical sum circuits 31a to 31d and, when no less than one values are different, the value for control P1 becomes "1". This makes it possible to detect any failure of the memory cells M easily.

{Thirty-sixth embodiment}

FIG. 42 (c) indicates an example (thirty-sixth embodiment) of the comparing means 106 used in the data control circuit 100 of the thirty-third embodiment indicated in FIG. 41. The comparing means 106 of this embodiment is provided with one exclusive logical sum (Ex. OR) circuit 31 for detecting failure of only the readout data terminal DO<4> relating to the memory cell connected at the farthest position from the row redundancy control circuit 91, considering the connection wiring between the row redundancy control circuit 91 and the memory cell array 11.

In the above construction, all memory cells beyond the failing point fail in case of breaking of internal word lines WL0 to WL5. Therefore, wire breaking failure can be detected by just testing the memory cell farthest from the row redundancy control circuit 91 and the row decoder 23. Namely, because failure of the memory cell farthest from the row redundancy control circuit 91 can be detected through observation of the readout data terminal DO<4> farthest from the row redundancy control circuit 91, only this data output (DO<4>) may be used as object of comparison as in FIG. 42 (*c*).

With the circuit of FIG. 42 (*c*), failure of short-circuiting of internal wire lines WL0 to WL5 with ground can also be detected. When using the circuit for that purpose, there is no need of taking the data output farthest from the row redundancy control circuit 91 as object of comparison and any of the data outputs such as DO<1>, etc. may be used for the comparison.

As in FIG. 42 (*d*), it will also be all right to add a selector for enabling selection of the functions of FIG. 42 (*a*), (*b*), (*c*).

{Thirty-seventh embodiment}

Figure 43:
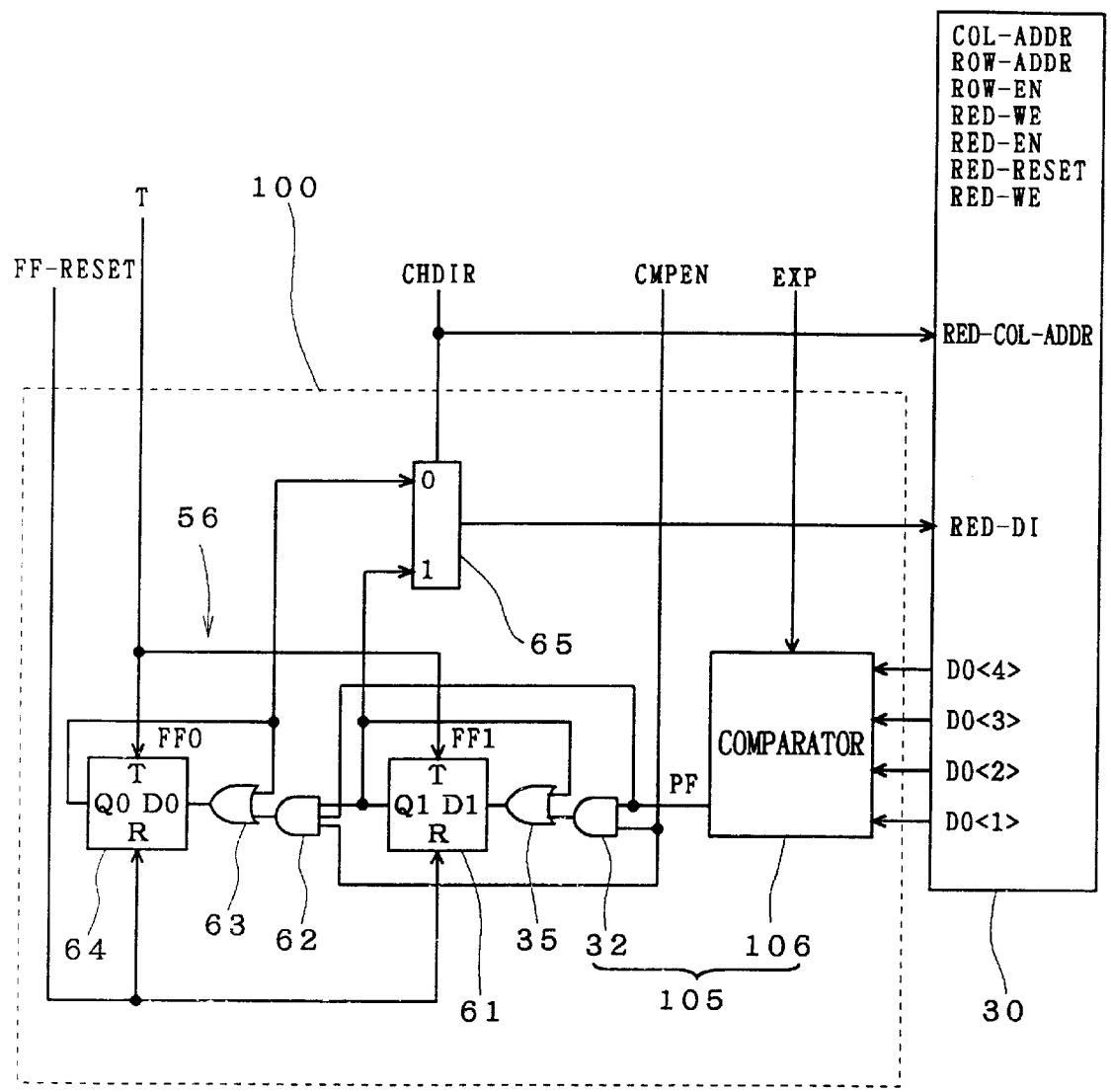
FIG. 43 is a circuit diagram showing the data control circuit of the thirty-seventh embodiment of the present invention.

FIG. 43 is a drawing showing the memory circuit of the data control circuit 100 of the thirty-seventh embodiment of the present invention. In FIG. 43, same symbols are put to devices having the same function as in the thirteenth embodiment indicated in FIG. 18. The data control circuit 100 of this embodiment, though similar to the circuit of the thirteenth embodiment indicated in FIG. 18, has the write data input terminal DI<1> to XKD<4> and the selector 57 in FIG. 18 omitted, and is further provided with the comparing means 106 of either the thirty-fourth embodiment to the thirty-sixth embodiment in place of the exclusive logical sum circuit 31.

In this embodiment, CHDIR signal from outside is supplied to the RED-COL-ADDR terminal of the memory circuit 30. One bit line RBL1 in FIG. 39 and FIG. 36 is selected in the case of CHDIR="1", while the other bit line RBL2 is selected in the case of CHDIR="0".

Next, explanation will be given on the actions of the data control circuit 100. First, (the data control circuit 100) resets the second flip-flop 64 and the first flip-flop 61 to "0" with reset signal OFF-RESET. Here, the comparing means 106 compares the expected value signal EXP. And the readout data terminals DO<1> to DO<4> of the memory circuit 30 with each other, and outputs "1" as value for control PF if they are found different. If, in this state, clock signal T is given when the compare enable signal CM PEN is "1", "1" is set in the first flip-flop 61 and its output data Q1 becomes "1". Namely, if the first failure is detected, the output data Q1 of the first flip-flop 61 changes from "0" to "1".

If clock signal T is given when the output data Q1 of the first flip-flop 61 is "1", the value for control PF is "1" and the compare enable signal CM PEN is "1", "1" is set in the second flip-flop 64 and its output data Q0 becomes "1". Namely, if the second failure is detected, the output data Q0 of the second flip-flop 64 changes from "0" to "1".

The second selector 65 selects the output of the second flip-flop 64 when the signal CHDIR is "0" but of the first flip-flop 61 when CHDIR is "1", as control data for the control memory cells R11 to R41 (FIG. 36).

When using CHDIR by fixing it at "1", actions similar to those of the circuit of FIG. 41 can be made, enabling relieving of failure relating to one word line. However, in case no relieving can be made with actions with CHDIR fixed at "1", i.e. in the case of any failure relating to 2 word lines, the relieving is made with the actions given below. Here, supposition is made of a failure such as short-circuiting or breaking of word lines, the column address COL-ADDR is fixed at "0", for example, for testing.

An example of actions of the entire circuit of FIG. 43 will be explained hereafter by referring to FIG. 36 and FIG. 39. Here, a failure of word line WL2 and word line WL3 is supposed for this explanation.

(1) In FIG. 36, (the data control circuit 100) resets the control memory cells R11, R21, R31, R41, R12, R22, R32, R32 by such means as reset signal RED-RESET, etc.

(2) In FIG. 43, the first flip-flop 61 and the second flip-flop 64 of the data control circuit 100 are reset.

(3) (The data control circuit 100) properly controls expected value signal EXP., compare enable signal CM PEN, other prescribed signal WE, etc. And, in FIG. 36, tests the memory cell for normal operation (M41) connected to the fourth internal word line WL4. And, in FIG. 43, (the data control circuit 100) writes the data (value for control PF) of the data output terminal Q0 of the second flip-flop 64 in the corresponding control memory cell R2 in FIG. 36.

(4) Performs the same actions as in (3) above while switching the object word lines in order as WL3, WL2, WL1 i.e. switching the control memory cells in order as R32, R22, R12.

With the above actions, the control data changes to "1" after the memory cells M31, M21 relating to the internal word lines WL3, WL2 are judged as defective. As a result, "1", "1", "0", "0" are written in R12, R22, R32, R42. In this stage, the first external word line OWL1 is connected to the "0"th internal word line WL0, the second external word line OWL2 is connected to the first internal word line WL1, the third external word line OWL1 to the third internal word line WL3, the fourth external word line OWL4 to the fourth internal word line WL4 respectively, and the failure of the second internal word line WL2 is relieved.

(5) Next, the first flip-flop 61 of the data control circuit 100 is reset.

(6) (The data control circuit 100) properly controls expected value signal EXP., compare enable signal CM PEN, other prescribed signal WE, etc., tests (FIG. 36), in the state of CHDIR="1", the memory cell M01 connected to the first external word line OWL1, and writes the output data (value for control PF) of the first flip-flop 61 in the corresponding control memory cell R11.

(7) Performs the same actions as in (6) above while switching the external word lines in order as OWL2, OWL3, OWL4 i.e. while switching the control memory cells in order as R21, R31, R41.

With the above actions, the control data changes to "1" after the memory cells M31 is judged as defective. As a result, "0", "0", "1", "1", are written in R11, R21, R31, R41. In this stage, the first external word line OWL1 is connected to the "0"th internal word line WL0, the second external word line OWL2 is connected to the first internal word line WL1, the third external word line OWL3 to the fourth internal word line WL4, the fourth external word line OWL4 to the fifth internal word line WL5 respectively, and the failure of the second internal word line WL2 and the third internal word line WL3 is relieved.

{Thirty-eighth embodiment}

Figure 44:
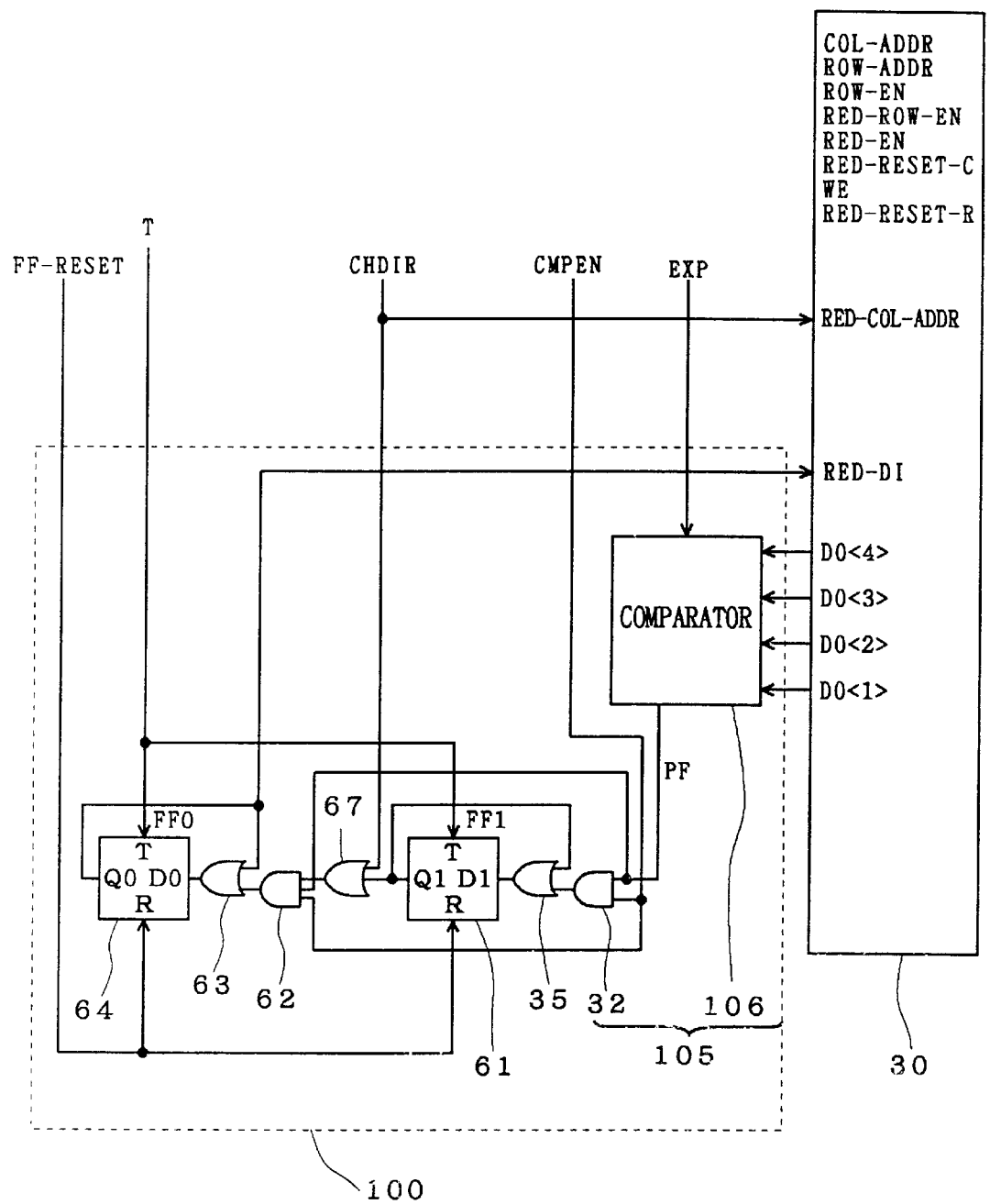
FIG. 44 is a circuit diagram showing the data control circuit of the thirty-eighth embodiment of the present invention.

FIG. 44 is a drawing showing the data control circuit 100 of the memory circuit of the thirty-eighth embodiment of the present invention. In FIG. 44, same symbols are put to devices having the same function as in the fourteenth embodiment indicated in FIG. 19. The data control circuit 100 of this embodiment, though similar to the circuit of the fourteenth embodiment indicated in FIG. 19, has the write data input terminal DI<1> to XKD<4> and the selector 57 in FIG. 19 omitted, and is further provided with the comparing means 106 of either the thirty-fourth embodiment to the thirty-sixth embodiment in place of the exclusive logical sum circuit 31. Namely, this data control circuit 100 is constructed by using one logical sum (OR) circuit 67 in place of the selector 65 in the thirty-seventh embodiment. And, as CHDIR is set for "1', both the second flip-flop 64 and the first flip-flop 61 detect the first failure. The scale of this circuit is smaller compared with that of FIG. 44.

Figure 45:
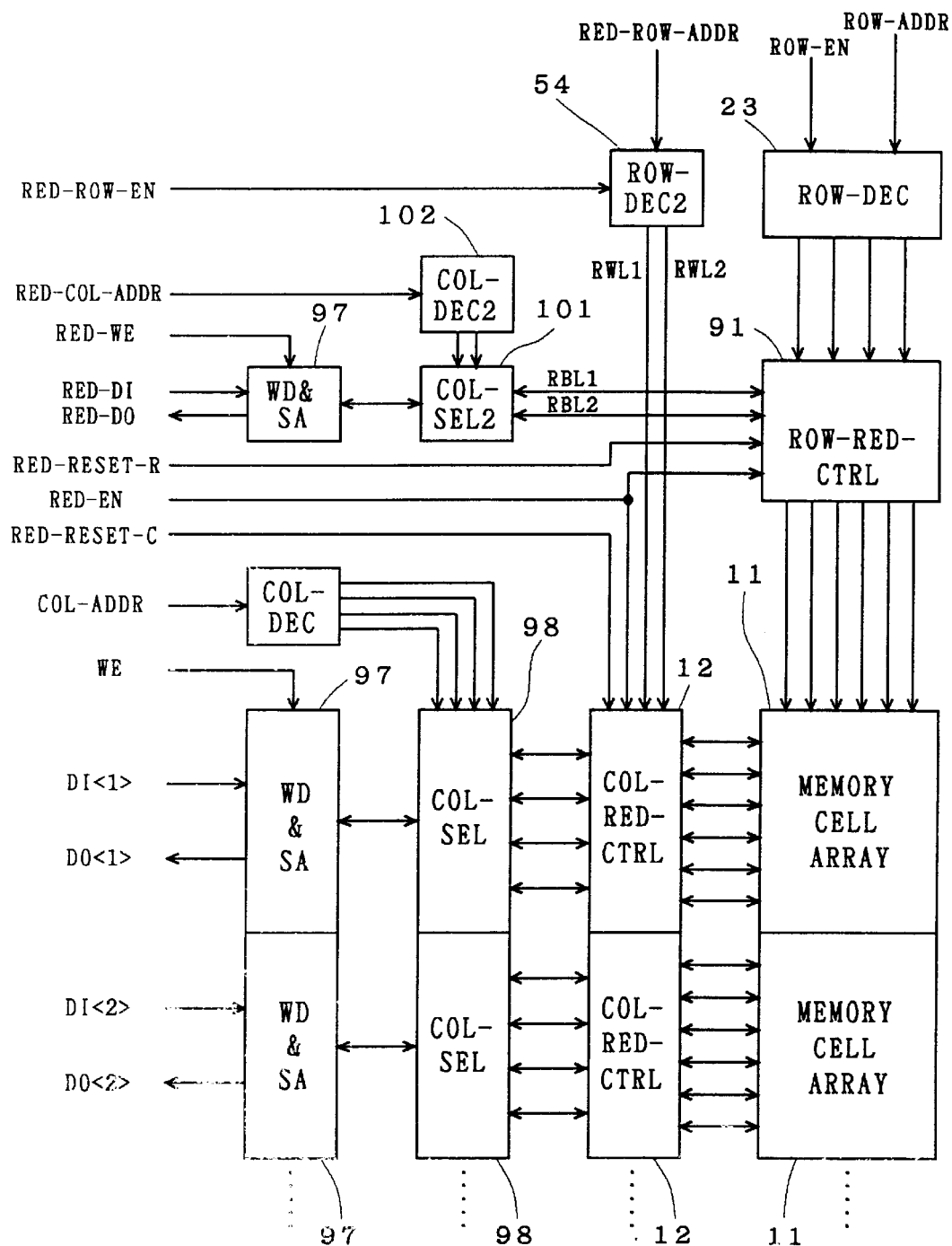
FIG. 45 is a circuit diagram showing the general construction of the memory circuit of the thirty-eighth embodiment of the present invention.

FIG. 45 is a general drawing of the memory circuit with redundancy function in the case where the column redundancy control circuit 12 and the row redundancy control circuit ROW-RED-CTRL are applied at a time, in this embodiment. In FIG. 45, the circuit of FIG. 17 and that of FIG. 39 are fused.

As shown in FIG. 45, in the case where the signal given the redundancy enable signal line RED-EN exists in both the column redundancy control circuit 12 and the row redundancy control circuit 91, this redundancy enable signal line RED-EN can be connected commonly to the both redundancy control circuits 12, 91.

When performing the switching of the column redundancy control circuit 12 and the row redundancy control circuit 91 sequentially, the reset signal RED-RESET (RED-RESET-R, RED-RESET-C) is supplied independently to the respective redundancy control circuits 12, 91.

When relieving failure on either side only, it will be all right to supply the reset signal RED-RESET (RED-RESET-R, RED-RESET-C) from the common connecting line.

{Thirty-ninth embodiment}

Figure 46:
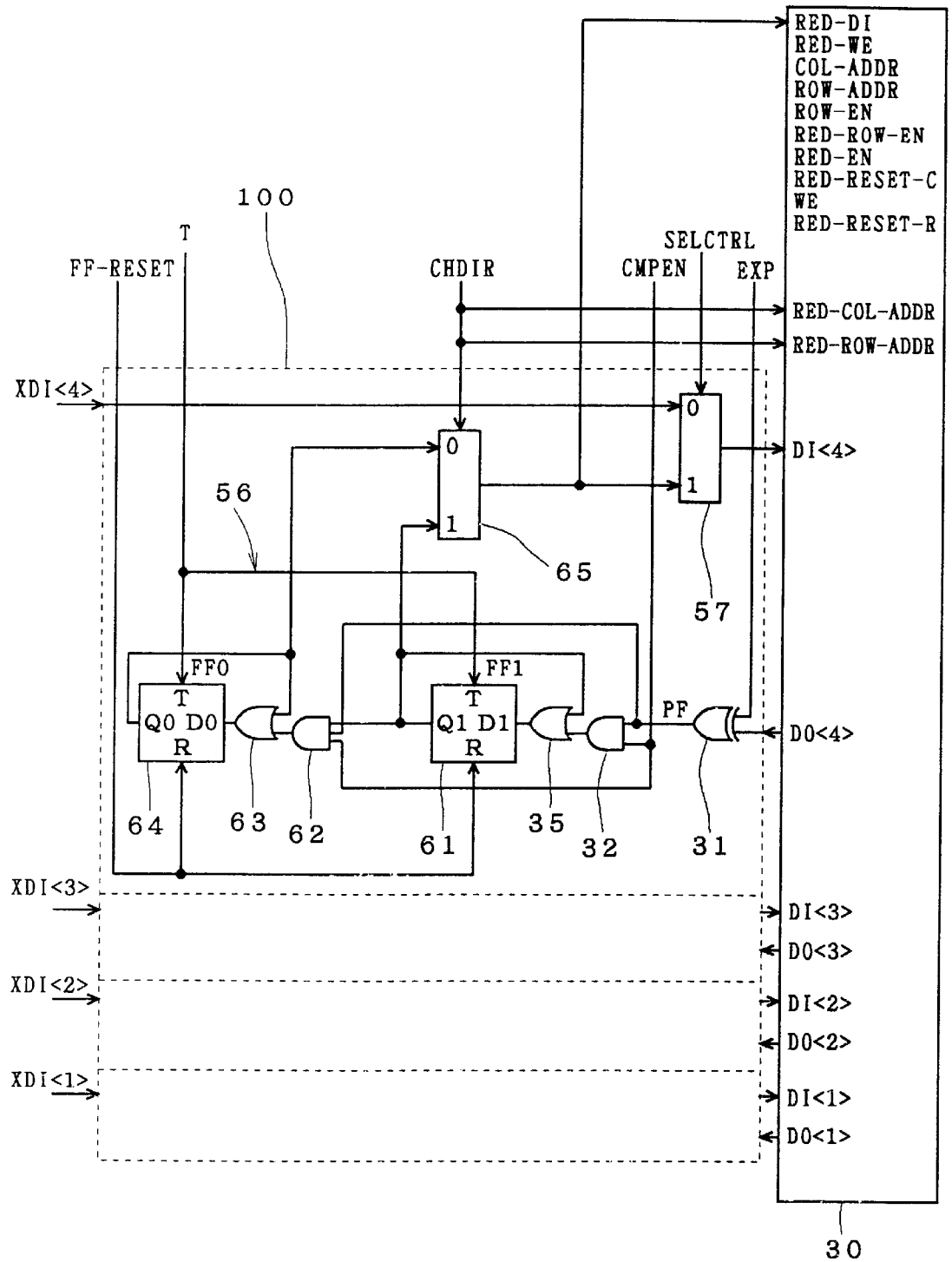
FIG. 46 is a circuit diagram showing the data control circuit of the thirty-ninth embodiment of the present invention.

FIG. 46 is a drawing showing the data control circuit 100 of the memory circuit of the thirty-ninth embodiment of the present invention. In FIG. 46, same symbols are put to devices having the same function as in the thirteenth embodiment indicated in FIG. 18. In the data control circuit 100 of this embodiment, the column redundancy control circuit 12 and the row redundancy control circuit ROW-RED-CTRL are applied at a time. Though similar to the circuit of the thirteenth embodiment indicated in FIG. 18, the data control circuit 100 of this embodiment is different from that of the thirteenth embodiment in that the output from the selector 65 is supplied to the RED-DI terminal of the memory circuit 30 and that the compare enable signal CM PEN is supplied not only to the row redundancy address terminal RED-ROW-ADDR but also to the column redundancy address terminal RED-COL-ADDR.

And, in this embodiment, the comparing means 106 of the thirty-sixth embodiment indicated in FIG. 42 (c) is applied to the row redundancy control circuit of the thirty-seventh embodiment (FIG. 43).

According to this embodiment, the data control circuit 100 for the write data input terminal D1<4> of the fourth bit and the readout data DO<4> is used commonly to the column redundancy control circuit 12 and the row redundancy control circuit 91. This enables reduction of the circuit size.

Figure 47:
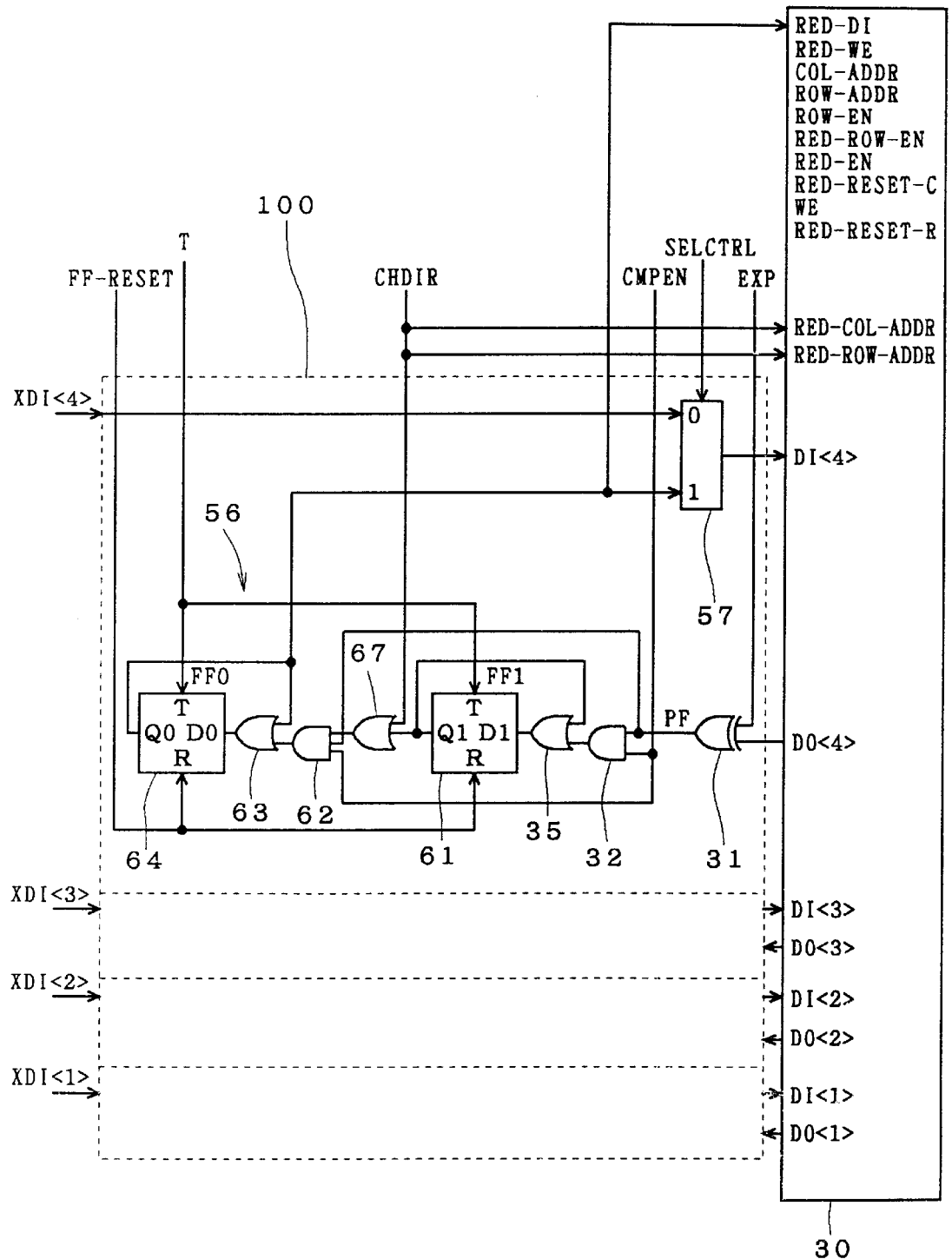
FIG. 47 is a circuit diagram showing the data control circuit of the thirty-ninth embodiment of the present invention.

The data control circuit 100 of FIG. 47 has the same function as that of FIG. 46 but uses a logical sum (OR) circuit 67 in place of the selector 65 controlled by signal CHDIR, and detects the first failure with both the second flip-flop 64 and the first flip-flop 61 by setting CHDIR as "1". In this embodiment, the circuit size is smaller compared with that of FIG. 46.

{Fortieth embodiment}

Figure 48:
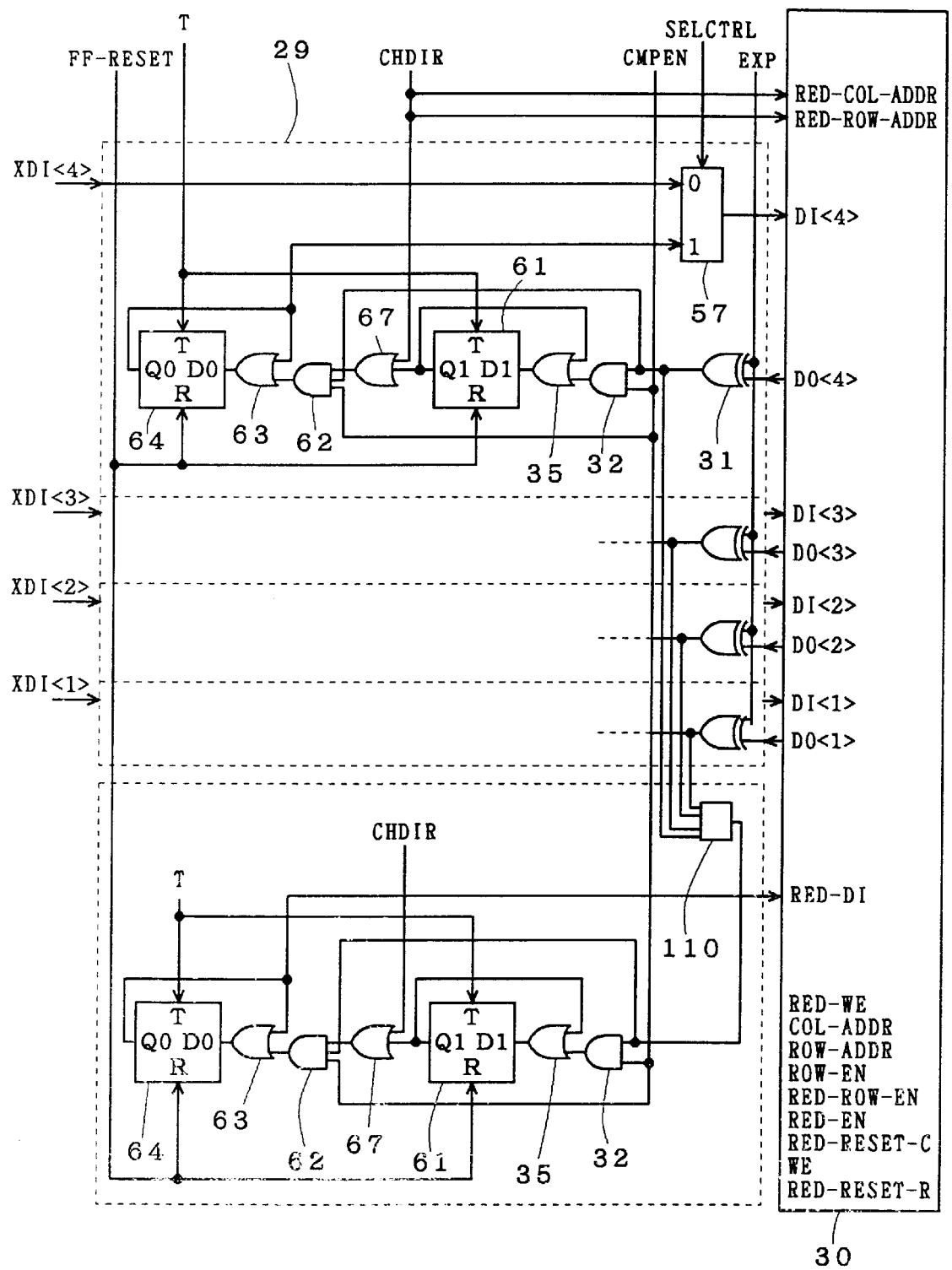
FIG. 48 is a circuit diagram showing the data control circuit of the fortieth embodiment of the present invention.

FIG. 48 is a drawing showing the data control circuit 100 of the memory circuit of the fortieth embodiment of the present invention. In FIG. 48, same symbols are put to devices having the same function as in the thirty-ninth embodiment indicated in FIG. 46. In the data control circuit 100 of this embodiment, circuits similar to those of the thirty-ninth embodiment indicated in FIG. 46 are applied for each of the column redundancy control circuit 29 and the row redundancy control circuit 100, but the exclusive logical sum circuit 31 is diverted as part of the expected value comparing means of the row redundancy control circuit 100, to reduce the circuit size.

Symbol 110 in FIG. 48 is a device connected to the exclusive logical sum circuit 31 relating respectively to the write data input terminals DI<1>to DI<4> of the memory circuit 30 and, in the case where a logical product (AND) circuit is used as such device, the comparing means 106 of the thirty-fourth embodiment (FIG. 42 (a)) is constructed. On the other hand, when a logical sum (OR) circuit is used as device 110, the comparing means 106 of the thirty-fourth embodiment (FIG. 42 (b)) is constructed.

Moreover, in the row redundancy control circuit 100, the selector corresponding to the selector 57 of the column redundancy control circuit 29 is omitted.

{Forty-first embodiment}

Figure 49:
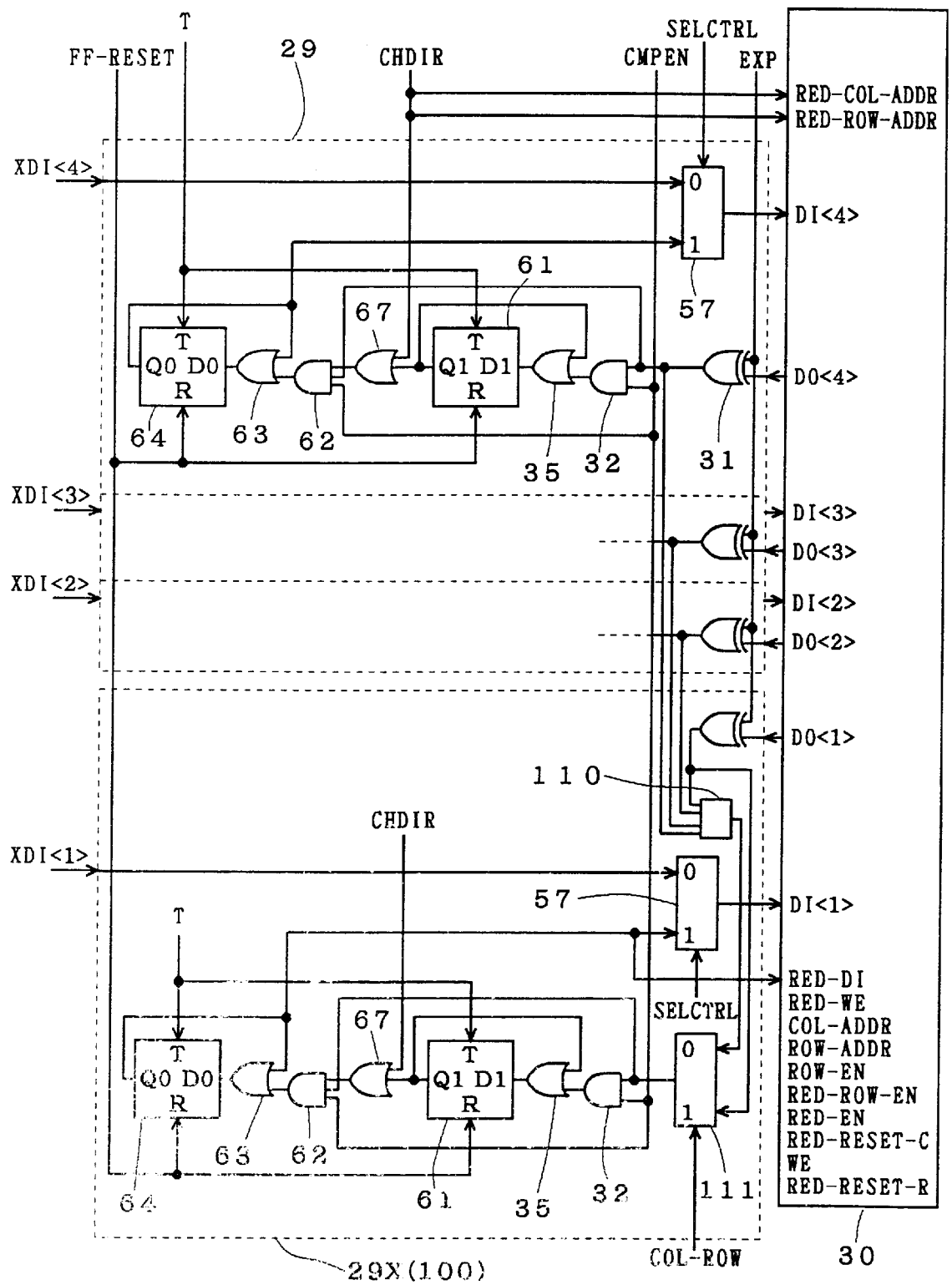
FIG. 49 is a circuit diagram showing the data control circuit of the forty-first embodiment of the present invention.

FIG. 49 is a drawing showing the data control circuit 29, 100 of the memory circuit of the forty-first embodiment of the present invention. In FIG. 49, same symbols are put to devices having the same function as in the fortieth embodiment indicated in FIG. 48. The circuit of this embodiment, though similar to that of the fortieth embodiment indicated in FIG. 48, is constructed in a way to divert the exclusive logical sum circuit 31 of the column redundancy control circuit 29 as part of the expected value comparing means of the row redundancy control circuit 100 and also divert one (29X) of the column redundancy control circuit 29 as the row redundancy control circuit 100 by switching of mode. The mode switching at that time can be made by switching the selector III with a control signal COL-ROW from outside.

With such construction, it becomes possible to reduce the circuit size compared with the circuit of FIG. 48.

{Forty-second embodiment}

Figure 50A:
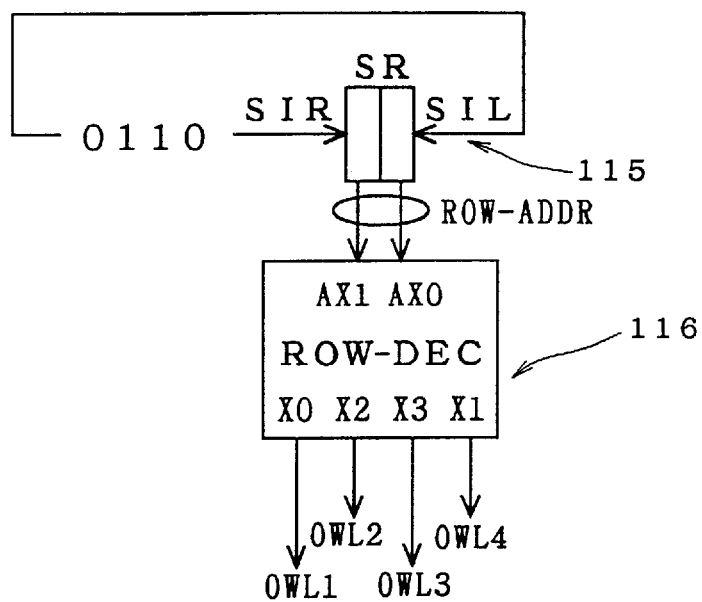
FIGS. 50A–50B are circuit diagrams showing the address assigning circuit of the forty-second embodiment of the present invention.
Figure 50B:
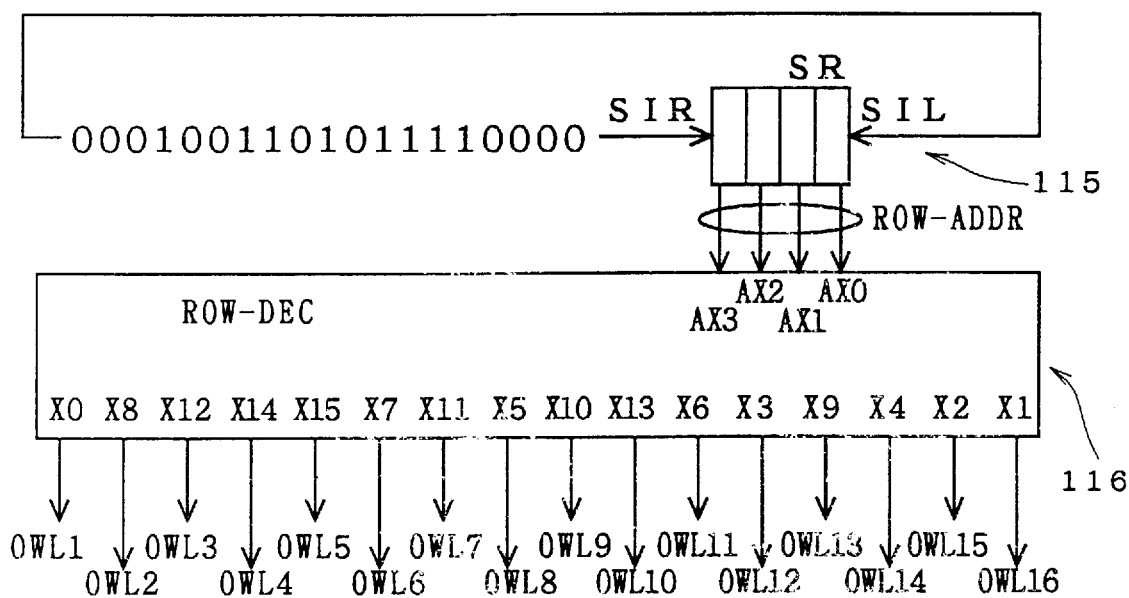

FIG. 50 (a) is a drawing showing the address assigning circuit of the forty-second embodiment of the present invention. The address assigning circuit of this embodiment is for giving address assigning signal ROW-ADDR to the row decoder (ROW-DEC) 23 of the memory circuit with row redundancy function explained in the thirtieth embodiment (FIG. 38) or the thirty-first embodiment (FIG. 39). Namely, the address assigning circuit of this embodiment, connected to a plural number (4) of external word lines OWL1 to OWL4 of the memory circuit 30 for assigning those external word lines in order from OWL1 to OWL4, is provided with a full-cycle serial data output circuit 115 for outputting full-cycle serial data as pseudo-random number having a certain cycle based on a preset calculation formula, and a decoder 116 for specifying the external word lines OWL1 to OWL4 one after another based on the output information from the full-cycle serial data output circuit 115.

The full-cycle serial data output circuit 115, which is a 2-bit serial shift register (SR), is provided with a SIL terminal for performing shift-in with left shift and a SIR terminal for performing shift-in with right shift, and the data "01100" from prescribed group of random number generating logical circuits (not illustrated) is periodically shifted in this circuit. As a result, the full-cycle serial data output circuit 115 gives 2-bit data to the decoder 116 in the order of "00"~"10"~"11"~"01" at the time of left shift (SIR) but in the order of "01"~"11"~"10"~"00" at the time of right shift (SIL).

Figure 51:
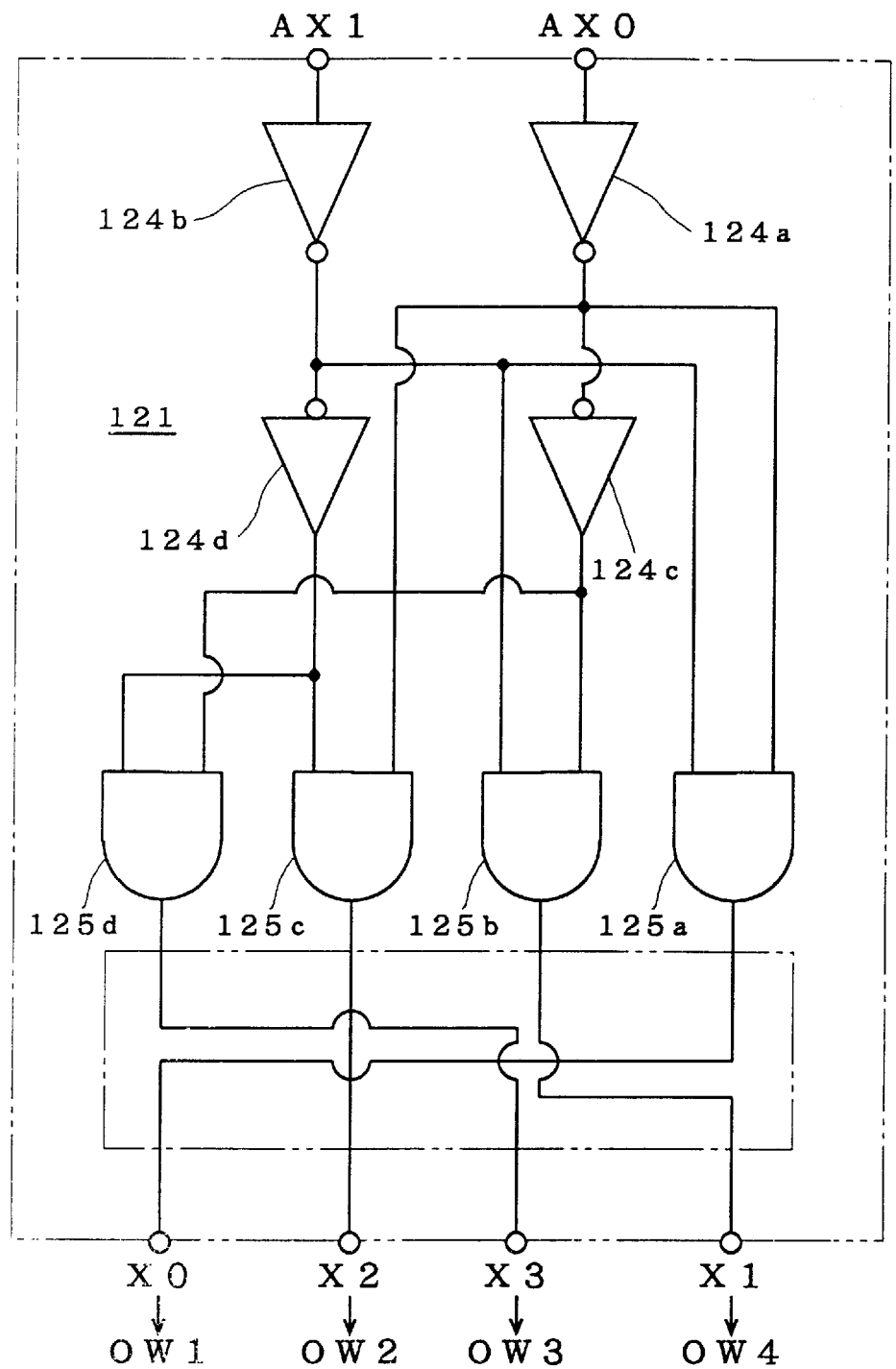
FIG. 51 is a circuit diagram showing the internal construction of the decoder in the address assigning circuit of the forty-third embodiment of the present invention.

The decoder 116, which is a 2-bit input 4-bit output decoder, is for assigning 4 external word lines OWL1 to OWL4 in order by receiving 2-bit data from the full-cycle serial data output circuit 115, is provided, as shown in FIG. 51, with input terminals AX0, AX1 for 2 bits connected to the full-cycle serial data output circuit (115), output terminals X0, X2, X3, X1 for 4 bits connected to the external word lines OWL1 to OWL4, a logical circuit unit 121 for converting, and a bit order changing wiring 122 for rearranging the 4-bit signal from the logical circuit unit 121 in the order of output terminals X0, X2, X3, X1.

The logical circuit unit 121 is of general type constructed with 4 inverters 124a to 124d and 4 logical product (AND) circuits 125a to 125d. Here, the logical circuit unit 121 outputs the value "1" serially from the first logical product circuit 125a on the extreme right to the fourth logical product circuit 125d on the extreme left when data is input in the order of "00"~"01"~"10"~"11" about the values given to the input terminal AX0, AX1.

The bit order changing wiring 122 outputs data at the output terminal Xo on the extreme left when it received the value "1" from the first logical product circuit 125a on the extreme right (namely when the value "00" is given to the input terminals AX0, AX1), outputs data at the output terminal XI on the extreme right when it received the value "1" from the second logical product circuit 125b at the second position from the right of the logical circuit unit 121 (namely when the value "01" is given to the input terminals AX0, AX1), outputs data at the third output terminal X2 from the right when it received the value "1" from the third logical product circuit 125c in the third position from the right (namely when the value "10" is given to the input terminals AX0, AX1), and outputs data at the second output terminal X2 from the right when it received the value "1" from the fourth logical product circuit 125d on the extreme left of the logical circuit unit 121 (namely when the value "11" is given to the input terminals AX0, AX1).

<Actions>

Explanation will be given on the actions of the address assigning circuit constructed as above. When making increments to the external word lines OWL1 to OWL4 i.e. addressing those lines in the order of OWL1~OWL2~OWL3~OWL4, (this address assigning circuit) performs shifts "00110" in the full-cycle serial data output circuit 115 by right shift from the SIR terminal. At this time, the address (AX1, AX0) from the full-cycle serial data output circuit 115 changes as "00", "10", "11", "01" in order. In the decimal expression, it means that the address changed in the order of No. 0, No. 2, No. 3, No. 1. The "0"th output terminal X0 is activated when No. 0 is specified, the second output terminal X2 is activated when No. 2 is specified, the third output terminal X3 is activated when No. 3 is specified, and the first output terminal XI is activated when No. 1 is specified.

Here, in this embodiment, in which the first external word line OWL1 is connected to the "0"th output terminal X0, the second external word line OWL2 to the second output terminal X2, the third external word line OWL3 to the third output terminal X3, the fourth external word line OWL4 to the first output terminal X1, increments can be made easily in the order of OWL1~OWL2~OWL3~OWL4, even with an assignment of addresses made in the order of X0~X2~X3~X1. Therefore, it becomes possible to apply efficient test using full-cycle series at the time of RAM test for the switching of redundancy circuit. To be concrete, it produces an effect of reducing test signals and test patterns.

When making decrements to the external word lines i.e. addressing those lines in the order of OWL4~OWL3~OWL2~OWL1, (the address assigning circuit) performs shifts "01100" in the full-cycle serial data output circuit 115 by left shift from the SIL terminal. At that time, the address (AX1, AX0) specified by the full-cycle serial data output circuit 115 changes in the order of "01", "11", "10", "00". In the decimal expression, it means that the address changed in the order of No. 1, No. 3, No. 2, No. 0. As a result, decrement addressing is realized. When no decrement addressing is required, there is no need of using any bi-directional serial shift register or bi-directional scan path circuit.

{Forty-third embodiment}

Figure 52:
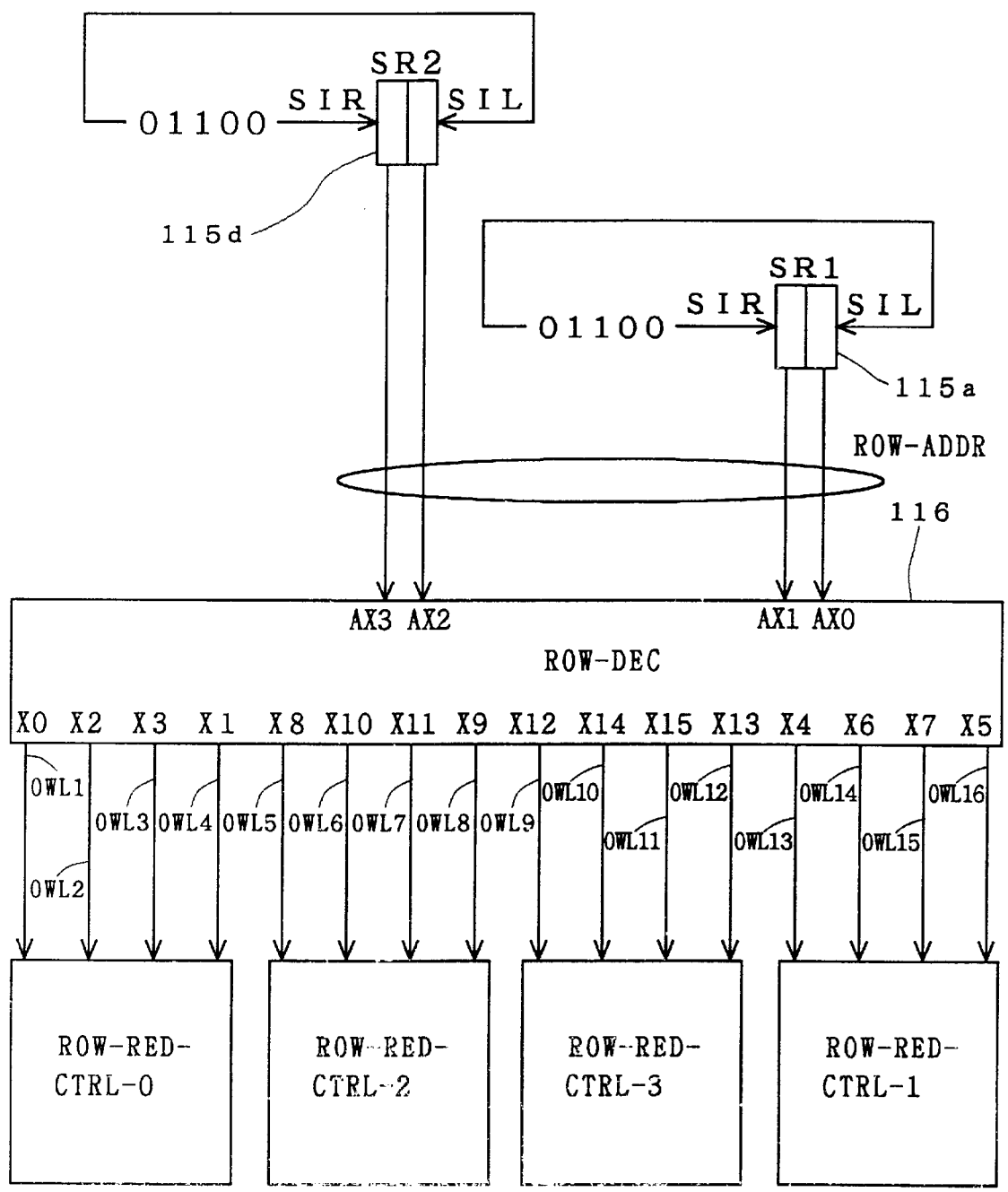
FIG. 52 is a circuit diagram showing the address assigning circuit of the forty-third embodiment of the present invention.

FIG. 52 is a drawing showing the address assigning circuit of the forty-third embodiment of the present invention. The address assigning circuit of this embodiment is one which corresponding to the memory circuit with row redundancy function as explained in the thirty-second embodiment (FIG. 40), for example, and uses a 4-input 16-output type decoder as decoder 116.

Here, the row address ROW-ADDR is supplied from 2 serial shift registers (full-cycle serial data output circuit) 115a (SR1), 115b (SR2) for upper addresses (AX3, AX2) and lower addresses (AX1, AX0). Those 2 serial shift registers are constructed in a way to be able to independently control the shift motion. The 2 serial shift registers may be scan path circuits.

The upper addresses (AX3, AX2) are used for selecting one of a plural number (4) of row redundancy control circuits ROW-RED-CTRL-0 to 3. For example, ROW-RED-CTRL-0 is selected when (AX3, AX2) are (0, 0), ROW-RED-CTRL-1 is selected when (AX3, AX2) are (0, 1), ROW-RED-CTRL-2 is selected when (AX3, AX2) are (1, 0), and ROW-RED-CTRL-3 is selected when (AX3, AX2) are (1, 1), respectively. Namely, in this embodiment, (the address assigning circuit) makes control in a way to perform switching of redundancy circuits to the respective RAMs, considered as a group of 4 RAMS having 4 word lines, by selecting the row redundancy control circuits ROW-RED-CTRL with the upper addresses and controlling and switching the respective row redundancy control circuits ROW-RED-CTRL.

The lower addresses (AX1, AX0) are used for selecting one of a plural number of external word lines OWL1 to OWL16 in the respective row redundancy control circuits.

(The address assigning circuit) shifts in the full-cycle series "00110" by right shift from the SIR terminal of the first shift register 115a (SR1). At this time, the address (AX1, AX0) changes in the order of "00"~"10"~"11"~"01".

In the same way, (the address assigning circuit) shifts in the full-cycle series "00110" by right shift from the SIR terminal of the first shift register 115b (SR2). At this time, the address (AX3, AX2) changes in the order of "00"~"10"~"11"~"01".

If, after a full cycle of addresses by the first shift register 115a (SR1), the action of renewing addresses with the second shift register 115b (SR2) is repeated, the addresses (AX3, AX2, AX1, AX0) change as follows: (0, 0, 0, 0)~(0, 0, 1, 0)~(0, 0, 1, 1)~(0, 0, 0, 1)~(1, 0, 0, 0)~(1, 0, 1, 0)~(1, 0. 1, 1)~(1, 0. 0. 1)~(1, 1, 0. 0)~(1, 1, 1, 0)~(1, 1, 1, 1)~(1, 1, 0, 1)~(0, 1, 0, 0)~(0, 1, 1, 0)~(0, 1, 1, 1)~(0, 1, 0, 1)

In the decimal numbers, it means that the addresses change in the order of

0~2~3~1~8~10~11~9~12~14~15~13~4~6~7~5. The decoder outputs X0, X2, X3, X1, X8, X1, X 11, X9, X12, X14, X15, X13, X4, X6, X7, X5 are disposed in this order.

By adopting this construction, it becomes possible to apply efficient test using full-cycle series at the time of RAM test for the switching of redundancy circuit. To be concrete, it produces an effect of reducing test signals and test patterns.

To make addressing in the opposite order, making left shift in of the full-cycle series "00110" from the SIL terminal will be enough.

A plural number of row redundancy control circuits ROW-RED-CTRL may be arranged in whatever order. They may be disposed in the order of production made by the full-cycle series as shown in FIG. 52 or may be arranged in the growing order of upper addresses (ROW-RED-CTRL0~1~2~3).

{Forty-fourth embodiment}

Figure 53:
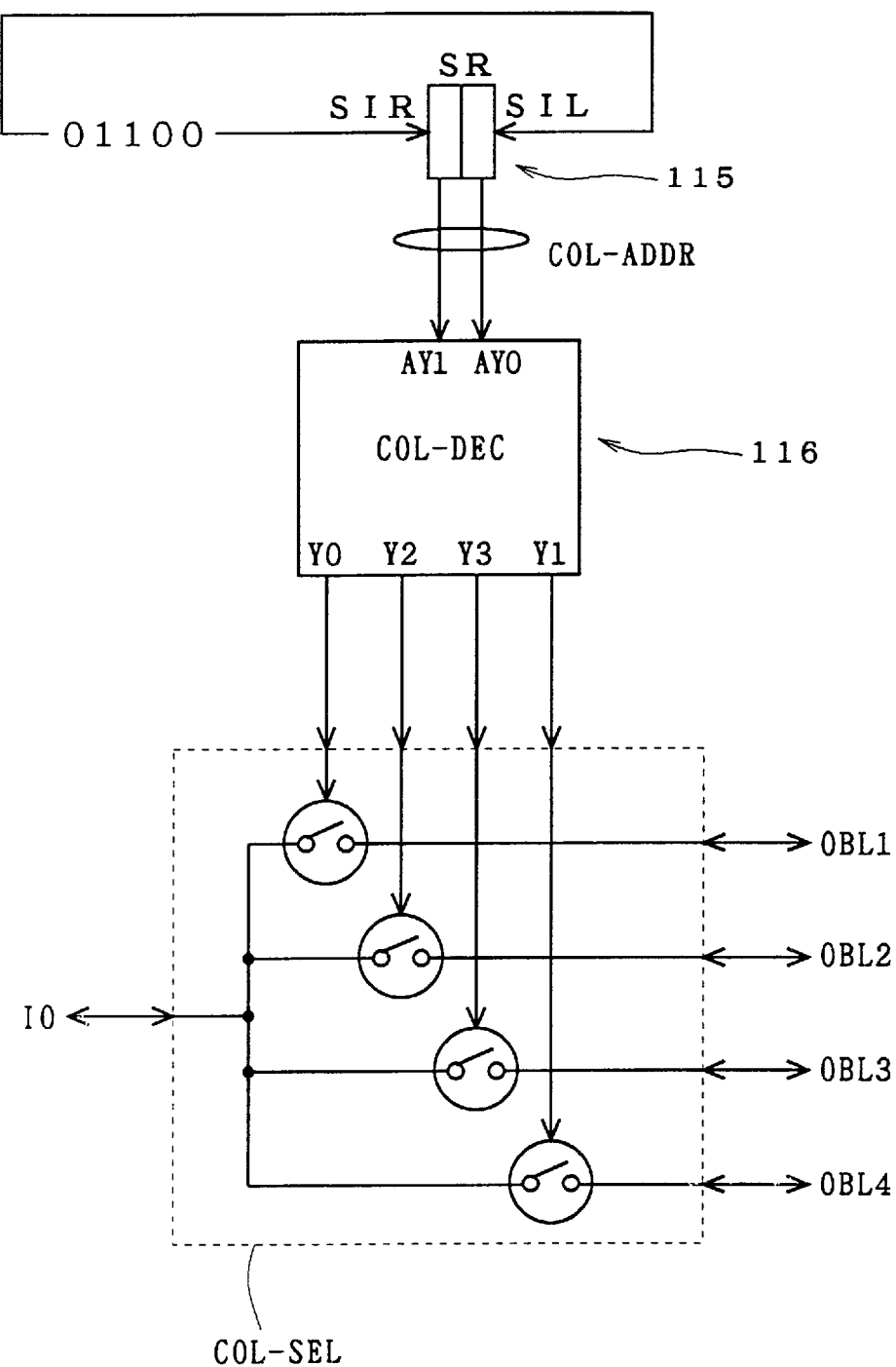
FIG. 53 is a circuit diagram showing the address assigning circuit of the forty-fourth embodiment of the present invention.
Figure 54:
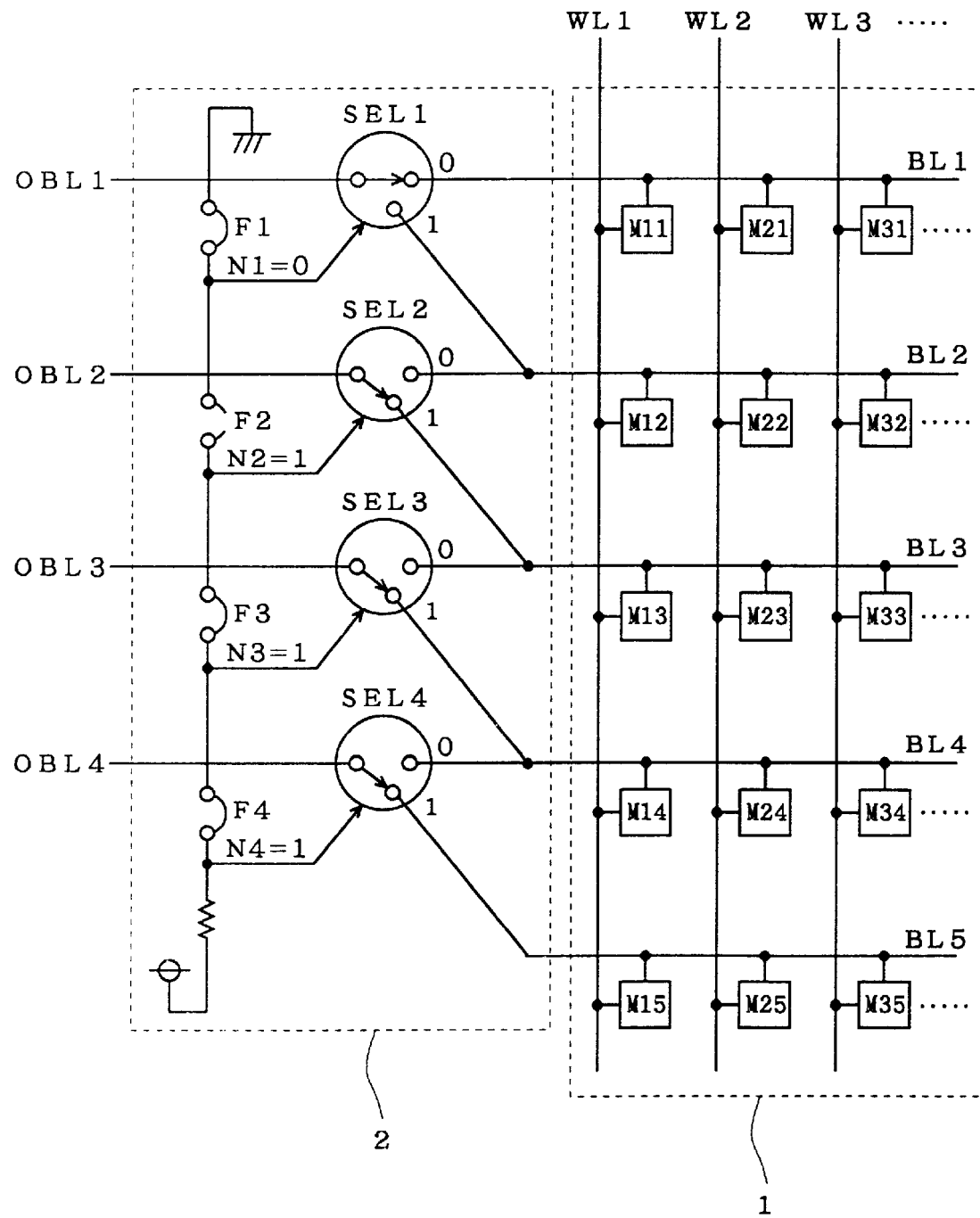
FIG. 54 is a circuit diagram showing the memory circuit of the first prior art.
Figure 55:
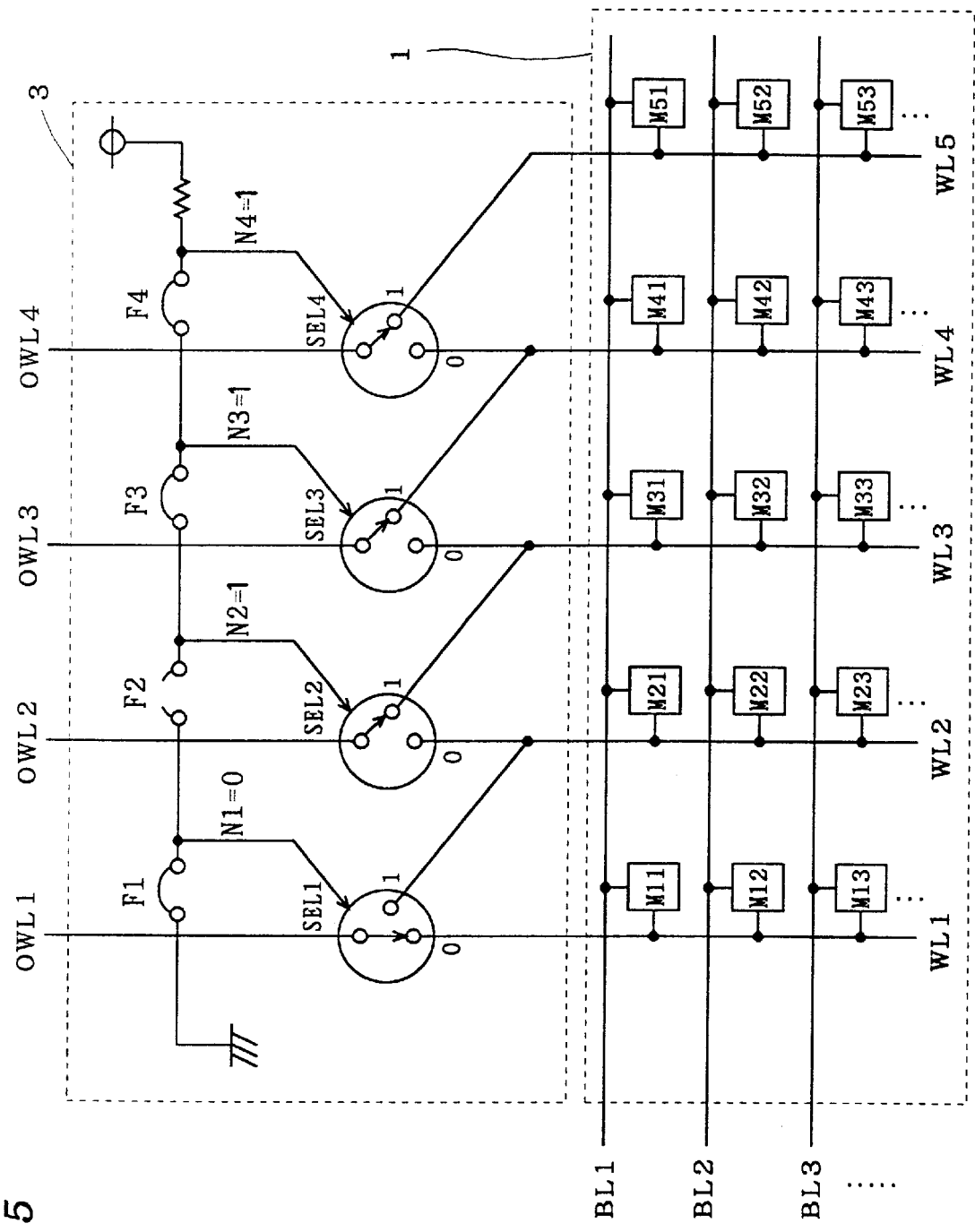
FIG. 55 is a circuit diagram showing the memory circuit of the second prior art.

FIG. 53 is a drawing showing the address assigning circuit of the forty-fourth embodiment of the present invention. In FIG. 53, same symbols are put to devices having the same function as in the forty-second embodiment indicated in FIG. 42. The address assigning circuit of this embodiment, which is used in correspondence to the memory circuit with column redundancy function indicated in FIG. 7, FIG. 8, FIG. 9 or FIG. 10, is a 2-input 4-output decoder 116 (column decoder) identical to that explained in the forty-second embodiment (FIG. 50 (*a*)). And, a column selector 117 is connected between the decoder 116 and the external bit lines OBL1 to OBL4.

In this embodiment, when making increments to the external word lines OWL1 to OWL4 i.e. addressing those lines in the order of OWL1~OWL2~OWL3~OWL4, (this address assigning circuit) performs shifts "(00110" in the full-cycle serial data output circuit 115 by right shift from the SIR terminal. At this time, the address (AY1, AY0) changes as "00", "10", "11", "01" in order. In the decimal expression, it means that the address changed in the order of No. 0, No. 2, No. 3, No. 1. The "0"th output terminal Y0 is activated when No. 0is specified, the second output terminal Y2 is activated when No. 2 is specified, the third output terminal Y3 is activated when No. 3 is specified, and the first output terminal Y1 is activated when No. 1 is specified, by the column selector 117. OBL1 is selected with Y0, OBL2 with Y2, OBL3 with Y3 and OBL1~BL4 with Y1.

With such construction, it becomes possible to apply efficient test using full-cycle series at the time of RAM test for the switching of redundancy circuit.

To be concrete, (this construction) produces effects of reducing test signals and reducing test patterns.

When making decrements to the external word lines OBL1 to OBL4 i.e. addressing those lines in the order of OWL4~OWL3~OWL2~OWL1, (the address assigning circuit) performs shifts "01100" in the full-cycle serial data output circuit 115 by left shift from the SIL terminal. At that time, the address (AY1, AY0) changes in the order of "01", "11","10", "00". In the decimal expression, it means that the address changed in the order of No. 1, No. 3, No. 2, No. 0. As a result, decrement addressing is realized. When no decrement addressing is required, there is no need of using any bi-directional serial shift register or bi-directional scan path circuit.

{Modified embodiments}

(1) In the first embodiment, the second embodiment, the third embodiment, the fourth embodiment, the twentieth embodiment, the twenty-sixth embodiment, the twenty-seventh embodiment, the twenty-eighth embodiment and the twenty-ninth embodiment, in which control memory cells C11 to C14 were provided with resetting function, it is also all right to use those without resetting function instead. In this case, resetting is made by writing "0" in all the control memory cells R11 to R41 from the external bit lines OBL1 to OBL4 when the word line RWL1 is activated. After the resetting, all selectors are switched to the input "0" side and, therefore, correspondence is established between the first external bit line OBL1 and the first internal bit line BL1, between the second external bit line OBL2 and the second internal bit line BL2, between the third external bit line OBL3 and the third internal bit line WL3, and between the fourth external bit line OBL4 and the fourth internal bit line BL4 respectively.

Moreover, in the second embodiment, the third embodiment, etc., it may also be all right to use control memory cells which do not necessarily have any clear resetting function. For example, it will be all right to design the memory cells themselves in such a way that the control memory cells C11 to C14 may all be reset to "0" at closing of power. For example, if the respective control memory cells C11 to C14 of the group of control memory cells 17 are designed to be asymmetrical to "0", "1" of data with a change in the size of transistor, for example, the control memory cells C11 to C14 can all be reset to "0" at closing of power.

Furthermore, the control memory cells C11 to C14 may also be constructed with memory cells for programmable ROM (UVEPROM) erasable by irradiation of light (ultraviolet ray). In this case, resetting can be made by irradiation of light.

Still more, when memory cells without resetting function are used as control memory cells C11 to C14 in the third embodiment, resetting of the respective control memory cells C11 to C14 becomes possible by setting "0" in the redundancy enable signal line RED-EN, switching the selectors SEL1 to SEL4 of the group of selectors 16 to the "0" side, activating the word line RWL1 and writing "0" in the control memory cells C11 to C14 from the external bit lines OBL1 to OBL4.

Yet more, when memory cells without resetting function are used in the fourth embodiment, resetting can be made by writing "0"in the control memory cells C11 to C14, C21 to C24 from the external bit lines OBL1 to OBL4 when the word lines RWL1, RWL1 are active.

(2) Even when no control data generating circuit as explained in the respective embodiments is provided, it is possible to make switching of redundancy circuit by using column redundancy control circuit or row redundancy control circuit, if only some writing means of control data is available.

For example, by applying a test circuit of scan path system to the RAM of FIG. 45, it becomes possible to test the memory cell array 11. Based on the results of this test, the control data for switching redundancy circuit can be written in the column redundancy control circuit and the row redundancy control circuit by using scan path. In this case, the scan path actions for RAM test or writing of control data become complicated. Therefore, such test and switching of redundancy circuits may be made by means of micro controller or micro computer, etc. By controlling with micro controller or micro computer, it becomes possible to apply test algorithms of high degree to RAM test and increase failure detection rate, enabling more appropriate switching of redundancy circuits.

It is also all right to control the test circuit of scan path system using the scan registers with control data generating function according to the present invention (FIGS. 12, 15, 20, 21, 22, 23, 24, 25, 28, 29, 31) with micro controller or micro computer.

Moreover, it is also possible to read out the control data in the control memory cells C11 to C14, R by scan path and compress this information to store it in the programmable ROM in either micro controller or micro computer. By controlling the scan path according to this ROM data at closing of power and writing it again in the control memory cells C11 to C14, R, it becomes possible to make switching of redundancy circuits without making any retest at closing of power.

(3) While, in the fourth embodiment indicated in FIG. 7, 2 word lines RWL1, RWL1 are shown, only one word line RWL1 will be enough in the case where a column redundancy control circuit 12 the redundancy of which is 1 is used as in FIG. 1, FIG. 2 and FIG. 3, for example.

(4) While, in the fourth embodiment indicated in FIG. 7, redundancy enable signal line RED-EN is shown, this signal does not exist depending on the kind of column redundancy control circuit 12 as the circuit of FIG. 1, FIG. 2, FIG. 4, for example.

(5) While, in the fourth embodiment indicated in FIG. 7, reset signal line RED-RESET is shown, this signal does not exist depending on the kind of column redundancy control circuit 12 as in the case where control memory cells without resetting function are used in the circuit of FIG. 1, FIG. 3 or FIG. 4, for example.

(6) If, in the eighth embodiment indicated in FIG. 11, the switching of redundancy circuits is made by detecting wire breaking failure of internal bit lines BL1 to BL4, there is no need of testing all the memory cells M11 to M15, M21 to M25, M31 to M35, . . . relating to the internal bit lines BL1 to BL4. For example, testing of M31 only will be enough for the first internal bit line BL1 in FIG. 1 and, generally, testing of the memory cells M31 to M35 farthest from the respective selectors SEL1 to SEL4 will be enough.

(7) Because resetting can be made with shift-in of "0" by serial shift action in the tenth embodiment indicated in FIG. 14 and the eleventh embodiment indicated in FIG. 15, it will be all right to delete the logic product circuit 41 in which this signal and the reset signal OFF-RESET are input. When deleting the logic product circuit 41 this way, flip-flops 46, 61 with either asynchronous resetting function or synchronous resetting function may be used.

Moreover, in the case where the first flip-flop 61 for data output from the readout data output terminal XDO<i> is not required in the eleventh embodiment, the 2 selectors 51a, 51b in the front stage can be deleted.

(8) As improvement of the thirty-fourth embodiment to the thirty-sixth embodiment, it will be all right to provide all the functions of FIG. 42 (a), (b), (c) as shown in FIG. 42 (d) and also add a selector 109 for selecting those functions.

(9) While the fortieth embodiment was explained as a construction using the comparing means 106 of the thirty-fourth embodiment (FIG. 42 (a)) or thirty-fifth embodiment (FIG. 42 (b)) as the device 110 in FIG. 48, a construction using the comparing means 106 of FIG. 42 (d) may also be all right.

(10) While, in the forty-second embodiment indicated in FIG. 50 (a), explanation was given on an example using a 2-bit input 4-bit output in correspondence to the memory circuit having 4 external word lines OWL1 to OWL4, but that is not limitative but it will also be all right to use a 4-input 16-output type decoder in correspondence to the memory circuit having 16 external word lines OWL1 to OWL16, for example. For example, "0001001101011110000" is used as full-cycle series.

While the addresses generated with shift-in of this full-cycle series in a 4-bit shift register change in the order of "0000"~"1000"~"1100"~"1110"~"1111"~"0111"~"1011"~"0101"~"1010"~"1101"~"0110"~"0011"~"1001"~"0100"~"0010"~"0001", the output terminals of the decoder 116 are arranged in the order of X0, X8, X12, X14, X15, X7, X11, X5, X10, X13, X6, X3, X9, X4, X2, X1 from the left in correspondence to the order of addresses, and this makes it possible to perform increment and decrement actions easily.

While the invention has been shown and described in detail, the foregoing description is in all aspects illustrative and not restrictive. It is therefore understood that numerous modifications and variations can be devised without departing from the scope of the invention.

I claim:

1. A memory circuit comprising:
   a memory cell array composed of a plural number of memory cells arranged in a matrix form and comprising a plural number of internal connecting lines;
   a plural number of external connecting lines, connected to the plural number of internal connecting lines at least in one of a row direction and a column direction of said memory cell array for exchanging data externally to said memory cell array; and
   a redundancy control circuit, inserted between said internal connecting lines of said memory cell array and said external connecting lines, for controlling respective connections between said external connecting lines and said internal connecting lines in a way to compensate for at least one of any failure in said memory cell array,
   wherein the plural number of external connecting lines is set smaller than the plural number of internal connecting lines, and
   wherein said redundancy control circuit includes,
   a group of control memory cells corresponding in number to said plural number of external connecting lines, respective of said group of control memory cells configured to selectably hold at any given time either a first binary value or a second binary value,
   a group of selectors corresponding in number to said plural number of external connecting lines, each of said group of selectors connected to a corresponding control memory cell of said group of control memory cells and configured to connect one of said external connecting lines to one internal line of a corresponding respective pair of said internal connecting lines when said corresponding control memory cell holds said first binary value, and configured to connect said one of said external connecting lines to the other internal line of said corresponding pair of internal connecting lines when said corresponding control memory cell holds said second binary value.

2. A memory circuit as defined in claim 1, wherein said respective of said control memory cells comprises a data input terminal connected to at least one of a corresponding one of said external connecting lines and a corresponding one of said internal connecting lines.

3. A memory circuit as defined in claim 1, wherein:
   a data input terminal of said respective of said control memory cells of said group of control memory cells is connected respectively to said internal connecting lines put in correspondence to said external connecting lines to which respective selectors of said group of selectors to be controlled are connected, and
   said memory circuit further comprises switch devices for selecting permission by said group of control memory cells, said switch devices being inserted respectively between said respective control memory cells of said group of control memory cells and said respective selectors of said group of selectors.

4. A memory circuit as defined in claim 1, wherein:
said control memory cells of said group of control memory cells are configured to provide at least one of a setting function accessed via a set terminal and a resetting function accessed via a reset terminal, and
at least one of said set terminal and said reset terminal of said control memory cells configured to connect to a superfluous terminal of a decoder that controls other of the internal connecting lines in the row direction and the column direction of said memory cell array.

5. A memory circuit of claim 2, further comprising a data control circuit for each of said external connecting lines and the data control circuit comprising expected value comparing means for judging by comparison whether or not a readout data in at least one output port of the memory cell array disagrees with a prescribed expected value and, based on the comparison, for generating a value for control to be given to said data input terminals of said control memory cells of said group of control memory cells.

6. The memory circuit of claim 5 wherein said data control circuit further comprises first selecting means for selecting at least two different kinds of information, where said at least two different kinds of information includes said value for control generated by said expected value comparing means and write data from external to said memory circuit to be written in said memory cells of said memory cell array.

7. The memory circuit of claim 6, wherein said data control circuit further comprises, a register for storing one kind of said at least two different kinds of information selected by said first selecting means.

8. The memory circuit of claim 7, wherein said first selecting means is for selecting at least three different kinds of information comprising said value for control generated by said expected value comparing means, the write data from the external to said memory cells of said memory cell array and output information from other data control circuits adjacent to the data control circuit concerned.

9. The memory circuit of claim 2, further comprising a data control circuit provided for each of said external connecting lines of the memory circuit and the data control circuit comprising:
expected value comparing means for judging by comparison whether or not a readout data in at least one output port of the memory cell array disagrees with a prescribed expected value, and based the of comparison, for generating a value for control to be given to the data input terminals of said control memory cells of said group of control memory cells;
first selecting means for selecting at least two different kinds of information where said at least two different kinds of information includes said value for control generated by said expected value comparing means and said readout data from said memory cells of said memory cell array;
a register for storing the at least two different kinds of information selected by said first selecting means; and
second selecting means for selecting at least two different kinds of information including output information from said register and write data from external to said memory circuit to be written in said memory cells of said memory cell array.

10. The memory circuit of claim 9, wherein said first selecting means is for selecting at least three different kinds of information including said value for control generated by said expected value comparing means, the readout data from said memory cells of said memory cell array and output information from other data control circuits adjacent to the data control circuit concerned.

11. The memory circuit of claim 2, further comprising a data control circuit provided for each of said external connecting lines of the memory circuit and the data control circuit comprising:
expected value comparing means for judging by comparison whether or not a readout data in at least one output port of the memory cell array disagrees with a prescribed expected value and, based on the comparison, for generating a value for control to be given to said data input terminals of said control memory cells of said group of control memory cells;
first selecting means for selecting at least two different kinds of information including said value for control generated by said expected value comparing means and said readout data from said memory cells of said memory cell array;
a first register for storing the at least two different kinds of information selected by said first selecting means;
second selecting means for selecting at least two different kinds of information including output information from said first register and write data from external to said memory circuit to be written in said memory cells of said memory cell array; and
a second register for storing the at least two different kinds of information selected by said second selecting means.

12. The memory circuit of claim 11, wherein said second selecting means is constructed in a way to select at least three different kinds of information including the write data from the external to said memory circuit to be written in said memory cells of said memory cell array, the output information from said first register and test data.

13. The memory circuit of claim 11, wherein said second selecting means is constructed in a way to select at least three different kinds of information including the output information from said first register in the data control circuit concerned, output information from other data control circuits adjacent to the data control circuit concerned and the write data from the external to said memory circuit to be written in said memory cells of said memory cell array.

14. A memory circuit of claim 2 further comprising a data control circuit provided for each of said external connecting lines and the data control circuit comprising expected value comparing means for judging by comparison, when said memory circuit is constructed in a way to output a plural number of readout data, whether or not all the readout data from said memory cells of said memory cell array disagrees with a prescribed expected value and, based on the comparison, for generating a value for control to be given to the data input terminals of said control memory cells of said group of control memory cells.

15. A memory circuit of claim 2 further comprising a data control circuit connected to said external connecting lines in the row direction and the column direction and the data control circuit comprising:
a first control unit connected to the external connecting lines in one of the row direction and the column direction of the memory cell array; and
a second control unit connected to the external connecting lines in either one of the row direction and the column direction that is not occupied by said first control unit,
wherein said first control unit includes, expected value comparing means for judging by comparison whether or not a readout data in at least one output port of the memory cell array disagrees with prescribed expected value and, based on the the comparison, for generating a value for control to be given to said data input terminals of said control memory cells of said group of control memory cells; and a first register for storing an output information from said expected value comparing means and outputting the output information to said external connecting lines on one side, and said second control unit comprises a second register for storing the output information from said expected value comparing means of said first control unit and outputting the output information from the second register to said external connecting lines on the other side.

16. The memory circuit of claim 1, further comprising an address assigning circuit, connected to said plural number of external connecting lines, for sequentially assigning said external connecting lines from one end to the other end of said memory circuit, and the address assigning circuit comprising:

a full-cycle serial data output circuit for outputting, based on a preset operation formula, full-cycle serial data as pseudo-random numbers having a certain cycle; and a decoder for sequentially assigning said external connecting lines based on output information from said full-cycle serial data output circuit, wherein said decoder comprises, output terminals of prescribed output bit numbers sequentially arranged in order from the one end to the other end of said memory circuit according to an order of the full-cycle serial data output from said full-cycle serial data output circuit;

input terminal;

a logical circuit unit for converting an input bit number of said input terminal into an output bit number of said output terminals; and bit order changing means connected between said logical circuit unit and said output terminals for rearranging a signal of said output bit number from said logical circuit unit in the order of said output terminals.

17. The memory circuit of claim 7, wherein said data control circuit further comprises second selecting means for selecting at least 2 different kinds of information including output information from said register in the data control circuit concerned and test data from outside.

18. A memory circuit comprising:

a memory cell array composed of a plural number of memory cells arranged in the form of a matrix;

a plural number of external connecting lines, connected to a plural number of internal connecting lines at least in one of the direction of row and the direction of column of said memory cell array, for exchanging data for said memory cell array from outside; and a redundancy control circuit, inserted between said memory cell array and said external connecting lines, for controlling in a way to compensate two failure data in case of occurrence of any failure in said memory cell array, wherein the number of wires of said external connecting lines is set smaller by two than the number of wires of said internal connecting lines, and wherein said redundancy control circuit includes:

a group of selectors composed of a plural number of selectors for selectively switching respectively 3 continuously adjacent said internal connecting lines provided in correspondence to said respective external connecting lines; and a group of control memory cells composed of a plural number of control memory cells for selectively storing one value of ternary of data for each of said internal connecting lines in a way to perform switching control of said respective selectors of said group of selectors.

19. A memory circuit as defined in claim 18, wherein data input terminals of said control memory cells of said group of control memory cells are connected to either said external connecting lines or said internal connecting lines to which the external and internal connecting lines are put in correspondence respectively.

20. A memory circuit as defined in claim 18, wherein said control memory cells of said group of control memory cells are provided with setting function having set terminal or resetting function having reset terminal; and said set terminal or said reset terminal of said control memory cells is connected to superfluous terminal of decoder controlling other internal connecting lines in the direction of row and the direction of column of said memory cell array.

21. A memory circuit as defined in claim 18, wherein said control memory cells of said group of control memory cells are provided with setting function having set terminal or resetting function having reset terminal; and wherein said set terminal or said reset terminal of said control memory cells is connected to control terminal of a special decoder.

22. The memory circuit of claim 18, wherein a data control circuit is provided for each of said external connecting lines and the data control circuit comprising:

expected value comparing means for judging by comparison whether or not a readout data in at least one output port of the memory cell array disagrees with prescribed expected value and, based on the comparison, for generating a value for control to be given to said data input terminals of said control memory cells of said group of control memory cells; and control data generating means for outputting a first value of said ternary data to said control memory cells of said group of control memory cells when said expected value comparing means obtained a result that the readout data from said memory cells of said memory cell array is identical to said prescribed expected value, outputting a second value of said ternary data to said control memory cells of said group of control memory cells when said expected value comparing means obtained for the first time a result that the readout data from said memory cells of said memory cell array disagrees with said prescribed expected value, and outputting a third value of said ternary data to said control memory cells of said group of control memory cells when said expected value comparing means obtained for the second time a result that the readout data from said memory cells of said memory cell array disagrees with said prescribed expected value.

23. The memory circuit of claim 22, wherein said control data generating means includes:

a first register to store output information from said expected value comparing means;

disagreeing value output means for outputting a value indicating disagreement when both the output information stored in said first register and an output information from said expected value comparing means indicate a value showing that the readout data from said memory cells of said memory cell array disagrees with said prescribed expected value; and a second register to store output information from said disagreeing value output means.

24. The memory circuit of claim 22, which further comprises selecting means for selecting at least 2 different kinds of information including test data given from outside or generated internally and output information from said control data generating means.

25. The memory circuit of claim 1, wherein a data control circuit is provided for each of said external connecting lines, and the data control circuit comprises expected value comparing means for judging by comparison, in the case where said memory circuit is constructed in a way to output a plural number of readout data, whether or not readout data from said memory cells of said memory cell array disagrees with prescribed expected value and, based on the comparison, for generating a value for control to be given to said data input terminals of said control memory cells of said group of control memory cells.

26. The memory circuit of claim 1, wherein a data control circuit is provided therein and connected to said external connecting lines in the direction of row and the direction of column of said memory cells of said memory cell array, and the data control circuit comprising:

a first control unit connected to the external connecting lines in one of the direction of row and the direction of column of the memory cell array; and a second control unit connected to the external connecting lines in the other of the direction of row and the direction of column of the memory cell array, wherein said first control unit includes:

expected value comparing means for judging by comparison whether or not a readout data in at least one output port of the memory cell array disagrees with prescribed expected value and, based on the comparison, for generating a value for control to be given to said data input terminals of said control memory cells of said group of control memory cells; and a first register for storing an output information from said expected value comparing means and outputting the ouput information to said external connecting lines on one side; and said second control unit comprises a second register for storing the output information from said expected value comparing means of said first control unit and outputting the ouput information to said external connecting lines on the other side.

27. The memory circuit of claim 18, further comprising an address assigning circuit, connected to said plural number of external connecting lines, for sequentially assigning said external connecting lines from one end to the other end of said memory circuit, and the address assigning circuit comprising:

a full-cycle serial data output circuit for outputting, based on preset operation formula, full-cycle serial data as pseudo-random numbers having a certain cycle; and a decoder for sequentially assigning said external connecting lines based on output information from said full-cycle serial data output circuit, wherein said decoder comprises:

output terminals of prescribed output bit numbers sequentially arranged in order from the one end to the other end of the memory circuit according to an order of the full-cycle serial data output from said full-cycle serial data output circuit;

input terminal;

a logical circuit unit for converting an input bit number of said input terminal into an output bit number of said output terminals; and bit order changing means connected between said logical circuit unit and said output terminals for rearranging a signal of said output bit number from said logical circuit unit in the order of said output terminals.

* * * * *